US008451073B2

(12) United States Patent
Hoeft et al.

(10) Patent No.: US 8,451,073 B2
(45) Date of Patent: May 28, 2013

(54) LAMINATED RF DEVICE WITH VERTICAL RESONATORS HAVING STACK ARRANGEMENT OF LAMINATED LAYERS INCLUDING DIELECTRIC LAYERS

(75) Inventors: Michael Hoeft, Asendorf (DE); Toshio Ishizaki, Hyogo (JP); Hideaki Nakakubo, Kyoto (JP)

(73) Assignee: Panasonic Corporation, Osaka (JP)

( * ) Notice: Subject to any disclaimer, the term of this patent is extended or adjusted under 35 U.S.C. 154(b) by 327 days.

(21) Appl. No.: 12/746,601

(22) PCT Filed: Dec. 4, 2008

(86) PCT No.: PCT/JP2008/072464

§ 371 (c)(1),
(2), (4) Date: Jun. 7, 2010

(87) PCT Pub. No.: WO2009/072666

PCT Pub. Date: Jun. 11, 2009

(65) Prior Publication Data

US 2010/0265015 A1 Oct. 21, 2010

(30) Foreign Application Priority Data

Dec. 7, 2007 (EP) .................................... 07122662

(51) Int. Cl.
*H01P 7/00* (2006.01)
*H03H 7/00* (2006.01)
*H01P 3/00* (2006.01)

(52) U.S. Cl.
USPC .......................................... 333/219; 333/185

(58) Field of Classification Search
USPC .................. 333/219, 222, 202, 204, 206, 185
See application file for complete search history.

(56) References Cited

U.S. PATENT DOCUMENTS 5,451,917 A * 9/1995 Yamamoto et al. ........... 333/246
5,719,539 A 2/1998 Ishizaki et al.

(Continued)

FOREIGN PATENT DOCUMENTS

JP 10-28006 1/1998
JP 2002-64307 2/2002

(Continued)

OTHER PUBLICATIONS

International Preliminary Report on Patentability and Written Opinion of the International Searching Authority, issued Jun. 8, 2010 in PCT/JP2008/072464 (in Enlgish).

(Continued)

*Primary Examiner* — Dean O Takaoka
*Assistant Examiner* — Alan Wong
(74) *Attorney, Agent, or Firm* — Wenderoth, Lind & Ponack, L.L.P.

(57) ABSTRACT

The present invention relates to a resonator device having a stacked arrangement of laminated layers including a plurality of dielectric layers, and at least one resonator comprising a short-circuit electrode, a first capacitor electrode and a second capacitor electrode. Each electrode comprises at least a portion of a layer of electrically conductive material provided on a surface of one of the dielectric layers. The second capacitor electrode is disposed spaced, in the stacking direction, from the short-circuit electrode and the first capacitor electrode. The short-circuit electrode and the second capacitor electrode are electrically interconnected by a first electrical connection comprising at least one via hole penetrating one or more of the dielectric layers.

32 Claims, 33 Drawing Sheets

U.S. PATENT DOCUMENTS

| | | | | |
|---|---|---|---|---|
| 5,886,597 | A * | 3/1999 | Riad | 333/245 |
| 5,945,892 | A | 8/1999 | Kato et al. | |
| 6,020,798 | A | 2/2000 | Nakakubo et al. | |
| 6,346,866 | B2 | 2/2002 | Nakakubo et al. | |
| 6,741,149 | B2 | 5/2004 | Kuroda et al. | |
| 6,765,458 | B2 * | 7/2004 | Yamaguchi | 333/175 |
| 6,965,284 | B2 | 11/2005 | Maekawa et al. | |
| 7,449,982 | B2 * | 11/2008 | McKinzie, III | 333/219 |
| 2002/0196106 | A1 | 12/2002 | Kuroda et al. | |

FOREIGN PATENT DOCUMENTS

| | | |
|---|---|---|
| JP | 2003-8304 | 1/2003 |
| JP | 2004-40472 | 2/2004 |
| JP | 2006-101556 | 4/2006 |
| JP | 2007-28141 | 2/2007 |

OTHER PUBLICATIONS

International Search Report issued Mar. 17, 2009 in International (PCT) Application No. PCT/JP2008/072464.

Written Opinion of the International Searching Authority issued Mar. 17, 2009 in International (PCT) Application No. PCT/JP2008/072464.

* cited by examiner

LAMINATED RF DEVICE WITH VERTICAL RESONATORS HAVING STACK ARRANGEMENT OF LAMINATED LAYERS INCLUDING DIELECTRIC LAYERS

TECHNICAL FIELD

The present invention relates to a resonator device having a stacked arrangement of laminated layers, including a plurality of dielectric layers, and at least one resonator comprising a short-circuit electrode, a first capacitor electrode and a second capacitor electrode, each electrode comprising at least a portion of a layer of electrically conductive material provided on a surface of one of the dielectric layers. Further, the present invention relates to an RF device, such as a microwave filter or duplexer, comprising such a resonator device and to a method of manufacturing such a resonator device.

BACKGROUND ART

The microwave region of the electromagnetic spectrum finds widespread use in various fields of technology. Exemplary applications include wireless communication systems, such as mobile communication and satellite communication systems, as well as navigation and radar technology. The growing number of microwave applications increases the possibility of interference occurring within a system or between different systems. Therefore, the microwave region is divided into a plurality of distinct frequency bands. To ensure, that a particular device only communicates within the frequency band assigned to this device, microwave filters are utilized to perform band-pass and band reject functions during transmission and/or reception. Accordingly, the filters are used to separate the different frequency bands and to discriminate between wanted and unwanted signal frequencies so that the quality of the received and of the transmitted signals is largely governed by the characteristics of the filters. Commonly, the filters have to provide for a small bandwidth and a high filter quality.

For example, in communications networks based on cellular technology, such as the widely used GSM system, the coverage area is divided into a plurality of distinct cells. Each cell is assigned to a base station which comprises a transceiver that has to communicate simultaneously with a plurality of mobile devices located within its cell. This communication has to be handled with minimal interference. For example, base stations and mobile devices communicating based on GSM in the 900 MHz band must be protected from interference signals caused by communications based on GSM in the 1800 MHz band or UMTS. Moreover, the base stations and mobile devices should not transmit outside their designated frequency band. Therefore, the frequency range utilized for the communications signals associated with the cells is separated from adjacent frequencies by the use of microwave filters in the base station as well as in the mobile devices. Further, because GSM base stations transmit and receive simultaneously, the same microwave filters are also used to divide the frequency range into a first frequency band, that is used by the base station to transmit signals to the mobile devices (downlink), and a second frequency band, that is used by the mobile devices to transmit signals to the base station (uplink), in order to isolate the transmitter from the receiver. The filters must have a high attenuation outside their pass-band and a low pass-band insertion loss in order to satisfy efficiency requirements and to preserve system sensitivity. Thus, such communication systems require an extremely high frequency selectivity in both the base stations and the mobile devices which often approaches the theoretical limit.

Due to the ever decreasing size of the system components of such communication systems, it is further required that the filters are constructed as small and compact as possible. One particular type of resonator device suitable for achieving a particularly compact construction is resonator devices of the laminated type. These resonator devices comprise a plurality of dielectric layers in a stacked arrangement and electrically conductive layers provided on the outer surfaces of the stacked arrangement and/or sandwiched between the dielectric layers. These dielectric and electrically conductive layers are provided as a laminate. In known resonator devices of this type, an electrically conductive layer is disposed, in the stacking direction of the stacked arrangement, between two grounded electrically conductive layers. This structure, comprising two outer electrically conductive layers and an intermediate electrically conductive layer extending between the outer electrically conductive layers and separated from them by one or more layers of dielectric material, constitutes a strip-line transmission line. In such strip-line transmission lines electromagnetic waves travel in the direction of extension of the electrically conductive layers and, thus, in the direction of extension of the dielectric layers of the laminate that can be regarded as the “horizontal direction” of the resonator device. Strip-line transmission lines can be regarded as (pseudo) coaxial transmission lines with the outer electrically conductive layers functioning as and constituting the outer conductor and the intermediate electrically conductive layer functioning as and constituting the inner conductor, i.e. strip-line transmission lines show (pseudo) coaxial characteristics. This means that such a strip-line transmission line has the same characteristic impedance as a coaxial transmission line having a particular inner diameter and a particular outer diameter, so that the strip-line transmission line, like any (pseudo) coaxial transmission line, can be regarded as being equivalent to a coaxial transmission line having an effective inner diameter and an effective outer diameter.

Generally, a (pseudo) coaxial transmission is any multi-conductor transmission line that comprises one or more electrically connected first conductors and one or more electrically connected second conductors that essentially coextend, separated by a dielectric material, along the transmission line, wherein the first electrical conductor(s) function as the inner conductor and the second electrical conductor(s) function as the outer conductor. In the same manner as the above strip-line transmission lines, such transmission lines have (pseudo) coaxial characteristics and have the same characteristic impedance as a coaxial transmission line having a particular inner diameter and a particular outer diameter, so that they can be regarded as being equivalent to a coaxial transmission line having an effective inner diameter and an effective outer diameter. It should be noted that a two-wire transmission line already constitutes a (pseudo) coaxial transmission line with the grounded wire functioning as the outer conductor and the signal carrying wire functioning as the inner conductor. Thus, in the present application a (pseudo) coaxial transmission line is a multi-conductor transmission line constructed in the above-described manner. Preferably, these multi-conductor transmission lines are constructed such that one second electrical conductor at least partly or completely surrounds the first electrical conductor(s) or that there are two or more second electrical conductors that are spaced around the first electrical conductor(s). Usually, as in a regular coaxial transmission line, the first electrical conductor(s) would be electrically isolated from the second electrical conductor(s).

However, as will be described later-on, the (pseudo) coaxial transmission lines of the present application are short-circuited at one end.

Independent of the particular implementation of a resonator device, one common resonator type is the quarter-wave-resonator in which a piece of an arbitrary type of transmission line having a length of one quarter wavelength is short circuited at one end and driven open at the other end to achieve the desired resonance. In reality, such resonators are always shorter than one quarter wavelength, because the open circuit cannot be ideally realized due to fringe fields that are always present at the open end which therefore acts as a capacitor. By increasing the capacitance at the open end, an additional length reduction of the transmission line can be achieved. To further shorten the transmission line, quarter wave resonators have been constructed having a transmission line with two distinct sections that have different characteristic impedances $Z_1$ and $Z_2$ with the low impedance section being provided at the short-circuited end and the high impedance section being provided at the open circuited end. These resonators are commonly referred to as stepped-impedance-resonators (SIR). In a simplified equivalent LC resonator model, the short-circuited high impedance section 1 can be regarded as an inductor with inductance $$L = \frac{Z_1 \cdot \tan(\beta_1 \cdot l_1)}{\omega},$$

where $\beta_1$ is the phase term of the propagation constant ($\beta_1 = 2\pi/\lambda_1$, with $\lambda_1$ the wavelength for the given transmission line) and $l_1$ the length of the section and $\omega$ the angular frequency, and the open circuited low impedance section 2 can be regarded as a capacitor with capacitance $$C = \frac{Y_2 \cdot \tan(\beta_2 \cdot l_2)}{\omega},$$

where $Y_2 = 1/Z_2$ is the characteristic admittance, $\beta_2$ the phase term of the propagation constant and $l_2$ the length of the section. Thus, to achieve sufficiently large values of L, the impedance $Z_1$ of that section has to be chosen to be large, and to achieve sufficiently large values of C, the admittance $Y_2$ has to be chosen to be large.

For the above-mentioned resonator devices of the laminated type, which are produced by using e.g. the well established low temperature co-fired ceramics (LTCC) process, the strip-lines are realized by e.g. printing thin conductor layers on dielectric layer substrates followed by laminating and sintering the layers. Currently, for the common LTCC processes the thickness of the conductor layers is limited to 10 to 20 μm. Thus, in order to control the characteristic impedance of the strip-line, generally the width of the intermediate conductor layer has to be varied. Presently, for common LTCC processes the minimum width of the intermediate conductor layer is limited to around 80 to 100 μm. To realize the high impedance section, the width of the conductor should be small (i.e. minimum, e.g. 100 μm), and to realize the low impedance section, the width must be set to a larger value (e.g. 600 μm). Such resonator devices are e.g. disclosed in U.S. Pat. No. 5,719,539.

The exact values of the impedances of the strip-line section can be determined by numerical computation as well as by accurate equations or approximations. The influence of the dimensions of the strip-line arrangement can also be assessed by regarding it as a coaxial transmission line with effective inner diameter $D_i$ and effective outer diameter $D_o$. The effective diameters are related to the exact geometry of the structure. For example a larger width of strip-line leads to larger $D_i$, and a smaller height of the overall laminated resonator device and, thus, a smaller distance between the two outer conductive layers leads to a smaller $D_o$. The characteristic impedance of a coaxial transmission line is given by $$Z = \frac{Z_i \cdot \ln(D_0 / D_i)}{2\pi},$$

where $Z_i$ is the intrinsic impedance of the dielectric material given by $Z_i = \sqrt{\mu/\epsilon}$. As can be taken from this approximation, the characteristic impedance is only a function of the ratio of outer to inner diameters. Depending on the application, the height of current LTCC filters is around 850 μm, but also low profile filters with a height of 400 μm are of interest for more compact designs leading to even lower characteristic impedance values. Furthermore, since the volume of the resonator device is decreased, the stored energy is limited.

To realize a band pass filter with low insertion loss, the quality factor of the corresponding resonators should be as large as possible. The quality factor is determined by the ratio of stored energy to losses in the resonator, and there are mainly dielectric losses and conductor losses of the conductor which contribute to the quality factor Q in accordance with the equation:

$$\frac{1}{Q} = \frac{1}{Q_d} + \frac{1}{Q_c}.$$

Usually, for a suitably chosen dielectric material dielectric losses are lower than conductor losses, i.e. $Q_c$ is limiting the overall quality factor. If the volume of the resonator is increased, the dielectric quality factor $Q_d$ stays the same, but the conductive quality factor $Q_c$ may increase due to an increase of the ratio of volume vs. surface of the structure. Therefore, a large volume of the resonator is desirable for increasing the overall quality factor.

The conductive quality factor is further influenced by the current distribution within the electrically conductive layers of the strip-line arrangement. Due to the large aspect-ratio (width to height ratio) of the inner strip-line conductor, the current is generally concentrated at the edges of the conductor. However, in order to improve the quality factor the current should be distributed more homogeneously over the surface of the conductor. In U.S. Pat. No. 6,965,284 it is suggested to dispose a dielectric material with higher dielectric constant than the surrounding dielectric material centrally above and below the inner strip-line conductor in order to equalize the current distribution. Another approach is suggested in U.S. Pat. No. 6,020,798 and U.S. Pat. No. 6,346,866 in which the thickness of the inner strip-line conductor is increased by burying the inner strip-line conductor in a dielectric layer.

However, in the prior art devices of the laminated type including strip-line transmission lines extending in the direction of extension of the dielectric layers or horizontal direction, the quality factor achievable is still limited, and known measures for improving the quality factor add complexity and costs to the manufacturing processes.

U.S. Pat. No. 5,945,892 discloses an LC resonating device of laminated type in which a first capacitor electrode layer, a second capacitor electrode layer and a ground electrode layer are disposed, in this order, within a laminate including a plurality of dielectric layers. The electrically conductive layers are separated from each other by at least one of the dielectric layers. The first capacitor electrode is electrically connected to an external ground electrode provided as a layer on a lateral side surface of the laminate. Two electrically conductive via holes extend in the stacking direction of the laminate—which may be regarded as the "vertical direction" of the resonating device—between and electrically interconnect the ground electrode layer and the first capacitor electrode layer. Further, an electrically conductive via hole extends in the stacking direction of the laminate between and electrically interconnects the ground electrode and the second capacitor electrode. The via holes are arranged such that the latter via hole extending between the ground electrode and the second capacitor electrode constitutes an inductor conductive body, i.e. it is a lumped element inductor at which the inductance of the resonator is concentrated. However, this reference does not disclose a resonator device including a resonator comprising a transmission line, in particular a (pseudo) coaxial transmission line.

SUMMARY OF THE INVENTION

It is an object of the present invention to provide a compact resonator device of the laminated type and including a resonator in the form of a transmission line, in particular a (pseudo) coaxial transmission line, which resonator device has a high quality factor and which can be constructed in a cost-efficient way. Further, it is an object of the present invention to provide a compact RF device, such as a band pass filter, comprising such a resonator device, which RF device exhibits the above characteristics.

This object is achieved by the following resonator device, by the following RF device, and by the following manufacturing process. Preferred embodiments of the invention are set out in the respective dependent claims.

Thus, the resonator device comprises a stacked arrangement of laminated layers including a plurality of dielectric layers, e.g. in the form of dielectric sheets. This stacked arrangement defines a stacking direction, i.e. the direction perpendicular to the dielectric layers, wherein it is noted that both directions perpendicular to the dielectric layers will equally be referred to as the stacking direction. In the present application, the direction of extension of the dielectric layers is also referred to as the "horizontal direction" and the stacking direction is also referred to as the "vertical direction". The resonator device further comprises at least one resonator that includes a short-circuit electrode, a first capacitor electrode and a second capacitor electrode. Each of these electrodes comprises or is preferably constituted by at least a portion of a layer of electrically conductive material provided on a surface of one of the dielectric layers. Thus, all of these electrically conductive layers extend in planes parallel to each other and to the direction of extension of the dielectric layers, i.e. to the planes defined by dielectric layers. Each of these electrodes formed by the electrically conductive layers (which means, in this application, by the entire respective layer or a portion thereof) covers at least a portion of the surface of the respective dielectric layer on which surface the respective electrically conductive layer is provided. In preferred embodiments, the electrodes and/or the electrically conductive layers have a circular, oval, square, rectangular, hexagonal or polygonal shape. The stacked arrangement of laminated layers can be regarded as including the dielectric layers as well as electrically conductive layers forming the above-mentioned electrodes and other components to be described hereinbelow. However, it is also possible to regard to overall structure as comprising a laminate of dielectric layers forming a main body into which layers of conductive material are integrated.

For each such resonator the layer forming the second capacitor electrode (which is also referred to herein as second capacitor electrode layer) is disposed spaced from the layer forming the short-circuit electrode (which is also referred to herein as short-circuit electrode layer) and the layer forming the first capacitor electrode (which is also referred to herein as first capacitor electrode layer), such that, in the stacking or vertical direction, the layer forming the second capacitor electrode is separated from the layer forming the short-circuit electrode by at least one of the dielectric layers and the layer forming the second capacitor electrode is separated from the layer forming the first capacitor electrode by at least one of the dielectric layers. With other words, in the stacking direction at least one of the dielectric layers is interposed between the second capacitor electrode and the short-circuit electrode, and at least one of the dielectric layers is interposed between the first capacitor electrode and the second capacitor electrode.

Further, for each such resonator the short-circuit electrode and the second capacitor electrode are electrically interconnected by a first electrical connection extending at least partly and preferably entirely inside the stacked arrangement and forming an electrical path from the short-circuit electrode to the second capacitor electrode. The first electrical connection comprises at least one via hole in the form of a continuous through hole, that completely penetrates one or more of the dielectric layers and that is at least partially filled with conductive material so as to provide an electrical connection between both ends of the through hole. Such via hole preferably extends along a straight center line and may take a cylindrical configuration with e.g. a circular, oval, square, rectangular or polygonal cross sectional shape. Further, while such via hole may extend in any direction transverse to the direction of extension of the dielectric layers (i.e. at least partly in the stacking direction, such as e.g. oblique with respect to the stacking direction), it is preferred that it extends perpendicularly or essentially perpendicularly to the direction of extension of the dielectric layers (i.e. in the stacking direction). One or more of these via holes extend(s) from and are (is) electrically directly connected to the short-circuit electrode or the second capacitor electrode. Preferably, one or more of these via holes extend(s) from and are (is) electrically directly connected to the short-circuit electrode, and one or more of the via holes extend(s) from and are (is) electrically directly connected to the second capacitor electrode. In this regard, the via hole(s) of the first electrical connection may or may not include one or more via holes connected to and extending from both the short-circuit electrode and the second capacitor electrode. Thus, as will be described later-on, in the latter preferred form a via hole extending from and electrically connected to the short-circuit electrode and a via hole extending from and electrically connected to the second capacitor electrode may be the same via hole or different via holes offset from each other in the direction of extension of the dielectric layers.

In addition, for each such resonator the short-circuit electrode and the first capacitor electrode are electrically interconnected by a second electrical connection distinct from the first electrical connection. Thus, for each individual resonator the first and the second electrical connection do not have or at least essentially do not have a common portion.

The short-circuit electrode, the first and second capacitor electrodes and the first and second electrical connections are arranged such that the first electrical connection and the second electrical connection form together and in combination with the dielectric material in between a transmission line that has an overall transmission line path length of from λ/200—preferably λ/100, more preferably λ/50-to λ/5—preferably λ/8, more preferably λ/10—and that extends between the short-circuit electrode and the second capacitor electrode, and thus through the dielectric layers at least partly in the stacking or vertical direction.

The transmission line can be regarded as a (pseudo) coaxial transmission line. In preferred embodiments that constitute the simplest configurations the first electrical connection functions as the inner conductor and the second electrical connection functions as the outer conductor of this (pseudo) coaxial transmission line. However, as will be described later-on, there are also preferred embodiments in which the transmission line comprises along its path distinct sections, wherein in one section the first electrical connection functions as the inner conductor and the second electrical connection functions as the outer conductor, whereas in another section the first electrical connection functions as the outer conductor and the second electrical connection functions as the inner conductor. Preferably, the electrical connection functioning as the outer conductor in the transmission line or a section thereof is arranged such that it at least partly surrounds the other electrical connection. As already explained above in connection with the general description of a (pseudo) coaxial transmission line, this can be realized by the electrical connection functioning as the outer conductor comprising at least one electrically conducting component that at least partly, and preferably completely, surrounds the electrical connection functioning as the inner conductor, or by the electrical connection functioning as the outer conductor comprising two or more electrically conducting components that are spaced around the electrical connection functioning as the inner conductor. An example for the first case is a plating of electrically conductive material on the lateral surface(s) of the main body, and an example for the second case are two electrically conductive layers plated on two opposing lateral surfaces of the main body (similar to the strip-line arrangement) or two or more via holes spaced around the components of the electrical connection functioning as the inner conductor or a combination thereof.

In any case, this transmission line is short-circuited at one end by the short-circuit electrode and open-circuited at the opposite end. At this end the first and second capacitor electrodes form a capacitor by which the transmission line is capacitively loaded in order to achieve a length reduction of the transmission line in the manner described above. With other words, the transmission line extends between the short-circuit electrode, that is an electrode or electrical connection arranged and disposed to short-circuit the first electrical connection and the second electrical connection at this end of the transmission line, and the plate capacitor formed by the first capacitor electrode and the second capacitor electrode and the dielectric material between them. In order to form a plate capacitor, the first capacitor electrode and the second capacitor electrode are disposed in facing relationship and overlapping each other. The first and the second capacitor electrodes may each be provided as a portion of a larger electrically conductive layer. In this case, the first and the second capacitor electrodes are defined by the region of overlap of these layers. By means of the relative arrangement of the short-circuit electrode, the first and second capacitor electrodes and the first and second electrical connections, the resonator comprises at least a section comprising one dielectric layer or a plurality of adjacent dielectric layers in which the first electrical connection as well as the second electrical connection extend in the stacking direction or at least partly in the stacking direction, thereby forming a section of the transmission line extending in the stacking direction or at least partly in the stacking direction.

It should be noted that the first capacitor electrode, the second capacitor electrode and/or the short-circuit electrode may comprise or preferably be constituted by two or more distinct and separate spaced apart portions of the first capacitor electrode layer, the second capacitor electrode layer and the short-circuit electrode layer, respectively, which layers are provided as continuous layers. In this case, the corresponding capacitor may also be regarded as two or more distinct spaced apart capacitors. Further, it is possible, as an alternative to or in combination with this arrangement, that the first capacitor electrode layer, the second capacitor electrode layer and/or the short-circuit electrode layer are provided as a discontinuous layer comprising two or more distinct and separate spaced apart parts that are not directly connected to each other. Each of these parts or portions thereof may form a first capacitor electrode, a second capacitor electrode and a short-circuit electrode, respectively.

As in any transmission line, the capacitance and inductivity defining the characteristic impedance are not concentrated at particular locations or portions, but are distributed along the length of the transmission line. As a consequence, the components of the transmission line, including the short-circuit electrode, the first and second capacitor electrodes and the first and second electrical connections, are arranged and dimensioned such that in operation in each section of the transmission line extending in the stacking direction or at least partly in the stacking direction, i.e. in each vertical transmission line section, the electric current decreases in the direction from the short-circuit electrode to the second capacitor electrode. Preferably, in each via hole conductor of the first electrical connection the electric current decreases in the direction from the short-circuit electrode to the second capacitor electrode.

This construction has the advantage that the effective outer diameter $D_o$ of the (pseudo) coaxial transmission line, i.e. of the corresponding coaxial transmission line, can be significantly increased as compared to prior art laminated type resonator devices having a strip-line transmission line extending in the direction of extension of the dielectric layers, while at the same time allowing for a compact design. In this manner, the ratio of effective outer diameter to effective inner diameter can be increased yielding a higher characteristic impedance and higher inductivity values of the transmission line formed in part by the via hole(s) and extending transverse to the direction of extension of the dielectric layers and in particular in the stacking or vertical direction. Further, the volume of the resonator is increased yielding higher quality factors. In addition, due to the possibility to decrease the aspect ratio of the via hole conductors as compared to the inner strip-line conductor layers of the prior art devices described above, the electric current is distributed more homogeneously, thereby reducing conductor losses and further increasing the quality factor. Maximum homogenization can be achieved in a preferred embodiment in which the via hole conductors have a cylindrical configuration with circular or oval cross sectional shape. Finally, there is a greater flexibility in arranging the resonator or parts of the resonator within the laminate.

In a preferred embodiment, at least one of the resonators of the resonator device is constructed such that the three electrodes are formed by three different spaced-apart layers (i.e. each electrode is constituted by a different such layer or is a portion of a different such layer) with the layer forming the second capacitor electrode being disposed, in the stacking direction, between the layer forming the short-circuit electrode and the layer forming the first capacitor electrode, and at least one of the dielectric layers being disposed, in the stacking direction, between adjacent ones of the three different spaced-apart layers. Further, for each such resonator the first electrical connection is disposed, in the stacking direction, between the short-circuit electrode and the second capacitor electrode and preferably extends entirely inside the stacked arrangement, wherein at least one via hole of the first electrical connection penetrates one or more of the dielectric layers between the short-circuit electrode and the second capacitor electrode. For example, the first electrical connection may be constituted by one or more via holes, each extending from the short-circuit electrode to the second capacitor electrode.

In a preferred embodiment, at least one of the resonators of the resonator device is constructed such that the three electrodes are formed by three different spaced-apart layers (i.e. each electrode is constituted by a different such layer or is a portion of a different such layer) with the layer forming the first capacitor electrode being disposed, in the stacking direction, between the layer forming the short-circuit electrode and the layer forming the second capacitor electrode, and at least one of the dielectric layers being disposed, in the stacking direction, between adjacent ones of the three different spaced-apart layers. Further, for each such resonator the first electrical connection is disposed, in the stacking direction, between the short-circuit electrode and the second capacitor electrode and preferably extends entirely inside the stacked arrangement, wherein at least one via hole of the first electrical connection penetrates one or more of the dielectric layers between the short-circuit electrode and the second capacitor electrode. For example, the first electrical connection may be constituted by one or more via holes, each extending from the short-circuit electrode to the second capacitor electrode. Preferably, the first electrical connection extends around or through the first capacitor electrode layer.

In a preferred embodiment, for one, more or all of the resonators the second electrical connection comprises a layer of conductive material on at least one lateral surface of the stacked arrangement (regarding the end surfaces of the stacked arrangement in the stacking direction as top surface and bottom surface), which layer is electrically connected, either directly or by means of further portions of the second electrical connection, to both the respective short-circuit electrode (e.g. to the layer forming the respective short-circuit electrode) and the respective first capacitor electrode (e.g. to the layer forming the respective first capacitor electrode) and extends, at least partly, along the vertical extension of a via hole or via holes of the first electrical connection, and/or at least one via hole in the form of a continuous through hole penetrating one or more of the dielectric layers and at least partially filled with conductive material so as to provide an electrical connection between both ends of the through hole, with each such via hole being electrically connected, either directly or by means of further portions of the second electrical connection, to both respective short-circuit electrode (e.g. to the layer forming the respective short-circuit electrode) and to the respective first capacitor electrode (e.g. to the layer forming the respective first capacitor electrode) and extending, at least partly, along the vertical extension of a via hole or via holes of the first electrical connection. In this manner a high flexibility of design is possible. In case of one or more layers on the lateral surfaces of the stacked arrangement, it is preferred to provide at least two such layers on opposing sides of the stacked arrangement. In case of more than one resonator, it is preferred that the respective second electrical connections comprise or consist of common layers of conductive material on one or more or all lateral surfaces of the stacked arrangement. For a resonator in which the first capacitor electrode and the short-circuit electrode are formed by different electrically conductive layers, such electrically conductive layers on the lateral surfaces of the stacked arrangement or such via holes preferably extend between the layer forming the short-circuit electrode and the layer forming the first capacitor electrode. It is noted that there are also preferred embodiments in which for one, more or all of the resonators the first electrical connection instead of or in addition to the second electrical connection comprises a layer of conductive material on at least one lateral surface of the stacked arrangement in the manner just described.

In a preferred embodiment, for one, more or all of the resonators the first electrical connection comprises at least two via holes that penetrate the same dielectric layers and extend, preferably parallel to each other, part of or the entire electrical path along the first electrical connection between the short-circuit electrode and the second capacitor electrode. This construction has the advantage that the influence of manufacturing tolerances of via hole diameter on the overall effective inner diameter is decreased, because the distance between the individual via holes contributes to the inductance. However, one disadvantage is the larger size of the effective inner diameter reducing the inductivity.

In preferred embodiments, the transmission line of at least one of the resonators comprises along its path from the short-circuit electrode to the second capacitor electrode two distinct longitudinal transmission line sections. In each such transmission line section the first electrical connection and/or the second electrical connection comprises at least one via hole that extends along the entire longitudinal extension of the respective section, i.e. along the entire extension of the respective section along the path of the transmission line. With other words, each such transmission line section extends completely through one of the dielectric layers or through a plurality of adjacent ones of the dielectric layers, and each such transmission line section comprises at least one via hole as part of the first electrical connection and/or at least one via hole as part of the second electrical connection, which via hole(s) extend(s), at least partly in the stacking direction and preferably in the stacking direction, completely through the respective dielectric layer or dielectric layers. For this reason, the two transmission line sections may also be referred to as vertical transmission line sections. Each of the resonators having such a transmission line is arranged such that the characteristic impedance is different in the two transmission line sections. The different characteristic impedance is preferably achieved by providing different materials of one or more of the dielectric layers in the two sections and/or by a different arrangement of the first electrical connection and/or the second electrical connection in the two sections.

For such embodiments, the two vertical transmission line sections may be disposed, in a direction from one end surface of the laminate to the opposing end surface of the laminate, one after the other such that the two vertical transmission line sections do not overlap when viewing the laminate from a side perpendicularly to the stacking direction. Such an arrangement may be referred to as a “straight” arrangement. Alternatively, the two vertical transmission line sections may partially or completely overlap each other when viewing the laminate from a side perpendicularly to the stacking direction, and be arranged such that when following the path of the transmission line from the short-circuit electrode to the second capacitor electrode one of the two vertical transmission line sections is traversed in a direction from a first one of the two end surfaces of the laminate to a second one of the two end surfaces of the laminate and the second of the two vertical transmission line sections is traversed in a direction from the second end surface of the laminate to the first end surface of the laminate. Such an arrangement, in which the two vertical transmission line sections may also be regarded as being partially or completely nested, may be referred to as a “folded” arrangement. As will become apparent later-on, such a folded arrangement requires that the first electrical connection and/or the second electrical connection extends in a first portion from the short-circuit electrode towards one of the two end surfaces of the laminate and then turns back and extends in another portion towards the other of the two end surfaces of the laminate.

In one such folded arrangement at least one via hole of the first electrical connection in one of the two vertical transmission line sections and at least one via hole of the first electrical connection in the other of the two vertical transmission line sections are electrically directly connected to an electrically conductive common interconnection layer, that is provided on a surface of one the dielectric layers, and extend from the same surface of the common interconnection layer. In this embodiment, the second electrical connection in the two vertical transmission line sections may be formed at least partly by a common element or common elements, such as a layer of conductive material on at least one lateral surface of the stacked arrangement in the manner described above or such as one or more common via holes.

In another such folded arrangement, in one of the two vertical transmission line sections at least a part of the first electrical connection is arranged to be the outer conductor and at least a part of the second electrical connection is arranged to be the inner conductor, whereas in the other of the two vertical transmission line sections at least a part of the first electrical connection is arranged to be the inner conductor and at least a part of the second electrical connection is arranged to be the outer conductor. For example, the second electrical connection may comprise one via hole or more via holes that are spaced around one or more inner via holes of the first electrical connection and that are surrounded by a plurality of outer via holes of the first electrical connection and/or at least two layers of conductive material disposed on two opposing lateral surfaces of the laminate and being part of the first electrical connection. In this arrangement at least a part of the outer via holes and/or layers of the first electrical connection constitutes the outer conductor in a first vertical transmission line section in which at least a part of the via holes of the second electrical connection constitutes the inner conductor, and at least a part of the via holes of the second electrical connection constitutes the outer conductor in a second vertical transmission line section in which at least a part of the inner via hole or inner via holes of the first electrical connection constitutes the inner conductor.

In any case, in the folded arrangements the short-circuit electrode and the first capacitor electrode are preferably disposed on the same surface of the same dielectric layer, i.e. in a common plane. This simplifies the manufacturing process. In order to further simplify the manufacturing process, it is preferred that the short-circuit electrode and the first capacitor electrode are formed by a common electrically conductive layer, i.e. are portions of this common electrically conductive layer. In this case the first capacitor electrode is defined by the second capacitor electrode in that the portion of the common electrically conductive layer overlapping with the second capacitor electrode is the first capacitor electrode, and the portion of the common electrically conductive layer excluding the first capacitor electrode and establishing a short-circuit between the first and second electrical connections is the short-circuit electrode.

Of course, in the above cases there may also be more than two vertical transmission line sections, all having different characteristic impedances or some having a different characteristic impedance than others.

In a preferred embodiment, for one, more or all of the resonators the first electrical connection comprises a first via hole section and a distinct second via hole section, each section consisting of a distinct arrangement of one or more via holes. With other words, the first electrical connection comprises two distinct sections, each consisting of one or more of the via holes, and these two sections do not overlap along the electrical path of the first electrical connection. The first via hole section is disposed, along the electrical path of the first electrical connection, closer to the short-circuit electrode and the second via hole section is disposed, along the electrical path of the first electrical connection, closer to the second capacitor electrode. In the section of the overall transmission line of which section the first via hole section is a part the characteristic impedance of the transmission line is different from the characteristic impedance of the section of the overall transmission line of which the second via hole section is a part, so that the two via hole sections define two distinct transmission line sections having different physical characteristics and extending at least partly in the stacking or vertical direction over one of the dielectric layers or a plurality of adjacent ones of the dielectric layers. Similar to the cases described above, these two distinct transmission line sections may also be referred to as distinct vertical transmission line sections. In this embodiment, it is further preferred that the characteristic impedance of the transmission line section of which the first via hole section is a part is lower than the characteristic impedance of the transmission line section of which the second via hole section is a part. This construction has the advantage that, as in the case of the stepped-impedance resonators described above, the transmission line length can be reduced further.

The different characteristic impedance values may be achieved by providing that at least some of the dielectric layers penetrated by the first via hole section have a different dielectric constant than the dielectric layers penetrated by the second via hole section. In this case, there may be at least one pair of two via holes that are directly connected to each other end to end, with one of the two via holes belonging to the first via hole section and the other of the two via holes belonging to the second via hole section. For each such pair, the two via holes could also be regarded as being part of a single via hole. Then, distinct portions of such a single via hole would belong to the first and second via hole section, respectively. Although a lower dielectric constant in a portion of the resonator device results in an increase of relative wavelength in this portion and, thus, in an increase of the height of the resonator device, a better spurious performance may be achieved by suitable choice of the dielectric constants.

Alternatively or additionally the different characteristic impedance values may be achieved by providing that the via holes of the first via hole section and the second via hole section each terminate at and are electrically interconnected by a common interconnection layer provided as a layer of electrically conductive material on a surface of one of the dielectric layers or as a portion of such a layer. The two via hole sections may extend from the same or different surfaces of the common interconnection layer. Accordingly, an additional electrically conductive layer of material has to be provided. In this arrangement it is possible to choose different numbers, dimensions and/or arrangements of the via hole or via holes in the first via hole section as compared to the via hole or via holes in the second via hole section.

In the latter case, it is particularly preferred that the via hole or via holes of the first via hole section are not aligned with or displaced in the horizontal direction from the via hole or via holes of the second via hole section. The two via hole sections have different characteristic impedances already due to the via holes in the two via hole sections having different positions relative to the second electrical connection. In one embodiment the first and the second via hole sections may each consist of one via hole. In general, the first via hole section may consist of less or more via holes than the second via hole section, wherein all via holes of the first via hole section penetrate the same dielectric layers and all via holes of the second via hole section penetrate the same dielectric layers. For example, the first via hole section may consist of one via hole and the second via hole section may consist of two via holes that penetrate the same dielectric layers, or the second via hole section may consist of two via holes that penetrate the same dielectric layers and the first via hole section may consist of one via hole.

This arrangement has the advantage that it allows for greater positional manufacturing tolerances and larger shrinkage of the dielectric layers during manufacturing, e.g. during an LTCC burning process. Further, because the common interconnection layer extending in the direction of extension of the dielectric sheets perpendicularly to the stacking direction also contributes to the inductivity and constitutes a transmission line section extending in the direction of extension of the dielectric layers, it is possible to provide a higher inductance in a stacked arrangement of a given height as compared to a first electrical connection entirely consisting of the via holes.

In any embodiment comprising a resonator including a common interconnection layer between a first and a second via hole section, the first and second via hole section of such a resonator may extend from the same surface of the common interconnection layer. Such an arrangement can be regarded as a “folded” arrangement, because the first electrical connection turns back at the common interconnection layer. Therefore, the inductance may be increased as compared to an embodiment without a common interconnection layer, wherein at the same time the height of the stacked arrangement is reduced. However, the flexibility of arranging a plurality of coupled such resonators within a common laminate may be reduced. This folded arrangement is an example of the folded arrangements already described above, which have the same advantages. In a particular version of the folded arrangement the first capacitor electrode and the short-circuit electrode are spaced apart portions of the same electrically conductive layer.

It is to be noted that in addition to or as an alternative to providing a first electrical connection having a first via hole section and a distinct second via hole section arranged in the manner just described, the second electrical connection may also comprise a first via hole section and a distinct second via hole section arranged in the same manner. These two via hole sections, one of which may also be replaced by at least one electrically conductive layer on a lateral surface of the laminate, may likewise be provided such that two vertical transmission line sections having different characteristic impedances are defined.

In a preferred embodiment the resonator comprises two or more of the resonators, wherein each may be constructed as described above.

In a preferred version of this embodiment the resonator device comprises at least three of the resonators that are arranged side by side, wherein, in the direction of extension of the dielectric layers, the at least three resonators are not arranged along a straight line. This non-linear arrangement allows for a compact construction and facilitates the provision of selective cross-coupling between the resonators. For example, three resonators may be arranged in a triangular configuration and four resonators may be arranged in a rectangular or square configuration.

Advantageously, for two or more or all of the resonators of the resonator device the respective short-circuit electrodes are formed by a common electrically conductive layer (i.e. are at least respective portions of the common electrically conductive layer) and/or the respective first capacitor electrodes are formed by a common electrically conductive layer and are preferably separate and distinct portions of the common electrically conductive layer. In any case such a common electrically conductive layer may be provided on the outside of the stacked arrangement. Such arrangement ensures that the respective first capacitor electrodes and the respective short-circuit electrodes, respectively, are at a common electrical potential and facilitates the manufacturing process, because it is merely necessary to provide a single layer for the first capacitor electrodes and/or the short-circuit electrodes. Further, it is particularly easy to connect lateral outer conductors and via hole conductors which may be a part of the individual second electrical connections between the respective short-circuit electrodes and first capacitor electrodes.

In case there is at least one group of two resonators for which the respective short-circuit electrodes are formed by a common electrically conductive layer and the respective first capacitor electrodes are formed by a common electrically conductive layer and preferably by separate and distinct portions of the common electrically conductive layer, it is advantageously possible that, in the direction of extension of the dielectric layers, a third or intermediate resonator is disposed between the two resonators of the group. For this intermediate resonator the short-circuit electrode is formed by the common electrically conductive layer forming the first capacitor electrodes of the two resonators of the group and the first capacitor electrode is formed by the common electrically conductive layer forming the short-circuit electrodes of the two resonators of the group and preferably by a separate and distinct portion of this common electrically conductive layer. In this manner, the two resonators of the group and the intermediate resonator form an inter-digital resonator arrangement.

In case of resonator devices having at least two resonators, the at least two resonators may comprise at least one group of two resonators that are arranged, in the stacking direction, one upon the other and are electromagnetically coupled. Such a resonator device will, of course, have at least twice the thickness, in the stacking direction, than a resonator device that only includes resonators arranged side by side. However, it is possible to achieve more flexibility in coupling arrangements between a plurality of resonators.

In case of resonator devices having at least two resonators, the resonator device may comprise at least one group of two resonators that are preferably arranged side by side and that are arranged such that they are inductively coupled to each other.

Such inductive coupling is e.g. effected if at least a portion of the via holes of the first electrical connections are located sufficiently close to each other. Such coupling may advantageously be adjusted by one or more coupling adjusting via holes that is or are provided between the respective two resonators. Each such coupling adjusting via hole is provided in the form of a continuous through hole penetrating at least some of the dielectric layers and at least partially filled with conductive material so as to provide an electrical connection between both ends of the through hole. One end of each such coupling adjusting via hole is electrically connected to the two short-circuit electrodes of the two resonators and the other end of each such coupling adjusting via hole is electrically connected to the two first capacitor electrodes of the two resonators. Alternatively or additionally, the coupling can be adapted by providing that the first electrical connections of the two resonators each comprise at least one via hole section that is offset from the center of the respective second capacitor electrode, wherein the two via hole sections are closer to each other than the centers of the second capacitor electrodes. With other words, at least a via hole section of the first electrical connections or, in case the first electrical connections are constituted by one or more via holes extending the entire distance between the short-circuit electrode and the second capacitor electrode, two via holes are moved towards or away from each other to selectively adjust the coupling.

The inductive coupling may further be effected or enhanced by disposing a coupling loop between the respective two resonators. This coupling loop comprises two via holes extending from the short-circuit electrodes or the first capacitor electrodes and provided in the form of a continuous through hole penetrating at least some of the dielectric layers and at least partially filled with conductive material so as to provide an electrical connection between both ends of the through hole, and an electrically conductive interconnection layer provided on the surface of a dielectric layer. Each of the two via holes of the coupling loop is constituted as a via hole portion of the first electrical connection of one of the two resonators or as a separate via hole.

Furthermore, the inductive coupling may be effected or enhanced by providing that the respective two resonators comprise a common via hole section in their first electrical connection.

The inductive coupling may further be adapted by providing a coupling adjustment element, in the direction of extension of the dielectric layers, between the two resonators, which coupling adjustment element consists of a via hole in the form of a continuous through hole penetrating at least some of the dielectric layers and at least partially filled with conductive material so as to provide an electrical connection between both ends of the through hole, which via hole extends entirely between and is electrically connected to a common electrically conductive layer forming the first capacitor electrodes of the two resonators and a layer of electrically conductive material that is disposed, in the stacking direction, between the second capacitor electrodes of the two resonators and the short-circuit electrodes of the two resonators. It should be noted that in case the latter layer of electrically conductive material having a sufficiently large area and being provided sufficiently close to a common layer forming the short-circuit electrodes of the two resonators, the above-described inter-digital arrangement results.

In case of resonator devices having at least two resonators, the resonator device may comprise at least one group of two resonators that are preferably arranged side by side and that are arranged such that they are capacitively coupled to each other.

Such capacitive coupling may be effected by one or more coupling layers of conductive material provided on the surface of one of the dielectric layers, wherein the one or more coupling layers are, when viewed in the stacking direction, partially overlapping with and, in the stacking direction, spaced from the second capacitor electrode of at least one of the two resonators. The portion of a coupling layer overlapping with a second capacitor electrode of one of the two resonators and the corresponding portion of such second capacitor electrode form a capacitor that effects capacitive coupling between the coupling layer and the respective second capacitor electrode. In one embodiment at least one of the coupling layers is formed by a portion of the second capacitor electrode of one of the two resonators. In another embodiment at least one of the coupling layers is formed by an additional layer different from the second capacitor electrodes of the two resonators. In the latter case, two coupling layers each formed by an additional layer different from the second capacitor electrodes of the two resonators are provided, wherein the two coupling layers are spaced from each other in the stacking direction.

The above-described resonator device may be part of an RF device such as e.g. a duplexer or a band pass filter. In this case, the resonator device is provided with a capacitive or inductive input coupling and a capacitive or inductive output coupling.

The resonator device of the invention may be produced by a method including the following steps. A plurality of sheets made of dielectric material is provided. Each of at least one short-circuit electrode, at least one first capacitor electrode and at least one second capacitor electrode are prepared by depositing a layer of electrically conductive material on a portion of a surface of one of the dielectric sheets. The via holes of the first electrical connections, and optionally of the second electrical connections or any coupling means, are prepared by punching or laser drilling through holes through at least some of the dielectric layers and plating an inner surface of the through holes with an electrically conductive material. The dielectric sheets are stacked and laminated, together with the various electrically conductive layers, such that the resonator device is formed. Lamination may be carried out by a low temperature co-fired ceramics (LTCC) process.

DETAILED DESCRIPTION OF THE INVENTION

Figure 1A:
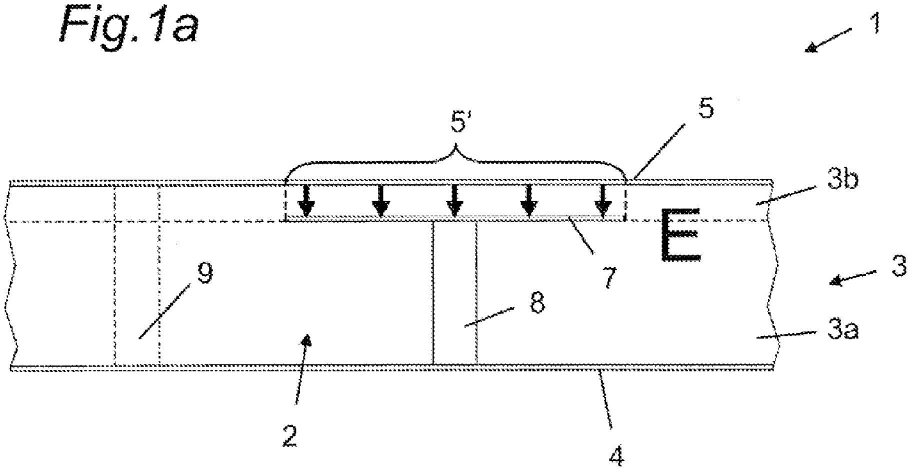
FIG. 1*a* is a schematic cross sectional side view of a resonator device comprising only one resonator.

In the following, exemplary preferred embodiments of the invention are described in more detail with reference to the drawings. Throughout the figures, similar and corresponding parts are designated by the same reference numerals.

In FIG. 1*a* a resonator device 1 having only one resonator 2 is shown in schematic cross sectional side view. The same resonator device 1 is shown in schematic top view in FIG. 1*b* and in cross sectional end view in FIG. 1*c*. The resonator device 1 comprises a laminate 3 that includes a plurality of sheets 3*a*, 3*b* made of dielectric material and stacked on top of each other and laminated together. This laminate 3, in which the sheets 3*a*, 3*b* constitute layers of the laminate, can be regarded as the main body of the resonator device or a substrate into which main body or substrate components of the resonator 2 to be described in the following are incorporated or embedded. It is to be understood that the sheet 3*a* and/or the sheet 3*b* may be replaced by a plurality of dielectric sheets stacked on top of each other and laminated together, resulting in a laminate 3 with more than two layers. In any case, the laminated structure defines a stacking direction from one terminal dielectric sheet to the opposing terminal dielectric sheet. These two terminal sheets can be regarded as top and bottom, respectively, of the main body, and the remaining surface(s) of the main body can be regarded as lateral or side surface(s). In this exemplary embodiment the laminate has a cuboidal shape, and thus a bottom surface, a top surface and four side surfaces.

Figure 1B:
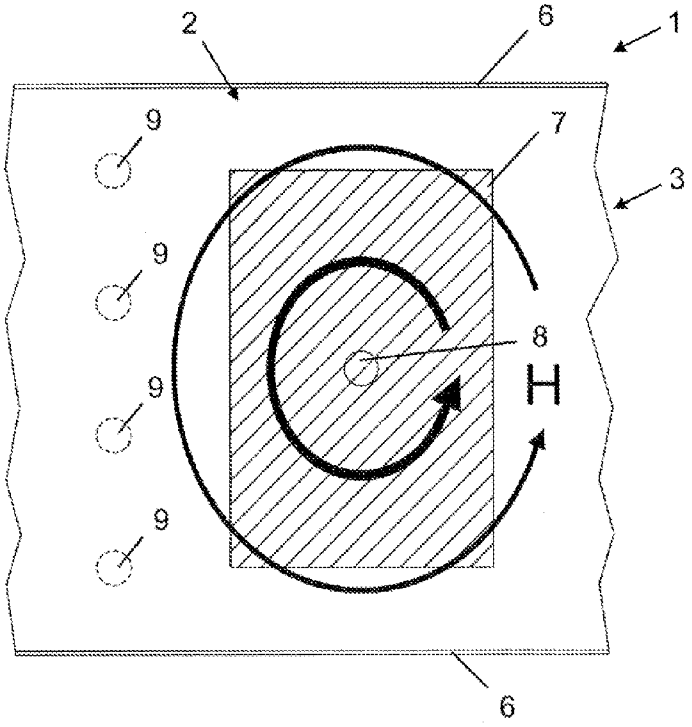
FIG. 1*b* is a schematic top view of the resonator device of FIG. 1*a*.
Figure 1C:
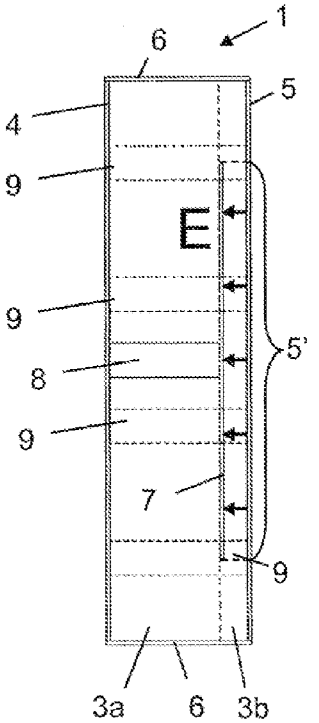
FIG. 1*c* is a different schematic cross sectional side view of the resonator device of FIG. 1*a*.

On the top and on the bottom surface a layer of electrically conductive material is provided, such as e.g. silver, each covering the entire surface. As will be described hereinbelow, the electrically conductive layer 4 on the—in FIG. 1*a*—bottom surface of the main body 3 forms a short-circuit electrode, and a portion 5' of the electrically conductive layer 5 on the—in FIG. 1*a*—top surface of the main body 3 constitutes a first capacitor electrode. Above, the structure has been described such that the two layers 4, 5 are being provided or deposited on the top and bottom surface of a laminate or main body excluding the layers 4, 5. In this case the laminate or main body is a dielectric substrate. However, it should be noted that the two electrically conductive layers 4, 5 could also be regarded as layers of the laminate or main body 3 which would then be not entirely dielectric. As can be seen in FIGS. 1*b* and 1*c*, the two electrically conductive layers 4, 5 are electrically interconnected by, inter alia, two electrically conductive layers 6 provided on the lateral surfaces of the laminate 3. In this embodiment, the layers 4 and 5 are shown covering the entire bottom surface and top surface, respectively, of the main body 3. This arrangement provides for shielding of the resonator device. However, in some cases it might also be advantageous that layer 4 and/or layer 5 does not cover the entire respective surface of the main body, although shielding would then be reduced or removed altogether.

In the stacking direction between the two electrically conductive layers 4, 5 a further electrically conductive layer 7 is provided on a portion of the surface of one of the dielectric layers 3*a*, 3*b* inside the laminate 3. This electrically conductive layer 7, which could again be regarded as being embedded into a dielectric main body or substrate or as a layer of the laminate or main body, has a rectangular shape and a smaller surface area than the electrically conductive layers 4, 5. It is separated from each of the layers 4, 5 by at least one of the dielectric layers 3*a*, 3*b* of the laminate 3 and is disposed closer to the layer 5 than to the layer 4. Due to the incorporation into the laminate 3, the layers 4, 5 and 7 extend parallel to each other. As will be described hereinbelow, the layer 7 constitutes a second capacitor electrode. The layer 7 may e.g. be created by depositing or printing electrically conductive material, such as e.g. silver, onto the surface of one of the dielectric sheets prior to the lamination process or by incorporating an electrically conductive sheet into the laminate.

A via hole 8 extends from the layer 7 to the layer 4 in a direction perpendicular to the direction of extension of the dielectric layers 3*a*, 3*b*, i.e. in the stacking direction. Via holes are also known as vertical interconnection access holes, i.e. holes that penetrate an isolating substrate in order to provide an electrical connection between two opposing sides of the substrate. Thus, the via hole 8 has the form of a continuous through hole penetrating all dielectric layers 3*a* between the electrically conductive layer 4 and the electrically conductive layer 7. The through hole has a columnar configuration and may be cylindrical with a circular, oval, square, rectangular, hexagonal or polygonal cross sectional shape. This through hole is at least partially filled with conductive material so as to provide an electrical connection between both ends of the through hole. The electrically conductive material may be plated onto the inside surface of the through hole, or the through hole may be completely filled with the electrically conductive material. The two opposing ends of the via hole are electrically directly connected to the two electrically conductive layers 4 and 7. The through hole of the via hole 8 may be produced by punching or laser drilling. Currently, the minimum diameter achievable is about 80 to 100 μm.

Four additional via holes 9, that are identical in construction to the via hole 8, are provided spaced from the electrically conductive layer 7. Each of the via holes 9 extends from the layer 5 to the layer 4 in a direction perpendicular to the direction of extension of the dielectric layers 3*a*, 3*b*, i.e. in the stacking direction. Together with the electrically conductive layers 6 provided on two opposing side surfaces of the laminate 3, they provide a good electrical connection between the electrically conductive layers 4 and 5. It is possible that the via hole 8 has a different diameter than the via holes 9.

Like a strip-line transmission line, the above-described structure is a (pseudo) coaxial transmission line that is short-circuited at one end and open-circuited at the opposing end. The via hole 8 constitutes a first electrical connection or the "inner conductor" of this (pseudo) coaxial transmission line, and the electrically conductive layers 6 and the via holes 9 in combination constitute a second electrical connection or the "outer conductor" of this (pseudo) coaxial transmission line. At one end, the inner conductor 8 and the outer conductor 6, 9 are short-circuited by a portion of the electrically conductive layer 4 which portion therefore constitutes a short-circuit electrode. At the opposing end the inner conductor 8 and the outer conductor 6, 9 are electrically isolated from each other by the dielectric layer(s) 3*b* of the laminate 3 between the electrically conductive layers 5 and 7. As is evident from FIGS. 1*a* and 1*c*, the electrically conductive layer 7 and the electrically conductive layer 5 (or, more particularly, the portion 5' of the electrically conductive layer 5 overlapping the electrically conductive layer 7) form a lumped element parallel plate capacitor by which the (pseudo) coaxial transmission line is capacitively loaded at its open end in order to achieve a length reduction of the transmission line. Thus, the portion 5' of the electrically conductive layer 5 overlapping the electrically conductive layer 7 and the electrically conductive layer 7 constitute a first and a second capacitor electrode, respectively. In FIGS. 1*a* to 1*c* the electric and magnetic field within the resonator is indicated by arrows.

In accordance with the (pseudo) coaxial transmission line construction, the capacitance and inductance of the resonator 2, and thus the characteristic impedance, are not concentrated at particular locations or lumped elements, but are defined by the resonator structure in a distributed manner. The material, arrangement and dimensions of the above-referenced components or elements of the resonator 2 are chosen such that the (pseudo) coaxial transmission line has an overall transmission line path length of from λ/200 to λ/5.

If one would designate the prior art laminated type resonators having a strip-line transmission line extending in the direction of extension of the dielectric layers as horizontal resonator or transmission line, one could refer to the resonator 2 shown in FIGS. 1*a* to 1*c* as vertical resonator or transmission line.

Figure 2:
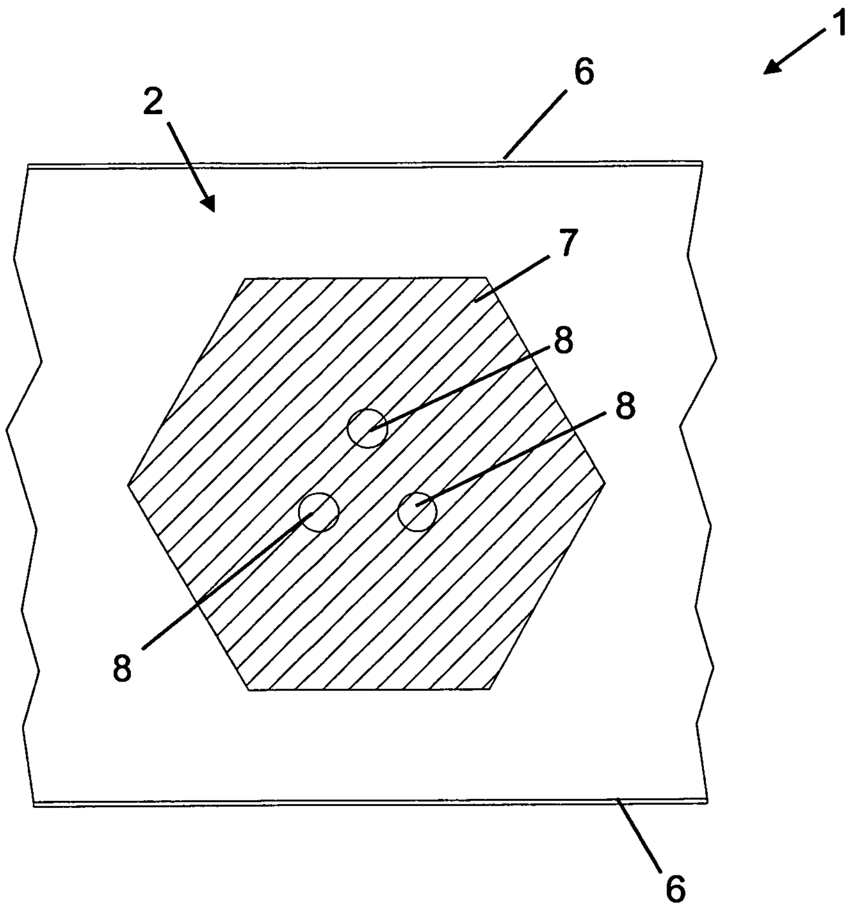
FIG. 2 is a schematic top view of a further embodiment of a resonator device comprising only one resonator.

FIG. 2 shows a cross sectional top view (with the layers 5 and 3*b* being removed for the purpose of illustration, like in other similar Figures) of a modified version of the resonator device 1 shown in FIGS. 1*a* to 1*c*. The second capacitor electrode layer 7 may have an arbitrary shape. However, it is preferred that the shape has some symmetry about a center. For example, the second capacitor electrode layer 7 may have a circular shape or the hexagonal shape shown in FIG. 2. Further, the first electrical connection or the inner conductor may include more than the one via hole 8 of the embodiment shown in FIGS. 1*a* to 1*c*. In FIG. 2, three parallel via holes 8 in a triangular arrangement are shown. Such a plurality of via holes 8 provides the advantage of decreasing the influence of manufacturing tolerances on the overall effective inner diameter of the (pseudo) coaxial transmission line, which is then not only defined by one via hole 8, but also by the relative distances and arrangement of the plurality of via holes 8 forming the first electrical connection or inner conductor. However, due to an increase of the effective inner diameter the inductivity is reduced. Additionally, the resonator device 1 shown in FIG. 2 does not comprise via holes 9. Rather, the second electrical connection or outer conductor of the (pseudo) coaxial transmission line is only constituted by the outer electrically conductive layers 6.

Figure 3A:
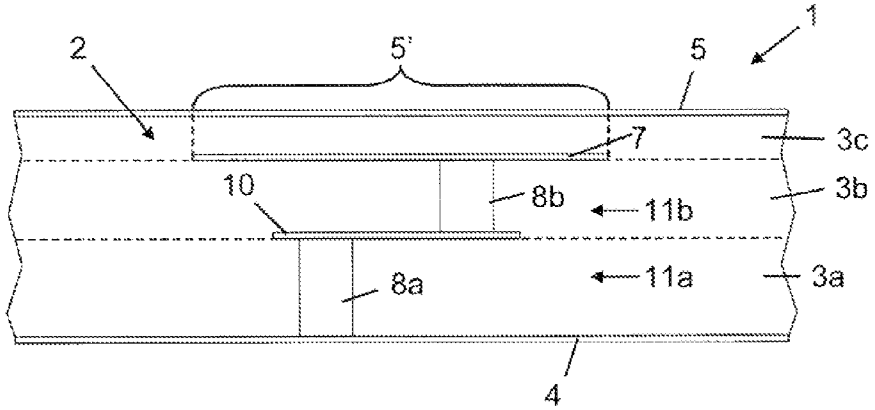
FIG. 3*a* is a schematic cross sectional side view of a further embodiment of a resonator device comprising only one resonator, wherein the transmission line has two distinct sections having a different characteristic impedance.
Figure 3B:
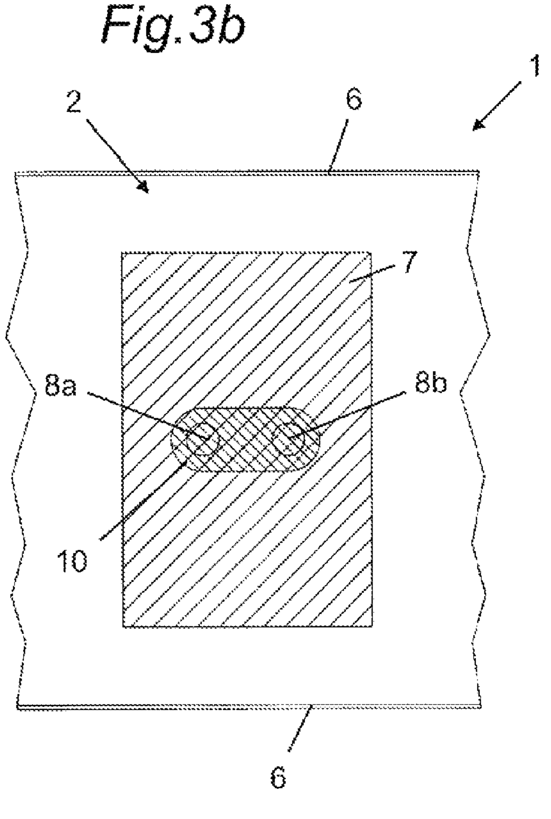
FIG. 3*b* is a schematic top view of the resonator device of FIG. 3*a*.
Figure 3C:
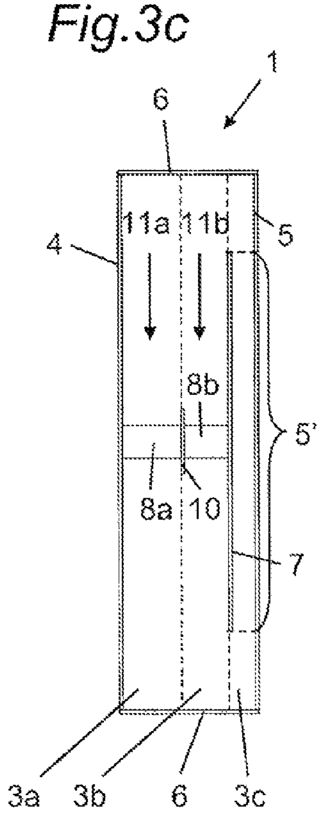
FIG. 3*c* is a different schematic cross sectional side view of the resonator device of FIG. 3*a*.

In FIGS. 3*a* to 3*c* a further preferred embodiment of the resonator device 1 is shown. It is similar to the embodiment shown in FIGS. 1*a* to 1*c*, but it does not comprise via holes 9 (like the embodiment shown in FIG. 2) and it comprises a modified first electrical connection or inner conductor. The laminate 3 comprises at least three dielectric layers 3*a*, 3*b*, 3*c*. Further, instead of the single via hole 8 extending the entire distance between the short-circuit electrode layer 4 and the second capacitor electrode layer 7, the resonator 2 of the resonator device 1 shown in FIGS. 3*a* to 3*c* comprises two separate via holes 8*a* and 8*b* that are displaced with respect to each other in a direction of extension of the dielectric layers. Each of these via holes 8*a* and 8*b* extends only a part of the distance between the short-circuit electrode layer 4 and the second capacitor electrode layer 7. The via hole 8*a* extends in the stacking direction from the short-circuit electrode layer 4 to an electrically conductive interconnection layer 10 provided on the surface of dielectric layer 3*a* of the laminate 3 between the short-circuit electrode layer 4 and the second capacitor electrode layer 7. The via hole 8*b* extends in the stacking direction from this interconnection layer 10 to the second capacitor electrode layer 7. Thus, in this case the first electrical connection or inner conductor of the resonator 2 consists of the via hole 8*a*, the interconnection layer 10 and the via hole 8*b*, and the first electrical connection or inner conductor comprises two via hole sections 11*a*, 11*b*, each consisting of one of the via holes 8*a*, 8*b*, electrically connected by the interconnection layer 10. The two via hole sections 8*a*, 8*b* each form part of a "vertical" transmission line section, whereas the interconnection layer 10, which also contributes to the characteristic impedance and in particular to the inductance of the total transmission line, form part of a "horizontal" transmission line section.

This construction provides the advantage that, as compared to a single via hole, a plurality of via holes that are not aligned and interconnected by interconnection layers allows larger inductance values to be obtained in a resonator device of a given height. Also, this construction is less sensitive to e.g. ceramic shrinkage during an LTCC burning process, thereby reducing the manufacturing costs and increasing the flexibility in the choice of dielectric material. Further, this construction enhances the design flexibility and adjustability when coupling together a plurality of resonators 2 in a resonator device 1 as will be described later-on.

Figure 4A:
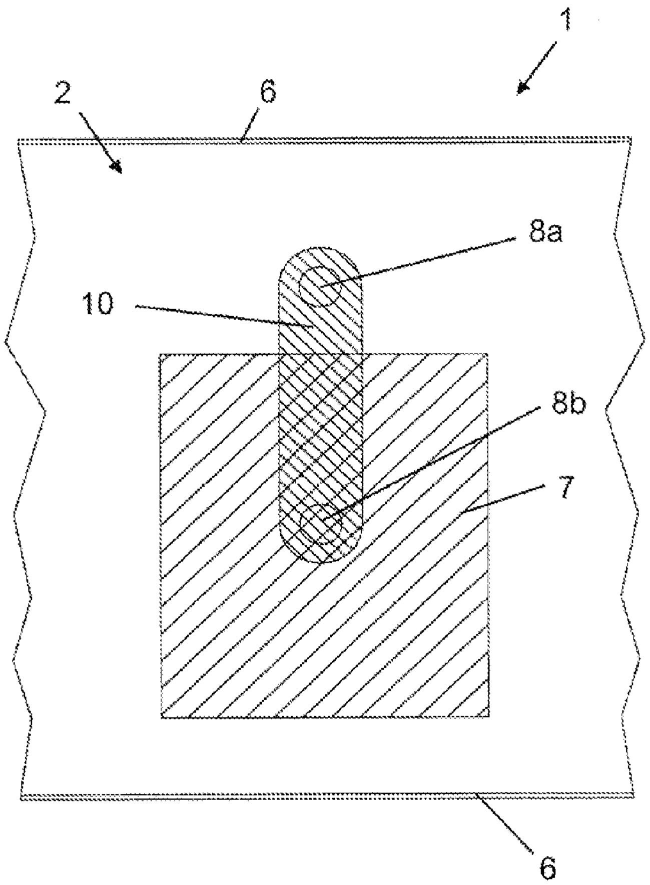
FIG. 4*a* is a schematic top view of a further embodiment of a resonator device comprising only one resonator, wherein the transmission line is arranged in a folded configuration, thereby realizing two distinct sections having a different characteristic impedance.
Figure 4B:
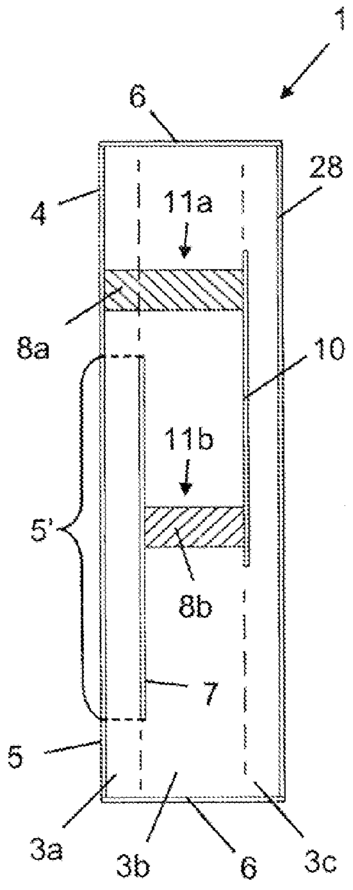
FIG. 4*b* is a schematic cross sectional side view of the resonator device of FIG. 4*a*.

In FIGS. 4*a* and 4*b* a modified version of the embodiment of FIGS. 3*a* to 3*c* is shown. In this modified version the two via holes 8*a*, 8*b* do not extend from opposite surfaces of the interconnection layer 10 into opposite directions, but extend from the same surface of the interconnection layer 10 in the same direction. Thus, the first electrical connection turns back or is folded at the interconnection layer 10 so that the overall height of the resonator device 1 can be decreased as compared to FIGS. 3*a* to 3*c* while maintaining the inductance. In this case, the single electrically conductive layer 4,

5 forms both the short-circuit electrode and the first capacitor electrode, the latter being the portion 5' overlapping the second capacitor electrode layer 7. An electrically conductive layer 28 taking the position of the first capacitor electrode layer 5 of the embodiment shown in FIGS. 3*a* to 3*c* functions as an electrical shield.

Figure 5A:
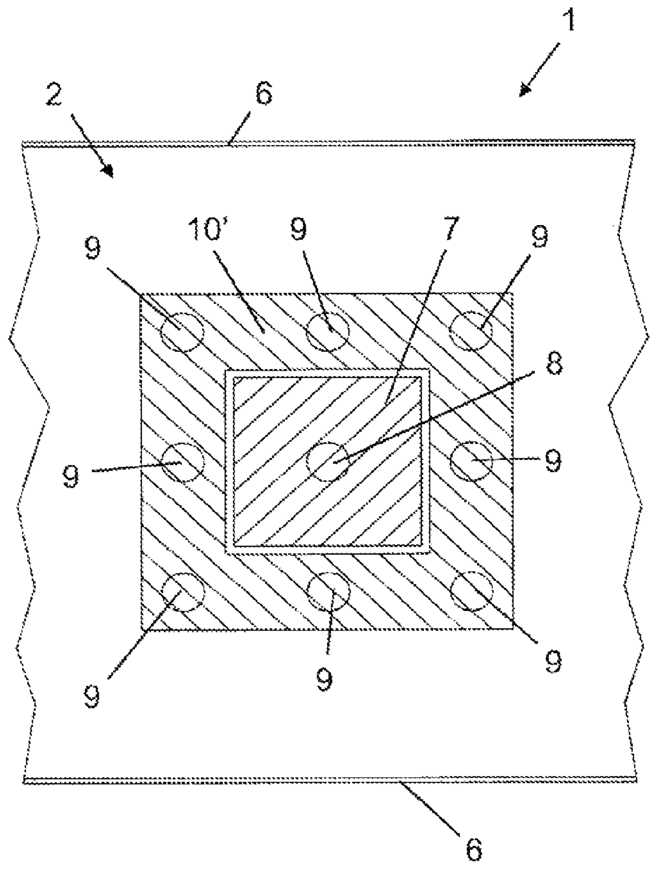
FIG. 5*a* is a schematic top view of a further embodiment of a resonator device comprising only one resonator and having a transmission line arranged in a folded configuration.
Figure 5B:
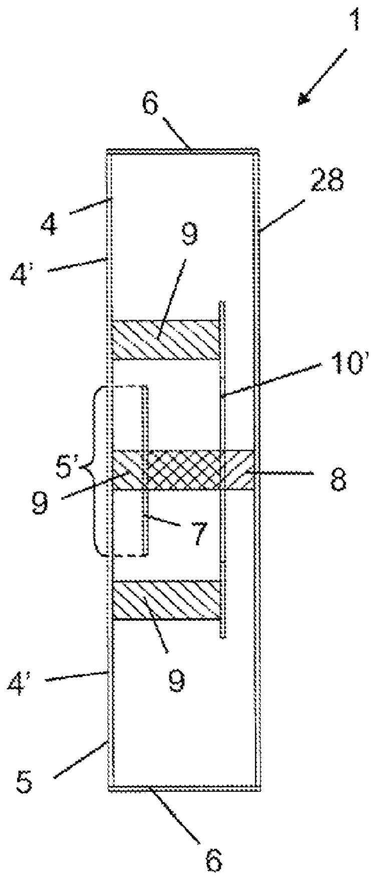
FIG. 5*b* is a schematic cross sectional side view of the resonator device of FIG. 5*a*.

A more complex folded embodiment is shown in FIGS. 5*a* and 5*b*. In these figures the dielectric layers of the laminate 3 are not shown. The same applies to most of the remaining figures. However, it is to be understood that the laminate 3 has the same structure as that shown in the previous figures. In the embodiment of FIGS. 5*a* and 5*b*, the second electrical connection comprises eight via holes 9 extending from the electrically conductive layer 4, 5 forming the short-circuit electrode and the first capacitor electrode and at least a portion of an electrically conductive, annularly shaped layer 10'. The first electrical connection comprises the electrically conductive layers 6 on the lateral sides of the laminate 3, the electrically conductive layer 28 and one via hole 8 extending between the electrically conductive layer 28 and the electrically conductive layer 7 constituting the second capacitor electrode. Different from the embodiment of FIGS. 4*a* and 4*b* there are two via hole sections one of which is part of the first electrical connection and the other of which is part of the second electrical connection. These two via hole sections are not interconnected by only a common interconnection layer 10. Rather, they are interconnected by means of a portion 4' of layer 4, 5, which portion 4' constitutes the short-circuit electrode, layers 6 and layer 28. It is to be noted that in this case the resulting (pseudo) coaxial transmission line comprises along its path a first portion, in which the first electrical connection functions as the outer conductor and the second electrical connection functions as the inner conductor, and a second portion, in which the first electrical connection functions as the inner conductor and the second electrical connection functions as the outer conductor. In the first portion the layers 6 and the via hole 8 of the first electrical connection partly surround the via holes 9 of the second electrical connection, and in the second portion the via holes 9 of the second electrical connection partly surround the via hole 8 of the first electrical connection. Thus, the first electrical connection extends along its electrical path in a first portion on the exterior of the annularly arranged via holes 9 and then turns back to extend in the interior of the annularly arranged via holes 9 in a second portion. Further, it should be noted that the overall structure could equally well be described as comprising two resonators arranged in an inter-digital arrangement similar to the embodiment shown in FIGS. 23*a* and 23*b* and described in detail below.

Figure 6A:
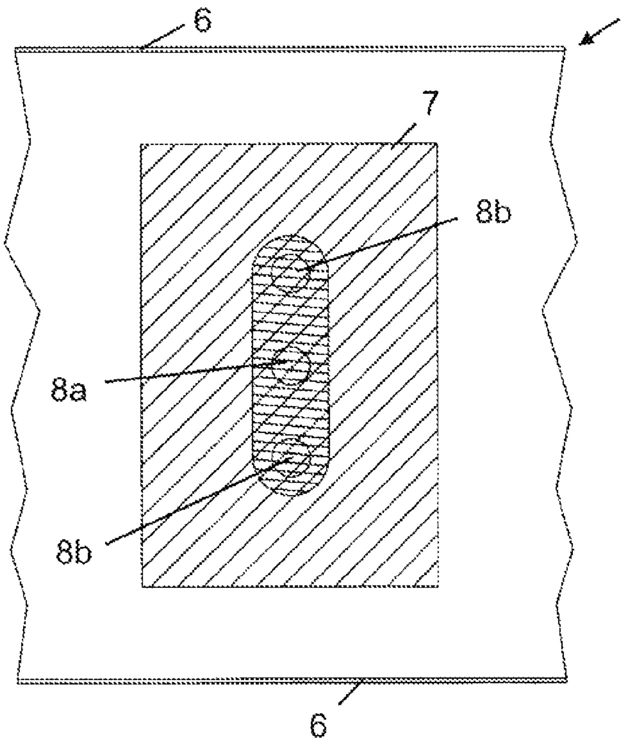
FIG. 6*a* is a schematic top view of a further embodiment of a resonator device comprising only one resonator, wherein the transmission line has two distinct sections having a different characteristic impedance.
Figure 6B:
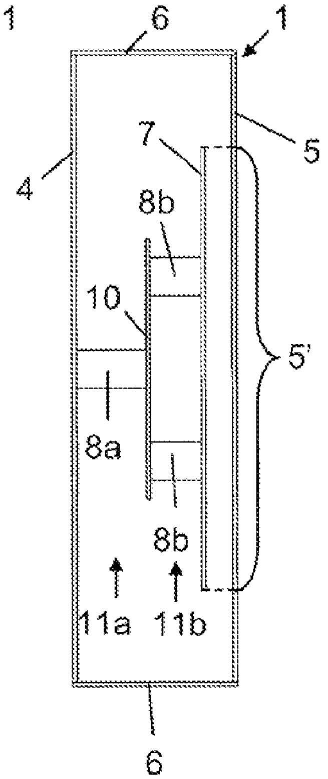
FIG. 6*b* is a schematic cross sectional side view of the resonator device of FIG. 6*a*.

In FIGS. 6*a*, 6*b* and 7*a*, 7*b* two other modified versions of the embodiment of FIGS. 3*a* to 3*c* are shown. In FIGS. 6*a*, 6*b* the via hole section 11*a* in the proximity of the short-circuit electrode layer 4 consists of only one via hole 8*a*, whereas the via hole section 11*b* in the proximity of the second capacitor electrode layer 7 consists of two parallel via holes 8*b* that are not aligned with the via hole 8*a*. As before, the via holes 8*a*, 8*b* of the two via hole sections 11*a*, 11*b* are electrically connected by an electrically conductive interconnection layer 10. Due to the provision of two spaced via holes 8*b* in via hole section 11*b*, the effective inner diameter of the (pseudo) coaxial transmission line is increased in this section as compared to the effective inner diameter of the transmission line in via hole section 11*a*. Consequently, the benefits described above for the SIR concept can be achieved. Furthermore, due to the two instead of only one via hole for contacting the second capacitor electrode layer 7, the current paths at this electrode are shortened, which results in a better quality factor. Of course, it is also possible to change the outer effective diameter when using via holes 9 as part of the second electrical connection or outer conductor.

Figure 7A:
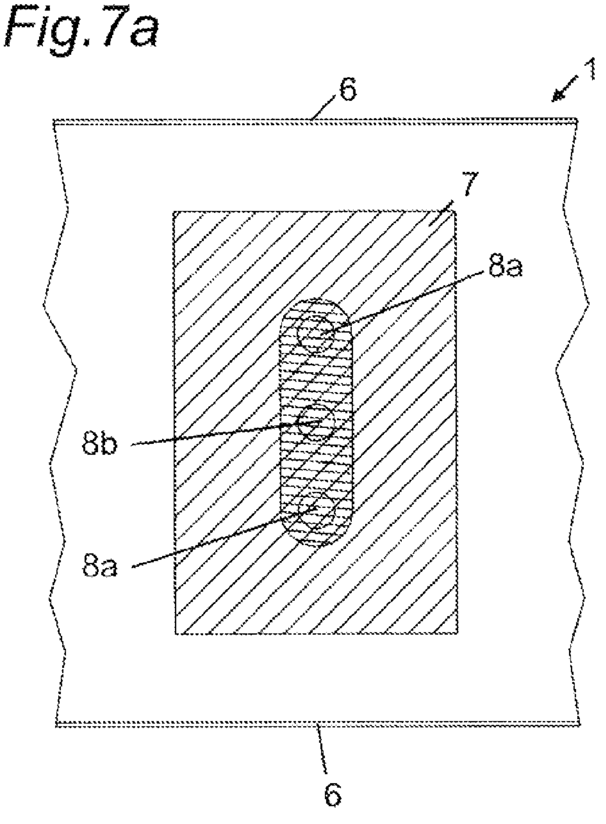
FIG. 7*a* is a schematic top view of a modified version of the embodiment of FIGS. 6*a* and 6*b*.
Figure 7B:
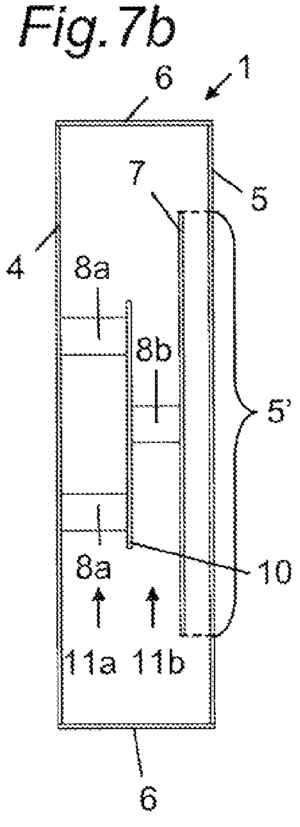
FIG. 7*b* is a schematic cross sectional side view of the resonator device of FIG. 7*a*.

In the resonator device shown in FIGS. 7*a* and 7*b* the two via hole sections 11*a*, 11*b* are interchanged, i.e. the via hole section 11*a* in the proximity of the short-circuit electrode layer 4 consists of two parallel via holes 8*a*, whereas the via hole section 11*b* in the proximity of the second capacitor electrode layer 7 consists of only one via hole 8*b* that is not aligned with the via holes 8*a*. This arrangement likewise improves the quality factor performance.

Figure 8A:
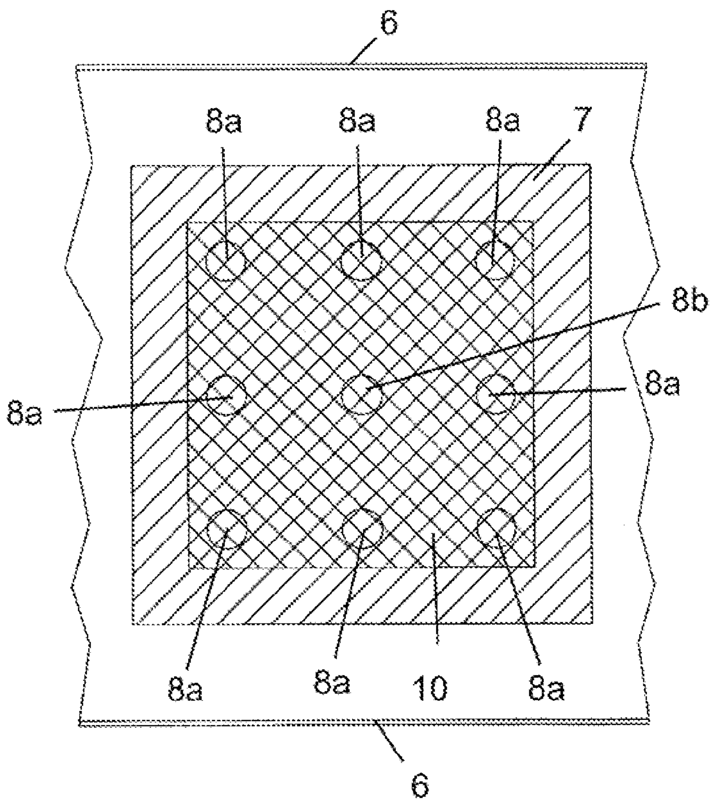
FIG. 8*a* is a schematic top view of a modified version of the embodiment of FIGS. 6*a* and 6*b*.
Figure 8B:
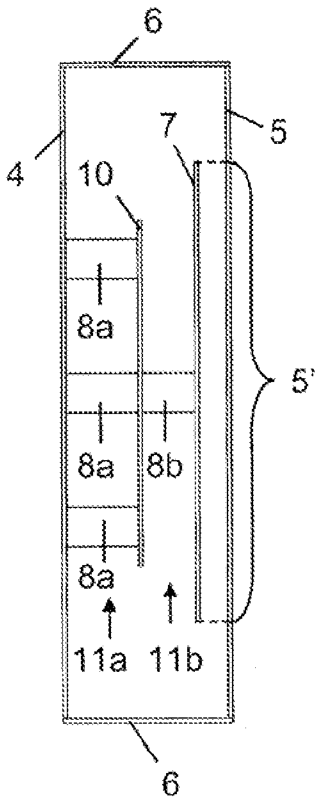
FIG. 8*b* is a schematic cross sectional side view of the resonator device of FIG. 8*a*.

In FIGS. 8*a* and 8*b* an embodiment similar to the embodiment of FIGS. 7*a* and 7*b* is shown. The only difference is that the via hole section 11*a* comprises eight instead of only two via holes 8*a*, which eight via holes 8*a* are connected to the electrically conductive interconnection layer 10 at positions near its edge and surrounding the center of interconnection layer 10 to which the single via hole 8*b* is connected. It is evident that in this embodiment the empty space surrounded by the eight via holes 8*a* is unused. As described above with reference to FIGS. 5*a* and 5*b*, this empty space might be used to realize a folded arrangement of the resonator, thereby reducing the height of the resonator device 1 for a given inductance of the coaxial transmission line.

Figure 9:
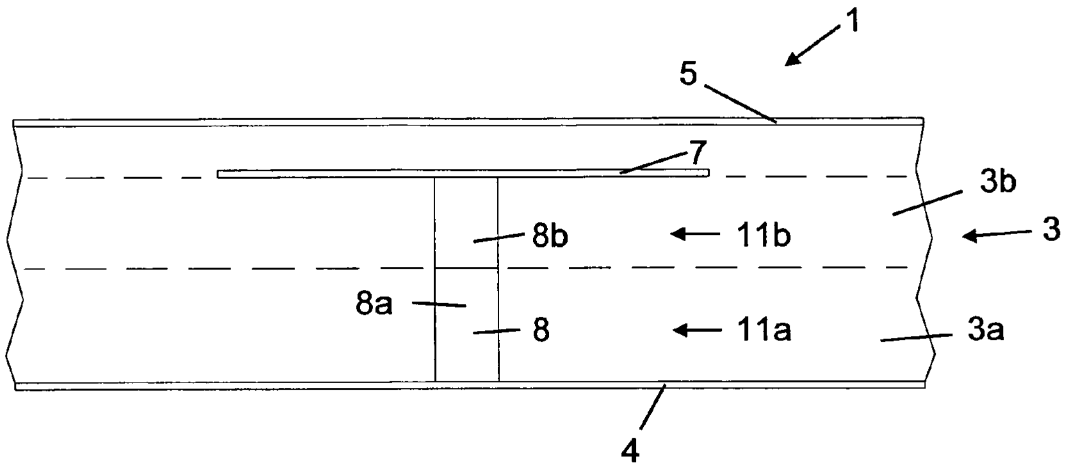
FIG. 9 is a schematic cross sectional side view of a further embodiment of a resonator device comprising only one resonator, wherein the transmission line has two distinct sections having a different characteristic impedance.

A further possibility of modifying the resonator device 1 shown if FIGS. 1*a* to 1*c* such that the inner conductor comprises two distinct sections with different physical parameters is shown in FIG. 9. In this case, the first electrical connection or inner conductor consists of a single via hole 8. However, the via hole 8 penetrates two regions 3*a* and 3*b* of dielectric material, wherein the dielectric material in the regions 3*a* and 3*b* have different dielectric constants, so that the impedance of the respective vertical transmission line sections differs from each other. Each of the regions 3*a*, 3*b* may comprise only one dielectric layer, e.g. in the form of a dielectric sheet, or a plurality of dielectric layers. The section of via hole 8 penetrating region 3*a* is a first via hole section 8*a*, and the section of via hole 8 penetrating region 3*b* is a second via hole section. In order to achieve the benefits described above for the SIR concept, the dielectric constant in region 3*a* should be lower than in region 3*b* to obtain a higher impedance value in region 3*a*. Of course, the arrangement of FIG. 9 may be combined with the arrangement shown in FIGS. 3*a* to 8*b*.

The resonator devices 1 of the present invention may also advantageously include two or more of the resonators 2 described above in a common laminate or main body 3. Such a plurality of resonators 2 are capacitively and/or inductively coupled to form an RF device, such as a band pass filter.

Figure 10A:
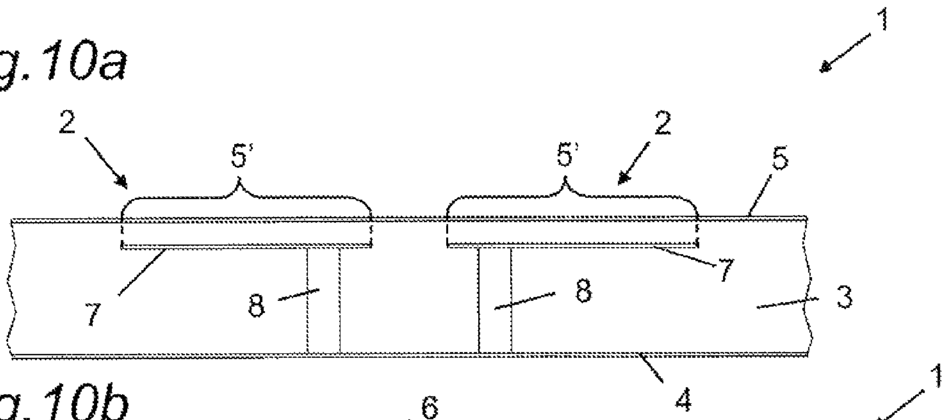
FIG. 10*a* is a schematic cross sectional side view of an embodiment of a resonator device comprising two adjacent resonators that are coupled inductively.
Figure 10B:
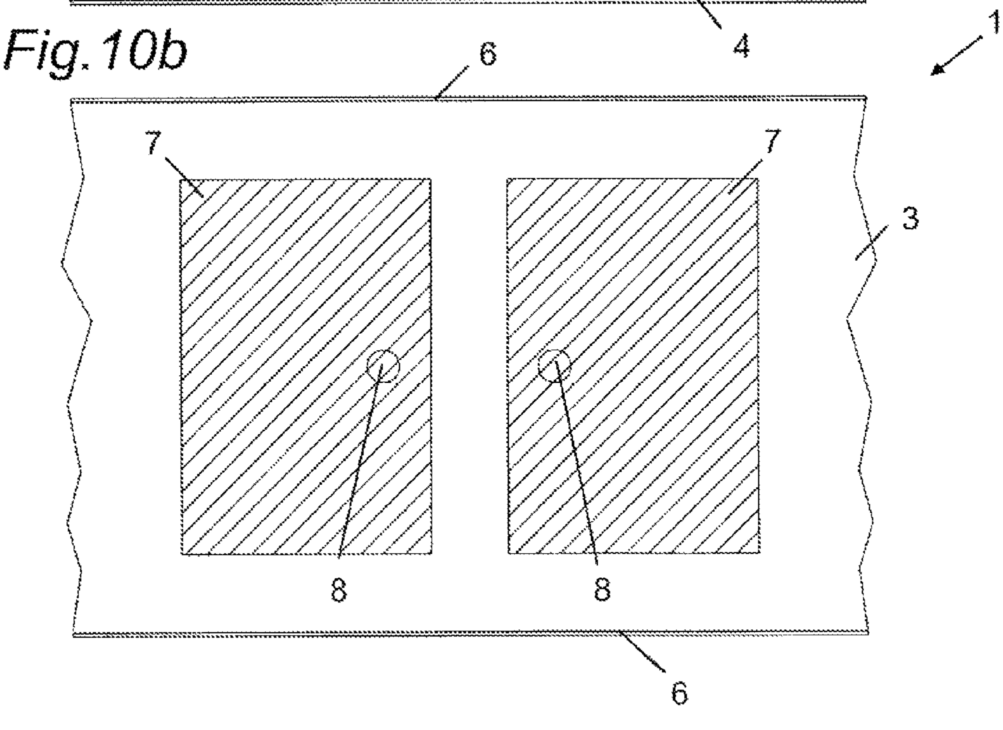
FIG. 10*b* is a schematic top view of the resonator device of FIG. 10*a*.
Figure 11A:
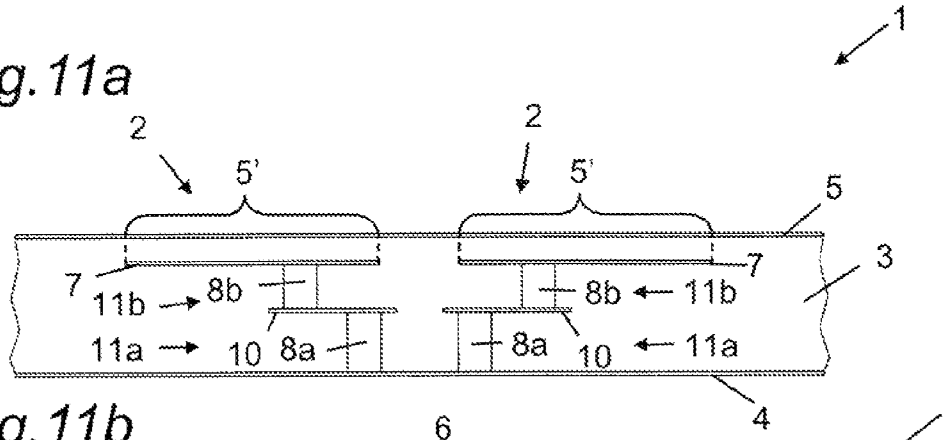
FIG. 11*a* is a schematic cross sectional side view of a further embodiment of a resonator device comprising two adjacent resonators that are coupled inductively, wherein each transmission line of the two resonators has two distinct sections having a different characteristic impedance and is arranged similar to the resonator shown in FIGS. 3*a* to 3*c*.
Figure 11B:
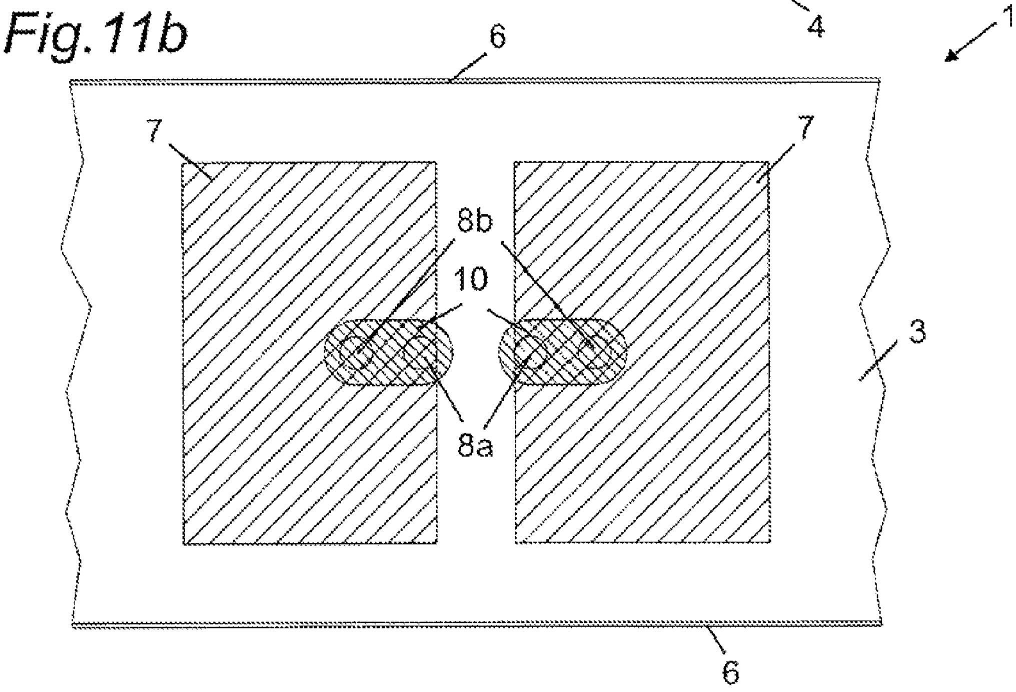
FIG. 11*b* is a schematic top view of the resonator device of FIG. 11*a*.

One embodiment of a resonator device 1 including two resonators 2 in a common cuboidal dielectric laminate or main body 3 is depicted in FIGS. 10*a* and 10*b*. Each of the two resonators 2 is generally identical in construction with the single resonator 2 of the resonator device shown in FIGS. 1*a* to 1*c*. As can be seen, there is only a single short-circuit electrode layer 4 that is common to the two resonators 2 and forms the short-circuit electrode for both of them. Similarly, there is only a single first capacitor electrode layer 5 common to the two resonators 2. Separate portions 5' of the layer 5 constitute the respective two first capacitor electrodes. Moreover, the second electrical connection or outer conductor of the two resonators is formed by two common electrically conductive layers 6 provided on two opposing side surfaces of the laminate 3. However, the two resonators 2 have separate via holes 8 and separate second capacitor electrode layers 7, each constituting one of the two second capacitor electrodes. These two resonators 2 are disposed sufficiently close to each other in order to achieve inductive coupling between them.

The strength of coupling can be set by changing the distance between the two via holes 8 while maintaining the distance between the two second capacitor electrode layers 7. In FIGS. 10*a* and 10*b*, the two via holes 8 have been disposed at a smaller distance as compared to via holes located in the center of the respective second capacitor electrode layers 7 in order to obtain stronger inductive coupling.

A similar configuration in which the resonators 2 shown in FIGS. 10*a* and 10*b* are replaced by the resonators 2 shown in FIGS. 3*a* to 3*c* and having two transmission line sections 11*a*, 11*b* with a single via hole 8*a*, 8*b* in each section, which via holes 8*a*, 8*b* are interconnected by an electrically conductive interconnection layer 10, is shown in FIGS. 1*la* and 11*b*. It is evident that the flexibility of coupling is enhanced because individual via hole sections may be arranged relative to each other to achieve the desired coupling.

Figure 12A:
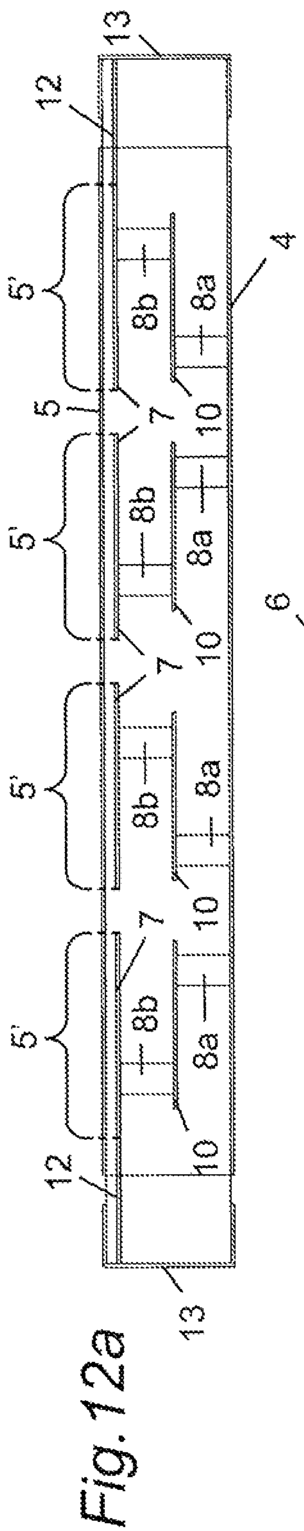
FIG. 12*a* is a schematic cross sectional side view of a further embodiment of a resonator device similar to the embodiment shown in FIGS. 11*a* and 11*b*, but comprising four adjacent resonators that are coupled inductively and are arranged in a linear configuration.
Figure 12B:
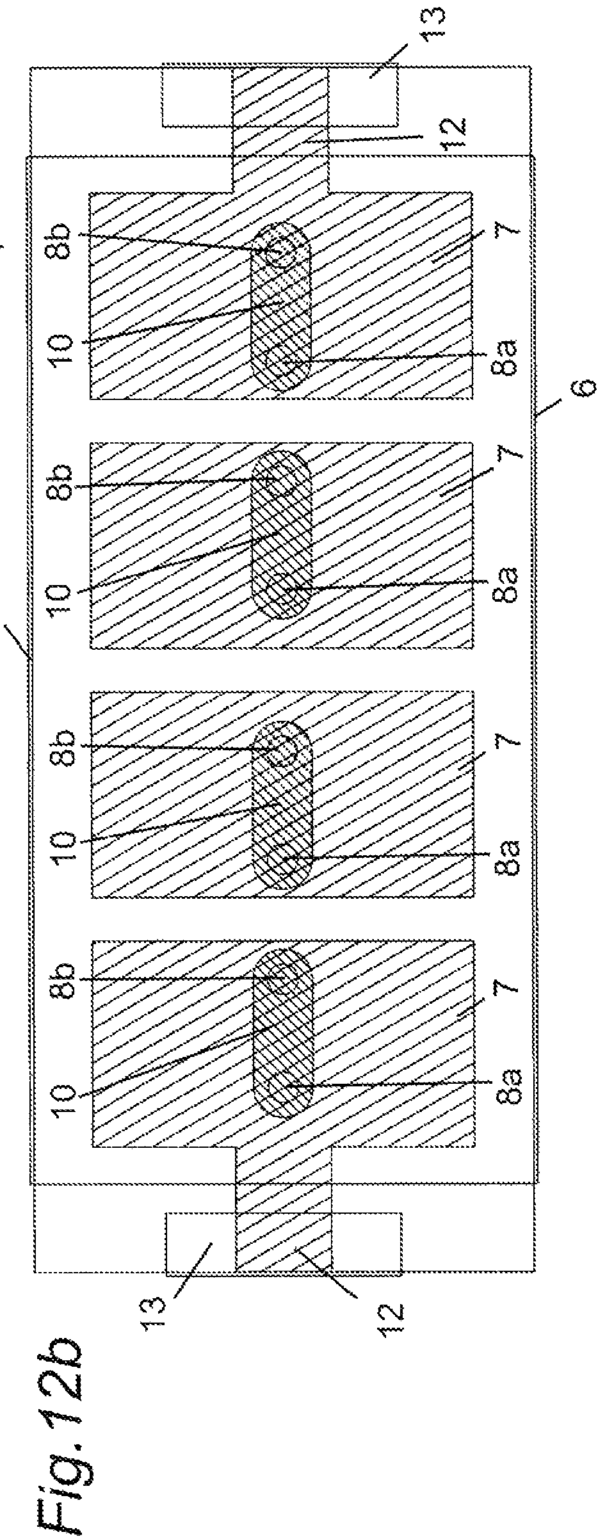
FIG. 12*b* is a schematic top view of the resonator device of FIG. 12*a*.

FIGS. 12*a* and 12*b* show a version in which four of the resonators 2 of FIGS. 3*a* to 3*c* are arranged along a straight line. The two inner resonators are arranged such that the via holes 8*b* are close to each other to achieve a strong mutual inductive coupling in the region of via hole section 11*b*, and the outer two resonators 2 are arranged such that their via holes 8*a* are close to the via holes 8*a* of the respective adjacent resonator 2 to achieve a strong mutual inductive coupling in the region of via hole section 11*a*. It should be noted that adjustment of mutual coupling between adjacent resonators 2 in this manner also influences the inductance values of the individual resonators, which influence has to be compensated by changing the individual capacitors suitably. Further, FIGS. 12*a* and 12*b* show direct inductive coupling of the two outer resonators 2 to a respective input/output coupling side electrode 13 by an extension 12 of the respective second capacitor electrode layer 7. Thus, FIGS. 12*a* and 12*b* show a four pole filter device having mirror symmetry.

Figure 13A:
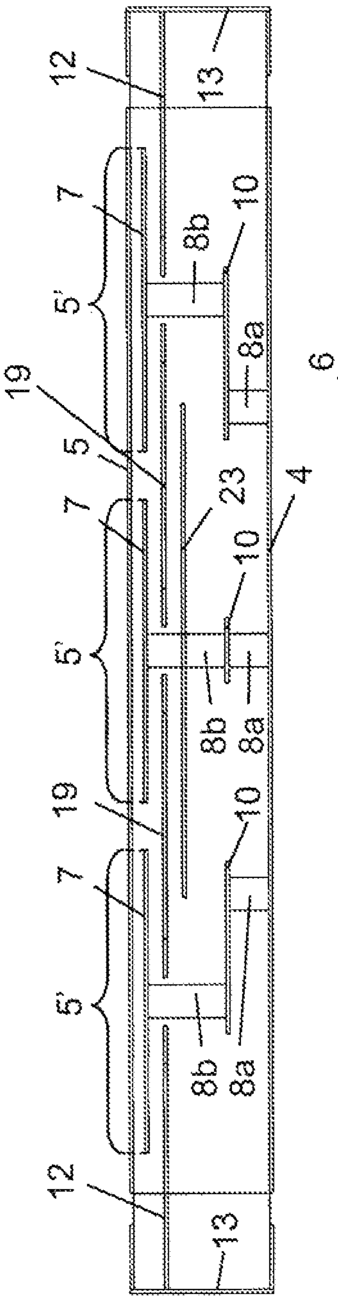
FIG. 13*a* is a schematic cross sectional side view of a further embodiment of a resonator device similar to the embodiment shown in FIGS. 12*a* and 12*b*, but comprising only three adjacent resonators, which resonators are coupled inductively as well as capacitively and are arranged in a non-linear configuration.
Figure 13B:
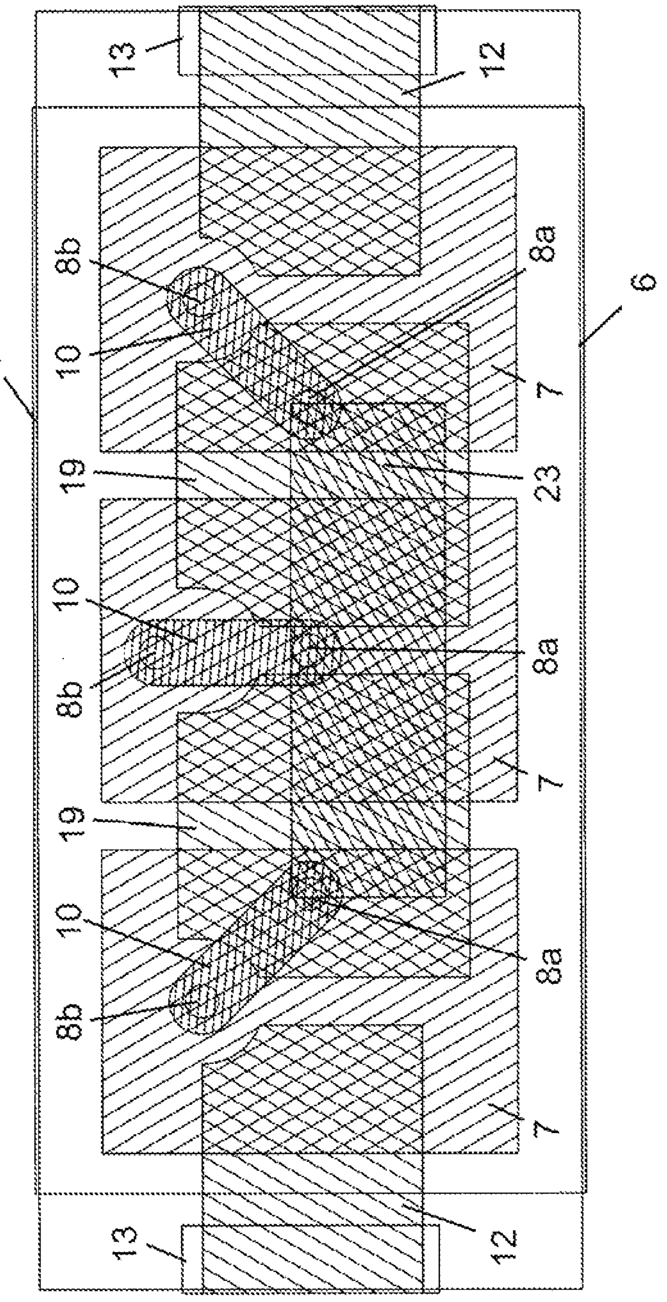
FIG. 13*b* is a schematic top view of the resonator device of FIG. 13*a*.

A three pole filter device of similar construction is shown in FIGS. 13*a* and 13*b*. In this embodiment, the three resonators 2 of FIGS. 3*a* to 3*c* are arranged such that their via holes 8*a* are closer to each other than their via holes 8*b* to achieve a strong mutual inductive coupling in the region of via hole section 11*a*, i.e. in the proximity of the short-circuit electrode layer 4. In the region of via hole section 11*b* the mutual coupling between the three resonators 2 is enhanced by providing additional electrically conductive layers 19 and 23 that are located below the three second capacitor electrode layers 7. As will be described in detail below with reference to FIGS. 24*a*, 24*b* and 28*a*, 28*b*, the two layers 19 provide capacitive coupling between each two adjacent resonators and the layer 23 provides capacitive coupling between the two outer resonators. The mutual inductive coupling in via hole section 11*a* may be advantageously used together with the capacitive coupling in via hole section 11*b* to control the transmission zero. The length of the portion of the first electrical connection provided by the interconnection layer 10 of the central resonator may be the same as or different from the corresponding length provided by the interconnection layers 10 of the two outer resonators. As can be seen from the figures, the via holes 8*b* are connected to the respective rectangular second capacitor electrode layers 7 offset from its center. This has the advantage that more space is left for the layers 19, 23 providing for capacitive coupling, because due to manufacturing design rules they have to be sufficiently spaced from the via holes 8*b*. Further, the length of the portion of the first electrical connection provided by the interconnection layer can be increased in order to further increase the inductivity. Finally, due to the offset arrangement of the via holes 8*b*, the impedance in the transmission line sections of which the via holes 8*a* are a part is higher than the impedance in the transmission line sections of which the via holes 8*b* are a part, thereby providing the advantages of the SIR concept together with a load capacitor are realized.

Figure 14A:
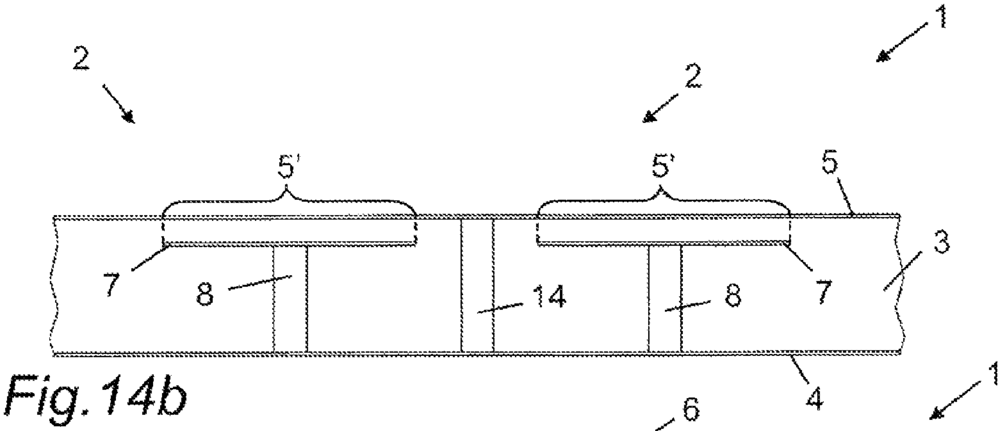
FIG. 14*a* is a schematic cross sectional side view of a further embodiment of a resonator device comprising two adjacent resonators that are coupled inductively, wherein coupling adjusting via holes are disposed between the two resonators.
Figure 14B:
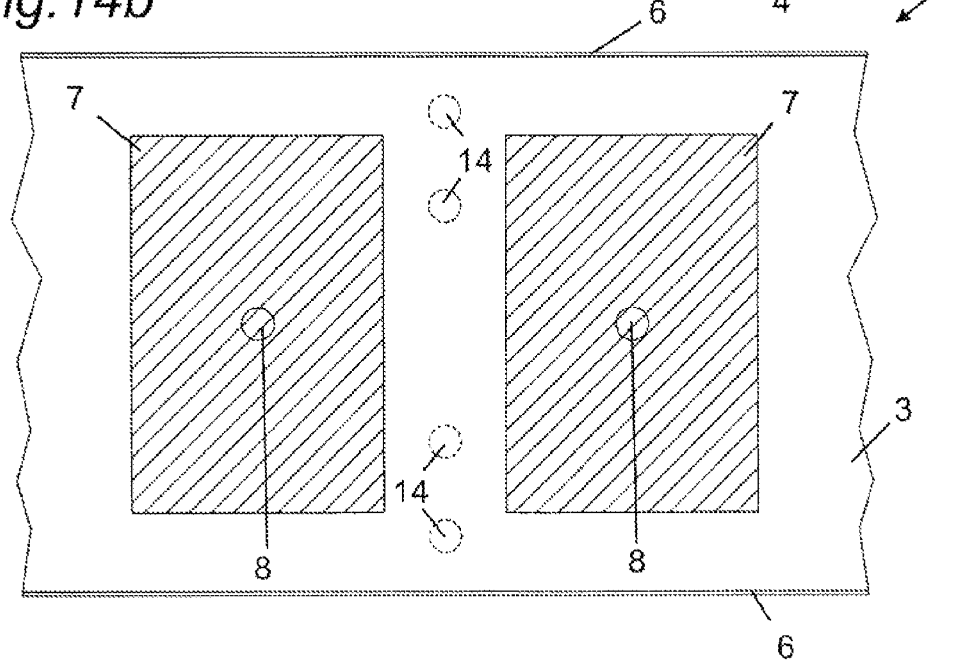
FIG. 14*b* is a schematic top view of the resonator device of FIG. 14*a*.

The inductive coupling between two resonators 2 may also be influenced or adjusted by one or more additional via holes 14 extending from the short-circuit electrode layer 4 to the first capacitor electrode layer 5 and provided between the two resonators 2 (see FIGS. 14*a* and 14*b*). These via holes 14 reduce the inductive coupling.

Figure 15A:
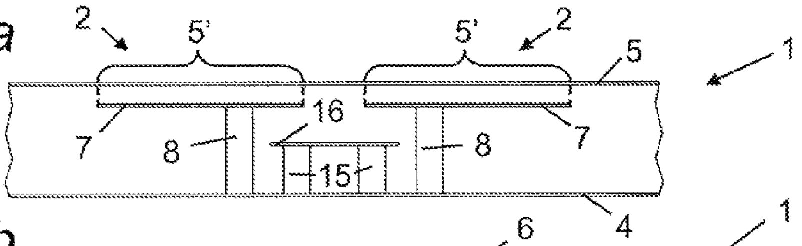
FIG. 15*a* is a schematic cross sectional side view of a further embodiment of a resonator device comprising two adjacent resonators that are coupled inductively, wherein a coupling loop is disposed between the two resonators.
Figure 15B:
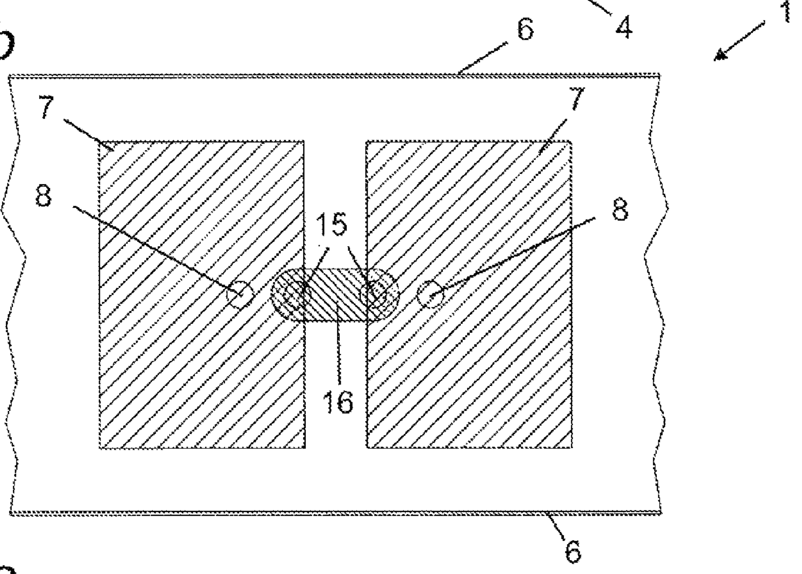
FIG. 15*b* is a schematic top view of the resonator device of FIG. 15*a*.
Figure 16A:
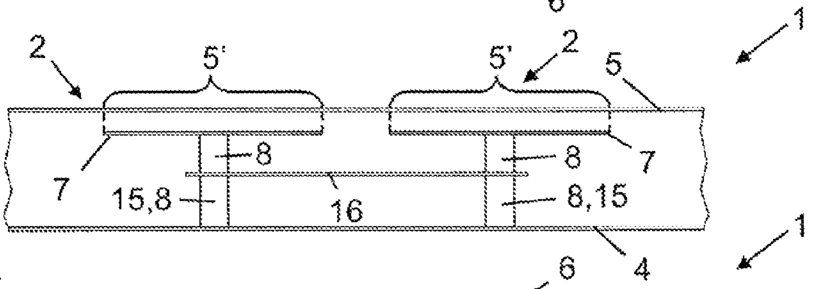
FIG. 16*a* is a schematic cross sectional side view of a modified version of the embodiment of FIGS. 15*a* and 15*b*.
Figure 16B:
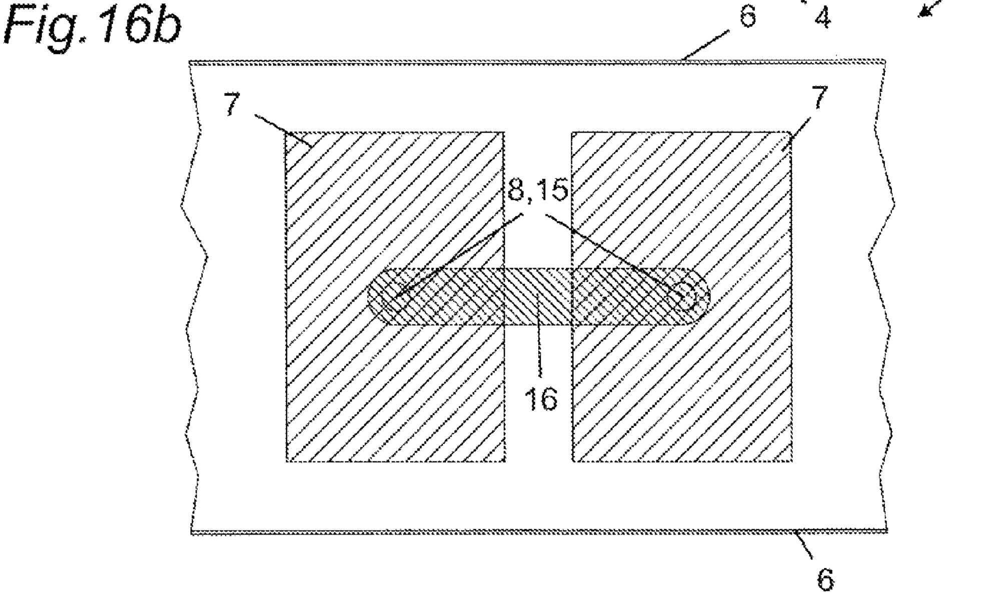
FIG. 16*b* is a schematic top view of the resonator device of FIG. 16*a*.
Figure 17A:
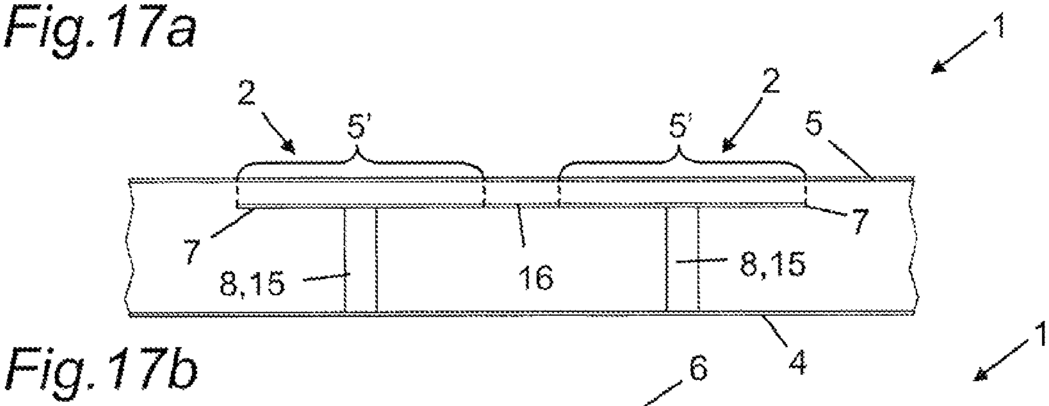
FIG. 17*a* is a schematic cross sectional side view of a modified version of the embodiment of FIGS. 16*a* and 16*b*.
Figure 17B:
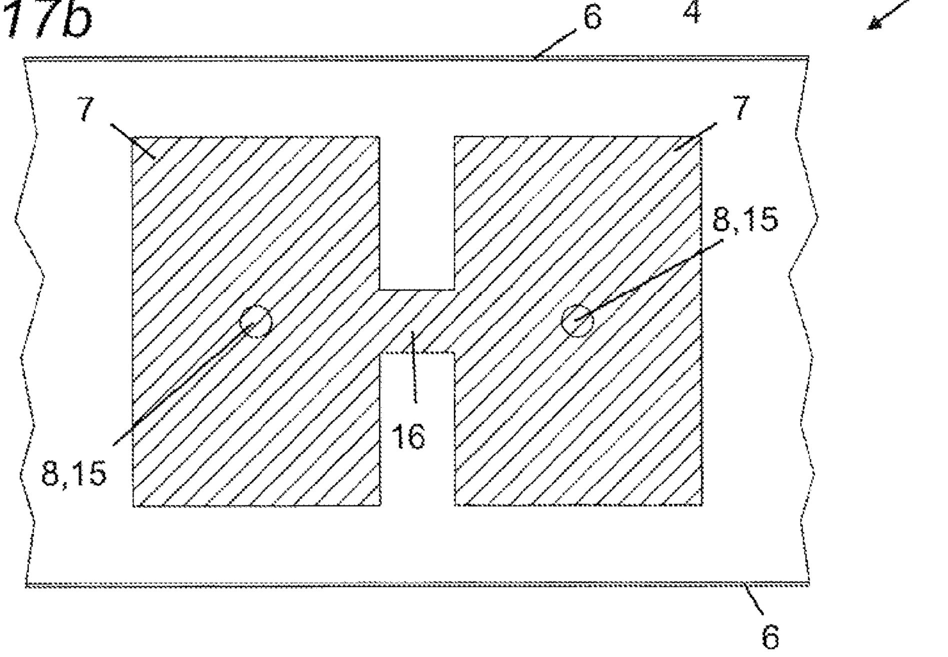
FIG. 17*b* is a schematic top view of the resonator device of FIG. 17*a*.
Figure 18A:
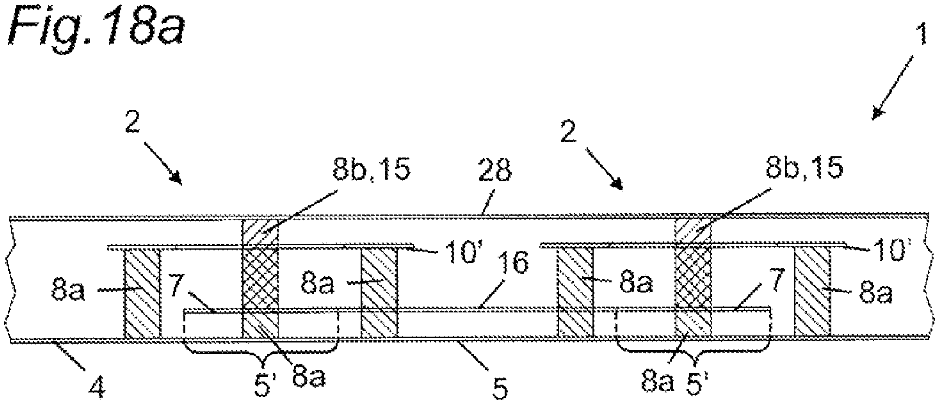
FIG. 18*a* is a schematic cross sectional side view of a further embodiment of a resonator device comprising two of the resonators shown in FIGS. 5*a* and 5*b* coupled inductively.
Figure 18B:
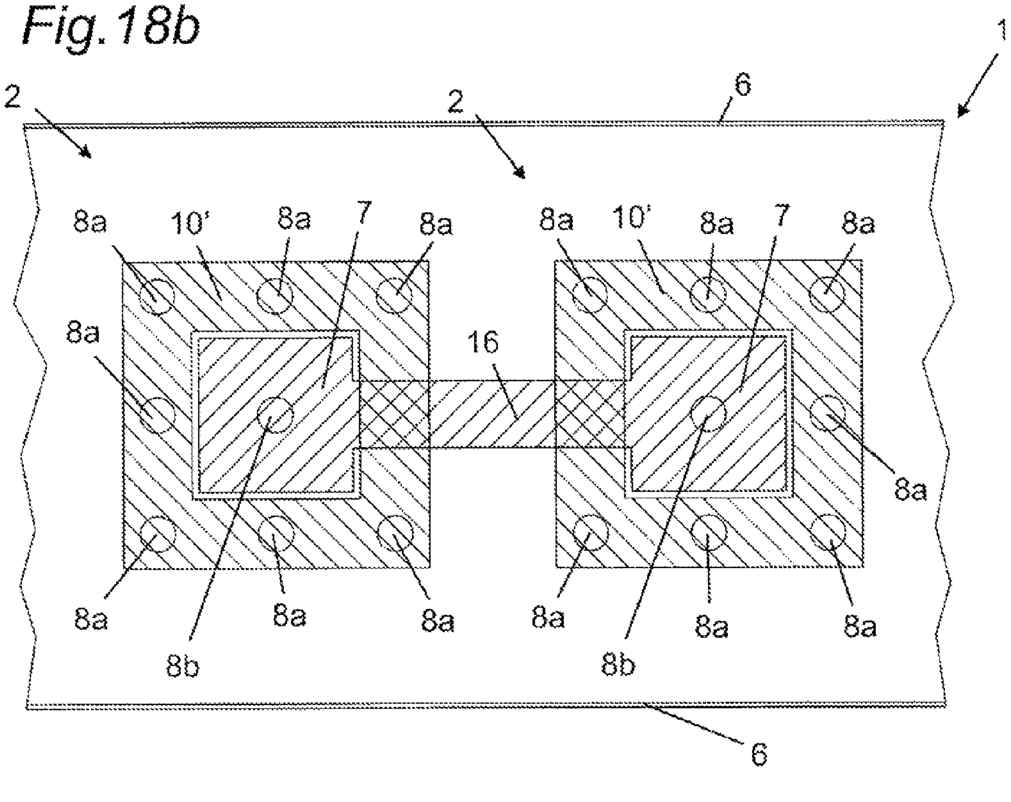
FIG. 18*b* is a schematic top view of the resonator device of FIG. 18*a*.

A further possibility to increase the inductive coupling between two resonators 2 is the provision of a coupling loop between the two resonators 2. As shown in FIGS. 15*a* and 15*b*, such coupling loop may consist of two separate additional via holes 15 that extend from the short-circuit electrode layer 4, but not to the first capacitor electrode layer 5. These two via holes 15 extending spaced from each other and in parallel into the stacking direction, and their ends opposite the short-circuit electrode layer 4 are electrically interconnected by an additional electrically conductive interconnection layer 16 provided on a surface portion of one of the dielectric layers. In a modified version depicted in FIGS. 16*a* and 16*b* the two via holes 15 of the coupling loop are formed by portions of the via holes 8 of the first electrical connections or inner conductors of the two resonators 2. In this manner the inductive coupling can be further increased. In order to achieve an even further increase, the entire via holes 8 could be utilized as via holes 15 of a coupling loop, wherein the two second capacitor electrode layers 7 are electrically interconnected by the interconnection layer 16 of the coupling loop. Such an arrangement is shown in FIGS. 17*a* and 17*b*. A similar arrangement may also be used for coupling two adjacent resonators 2 of the type described above with reference to FIGS. 5*a* and 5*b*. A corresponding resonator device 1 is shown in FIGS. 18*a* and 18*b*. It should be noted that in this embodiment the interconnection layer 16 bypasses part of the folded first electrical connection or inner conductor.

Figure 19A:
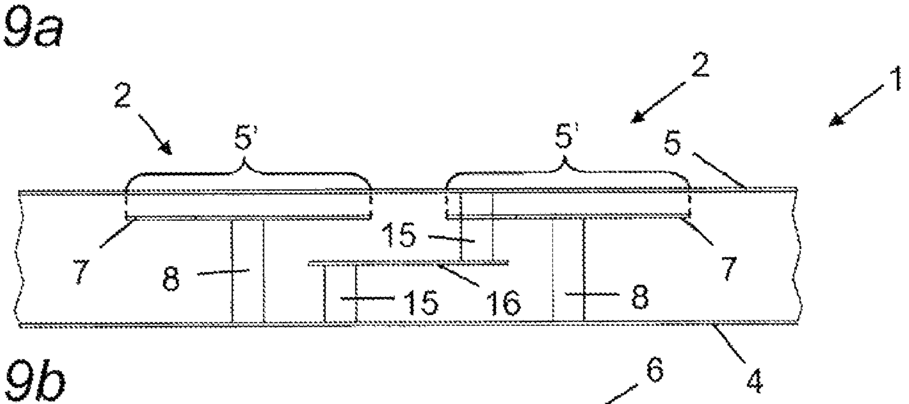
FIG. 19*a* is a schematic cross sectional side view of a further modified version of the embodiment of FIGS. 15*a* and 15*b*.
Figure 19B:
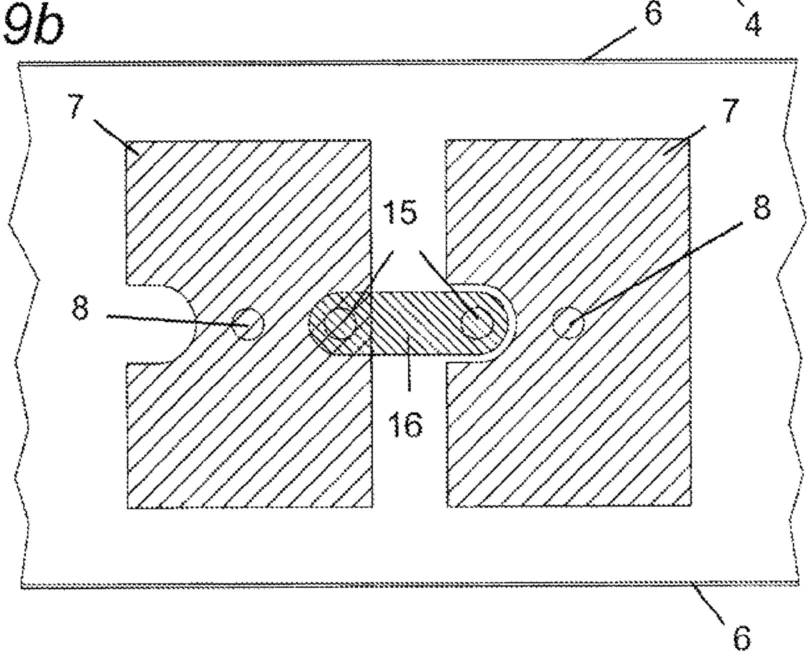
FIG. 19*b* is a schematic top view of the resonator device of FIG. 19*a*.
Figure 20A:
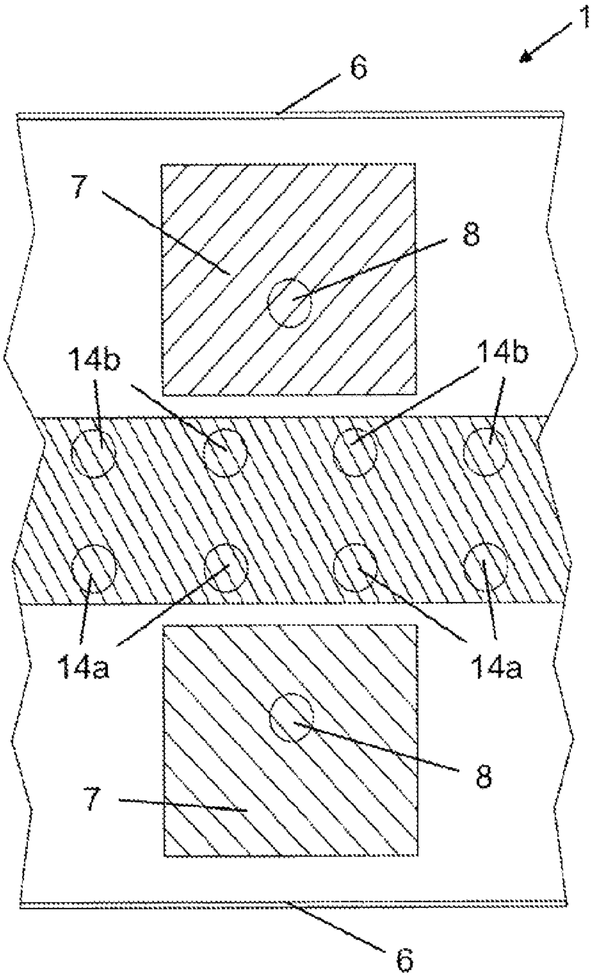
FIG. 20*a* is a schematic top view of an embodiment of a resonator device similar to the embodiment shown in FIGS. 14*a* and 14*b*, wherein the via holes disposed between the two adjacent resonators comprise two sections offset from each other.
Figure 20B:
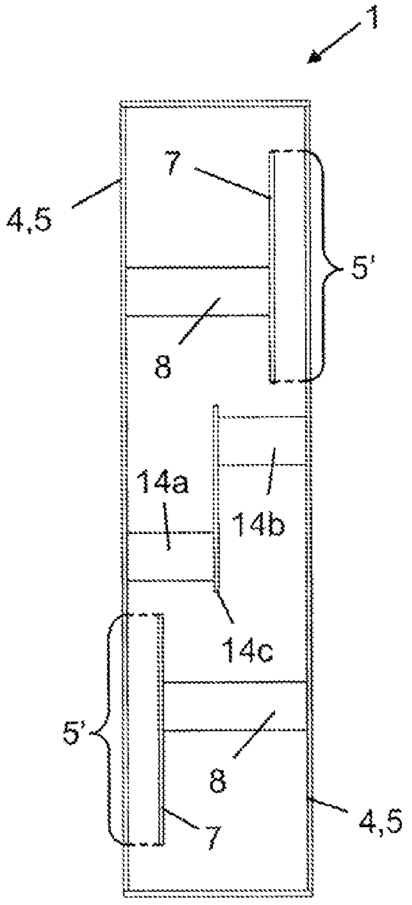
FIG. 20*b* is a schematic cross sectional side view of the resonator device of FIG. 20*a*.

Further, as shown in FIGS. 19*a* and 19*b*, the overall coupling value may be decreased by arranging the coupling loop such that one via hole 15 extends from the interconnection layer 16 to the first capacitor electrode layer 5 resulting in a change of the sign of the corresponding inductive coupling. It has to be noted that because the coupling loop 15, 16 also forms part of the second electrical connection or outer conductor of the coaxial transmission lines of the two resonators and because the two via holes 15 have a different distance from each of the two via holes 8, the transmission lines have a stepped impedance much like the resonator 2 of the resonator device 1 shown in FIGS. 3*a* to 3*c*. In FIGS. 3*a* to 3*c*, this effect is achieved by providing two via holes 8*a*, 8*b* of the first electrical connection at different distances from the elements of the second electrical connection, whereas in FIGS. 19*a* and 19*b* this effect is achieved in the opposite manner. In a similar manner, the same effect may also be realized when using one or more additional via holes 14 extending from the short-circuit electrode layer 4 to the first capacitor electrode layer 5 and provided between two resonators 2 in order to influence or adjust the inductive coupling between two resonators 2 as in the embodiment of FIGS. 14*a* and 14*b*. In this case, which is shown in FIGS. 20*a* and 20*b*, the via holes 14 are constructed similar to the element 15, 16 of FIGS. 19*a* and 19*b* with a via hole 14*a*, a via hole 14*b* and a common interconnection layer 14*c*. Further, in this embodiment an inter-digital arrangement of the two resonators 2 is implemented for enhanced compactness. Such an inter-digital arrangement will be described below with reference to FIGS. 23*a* and 23*b*.

Figure 21A:
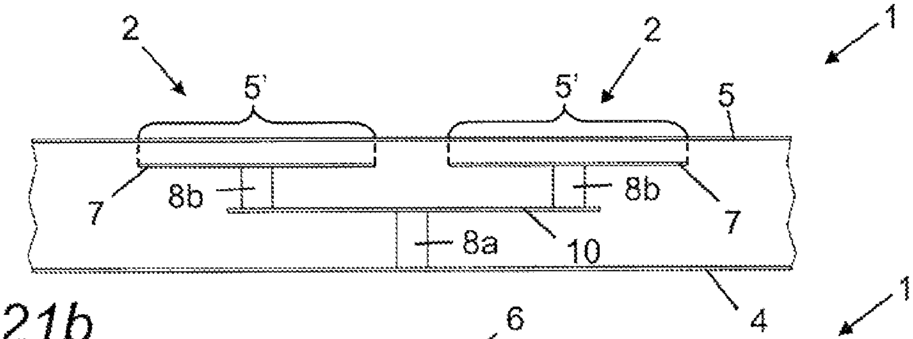
FIG. 21*a* is a schematic cross sectional side view of a further embodiment of a resonator device comprising two adjacent resonators that are coupled inductively, wherein the first electrical connections of the two resonators comprise a common via hole.
Figure 21B:
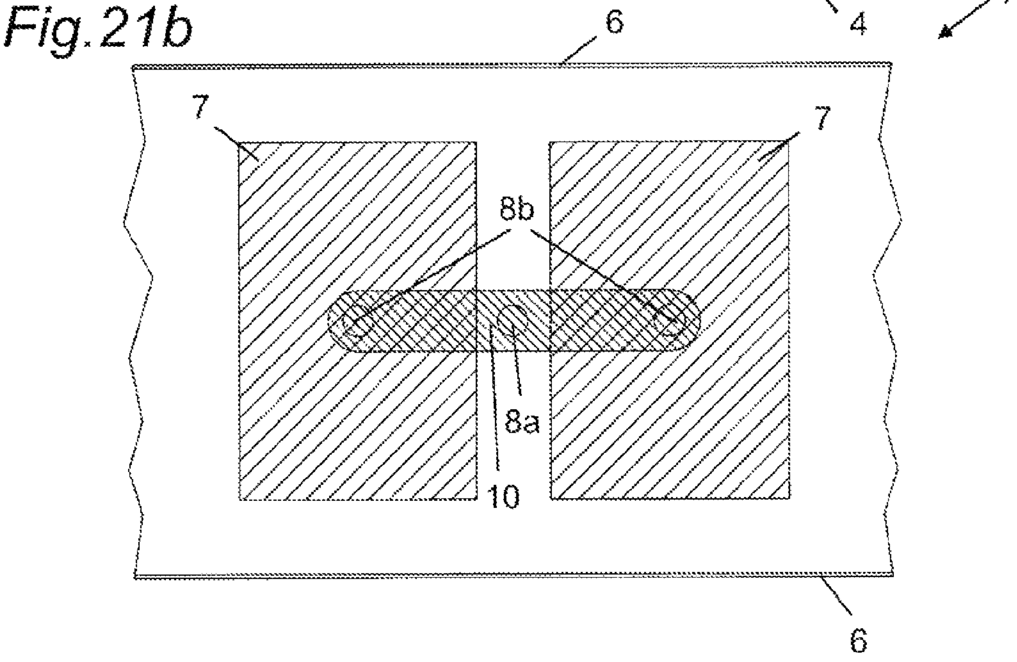
FIG. 21*b* is a schematic top view of the resonator device of FIG. 21*a*.

As shown in FIGS. 21*a* and 21*b*, an increase in inductive coupling between two resonators 2 can also be achieved by combining parts of the via holes 8 of the first electrical connections or the two resonators 2. The resulting configuration is identical to the single resonator configuration shown in FIGS. 6*a* and 6*b* with the difference that two separate second capacitor electrode layers 7 are provided for the two resonators 2.

Figure 22A:
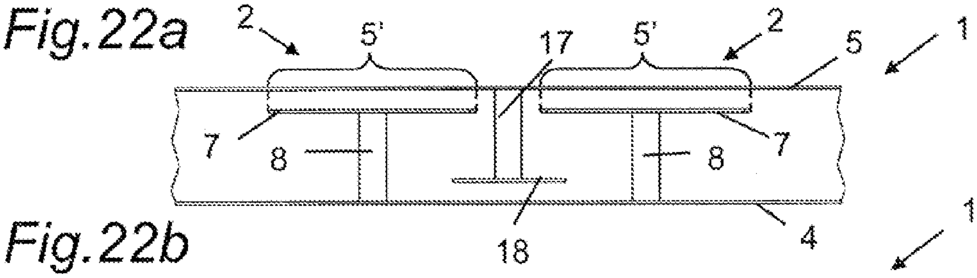
FIG. 22*a* is a schematic cross sectional side view of a further embodiment of a resonator device comprising two adjacent resonators that are coupled inductively, wherein a coupling adjusting element is disposed between the two resonators.
Figure 22B:
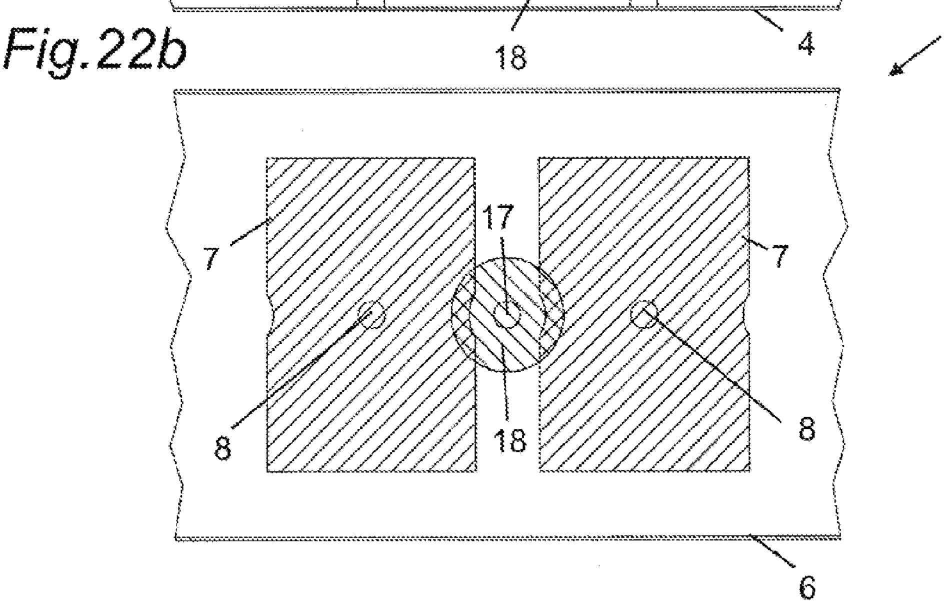
FIG. 22*b* is a schematic top view of the resonator device of FIG. 22*a*.
Figure 23A:
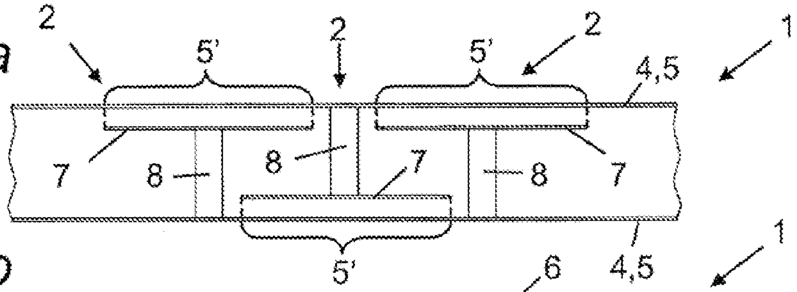
FIG. 23*a* is a schematic cross sectional side view of an embodiment of a resonator device comprising three adjacent resonators that are coupled inductively and are arranged linearly in an inter-digital configuration.
Figure 23B:
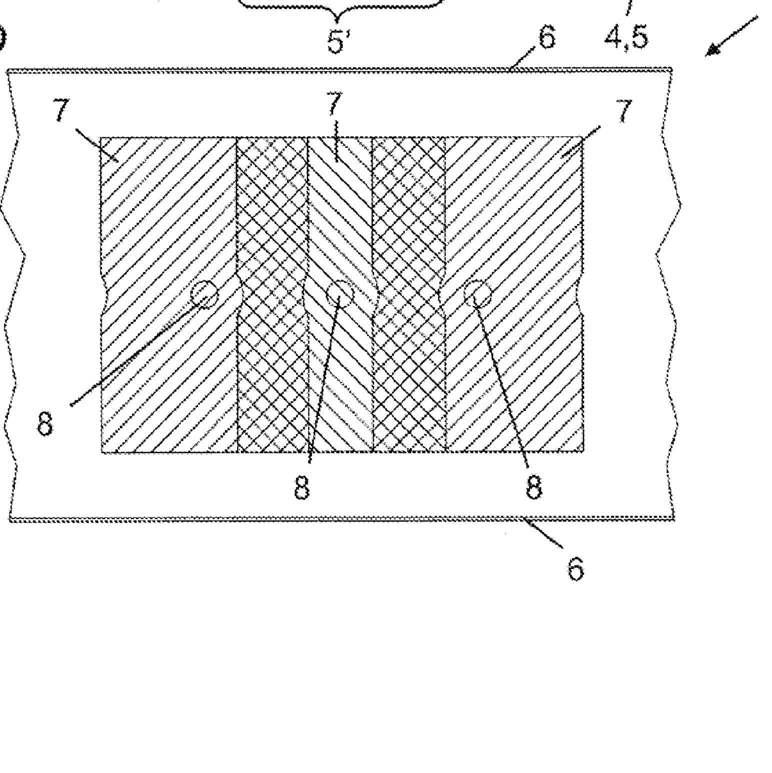
FIG. 23*b* is a schematic top view of the resonator device of FIG. 23*a*.

Another possibility of influencing inductive coupling between two resonators 2 is shown in FIGS. 22*a* and 22*b*. Between the two resonators 2 an adjustment element is provided that is similar to tuning screws known in the field of air cavity resonators. This adjustment element comprises a via hole 17 extending from the first capacitor electrode layer 5 in the stacking direction to a layer 18 of conductive material that is disposed on a surface portion of one of the dielectric layers parallel to and in spaced relationship from the short-circuit electrode layer 4. This element 17, 18 serves to increase the inductive coupling. It should be noted that an increase of the surface area of the conductive layer 18 changes the inductive coupling, and at some point results in the element 17, 18 beginning to resonate. In this case, the element 17, 18 constitutes a third resonator 2 for which the roles of the layers 4 and 5 are interchanged. This arrangement shown in FIGS. 23*a* and 23*b* is an inter-digital arrangement of three vertical resonators. In order to indicate the different roles of the two layers 4 and 5 with respect to the different resonators, the layers are designated as "4, 5", wherein it is understood that the layer 4, 5 shown at the lower end in FIG. 23*a* is the short-circuit electrode layer 4 for the two outermost resonators and the first capacitor electrode layer 5 for the central resonator, and that the layer 4, 5 shown at the upper end in FIG. 23*a* is the short-circuit electrode layer 4 for the central resonator and the first capacitor electrode layer 5 for the two outermost resonators.

Figure 24A:
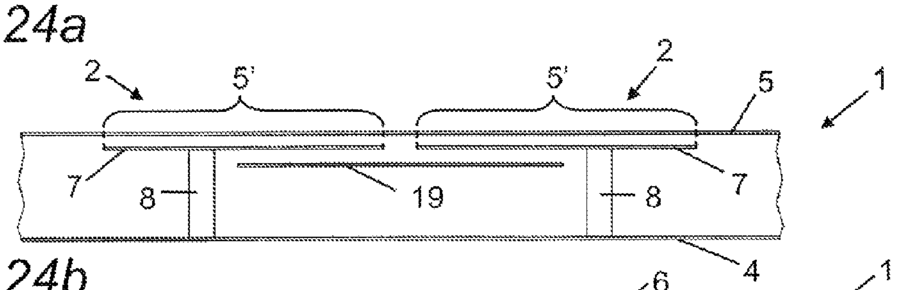
FIG. 24*a* is a schematic cross sectional side view of an embodiment of a resonator device comprising two adjacent resonators that are coupled capacitively.
Figure 24B:
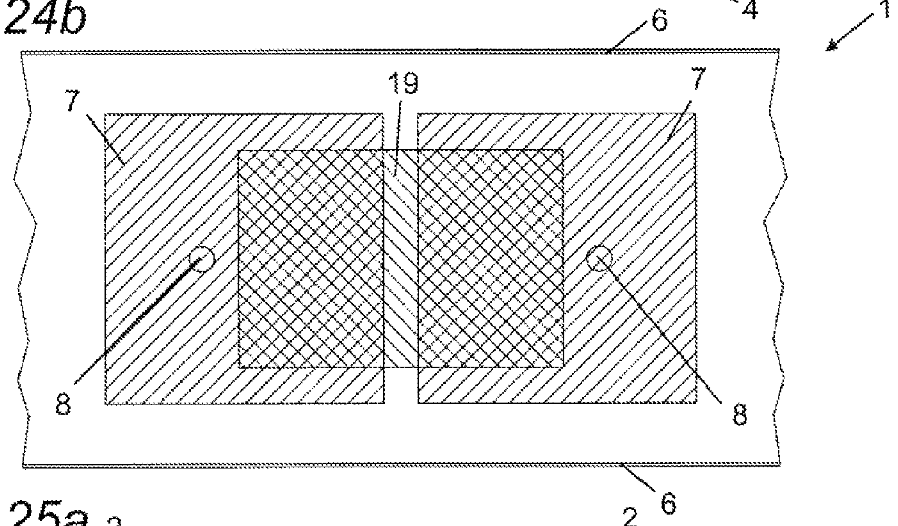
FIG. 24*b* is a schematic top view of the resonator device of FIG. 24*a*.
Figure 25A:
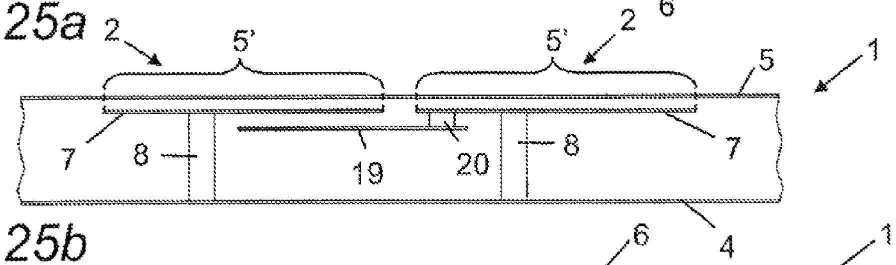
FIG. 25*a* is a schematic cross sectional side view of a modified version of the resonator device of FIGS. 24*a* and 24*b*.
Figure 25B:
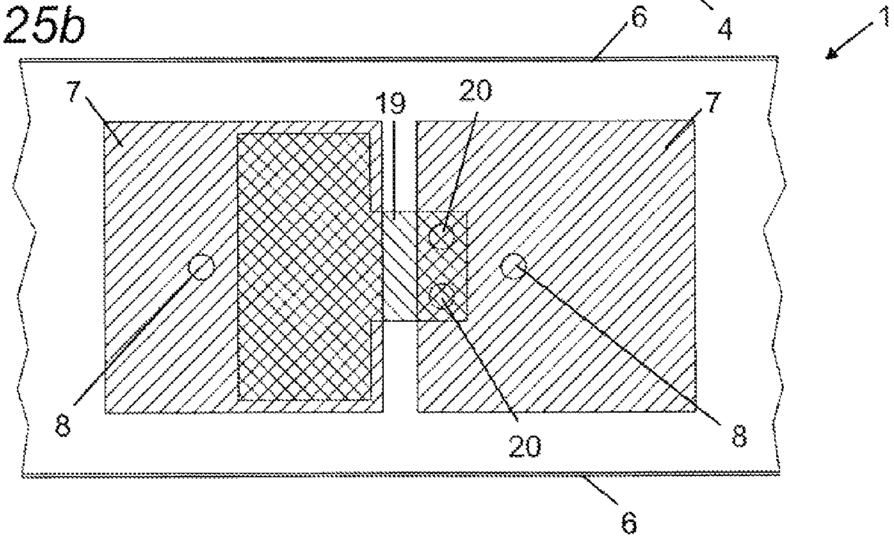
FIG. 25*b* is a schematic top view of the resonator device of FIG. 25*a*.

It is also possible to couple two adjacent resonators 2 capacitively. As shown in FIGS. 24*a* and 24*b*, this may be achieved by providing an electrically conductive coupling capacitor layer 19 below and overlapping with part of the second capacitor electrode layers 7 of the two resonators 2. The overlapping regions of the layer 19 and the respective portions of the two second capacitor electrode layers 7 form two parallel plate coupling capacitors. Due to them being connected in series, if the two coupling capacitors have equal capacitance the total coupling capacitor has only half the capacitance. Therefore, an alternative arrangement is shown in FIGS. 25*a* and 25*b*, the layer 19 is shaped such that essentially only one coupling capacitor is formed in cooperation with the second capacitor electrode layers 7, and this coupling capacitor is short-circuited by a via hole 20 to the capacitor of the other resonator 2. Nevertheless, the arrangement of FIGS. 25*a* and 25*b* has two advantages with respect to manufacturing tolerances.

Firstly, if the height or the size of the area of two parallel plate coupling capacitors varies, the effect of this variation only contributes half to the total coupling capacitor. Secondly, if both coupling capacitors are intended to have the same capacitance, an alignment error of layer 19 in the direction of extension of the dielectric sheets, leading to a change in capacitance by $+\Delta C$ and $-\Delta C$, respectively, will only have a minor influence, because the total capacitance is given by $\frac{1}{2}\times C\times[1-(\Delta C/C)^2]$, i.e. the linear terms of the deviations $\Delta C/C$ cancel out each other.

Figure 26A:
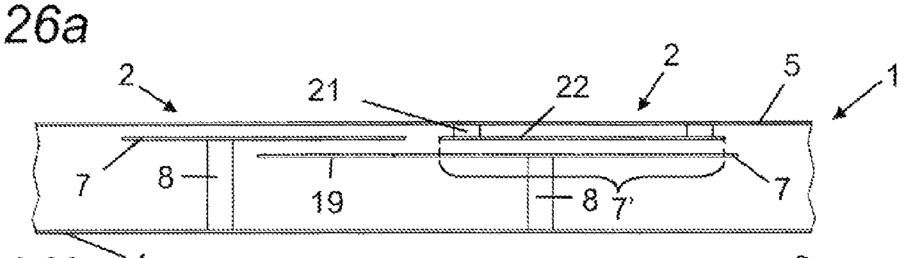
FIG. 26*a* is a schematic cross sectional side view of a further modified version of the resonator device of FIGS. 25*a* and 25*b*.
Figure 26B:
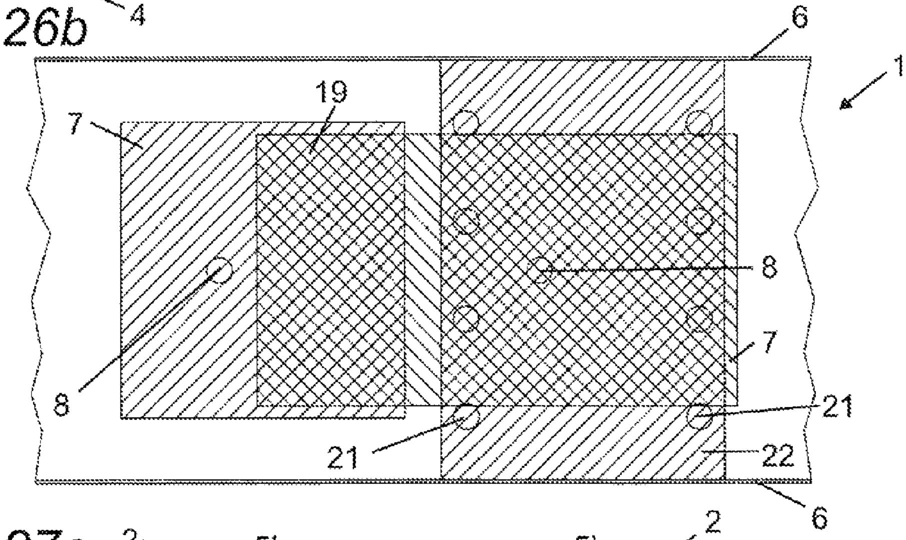
FIG. 26*b* is a schematic top view of the resonator device of FIG. 26*a*.

In FIGS. 26*a* and 26*b* a modification of the embodiment shown in FIGS. 25*a* and 25*b* is shown. In this case, the via hole 20 is left out, and the layer 19 is directly connected to or forms part of the second capacitor electrode layer 7 of one of the two resonators 2. Thus, the two capacitor electrode layers 7 have to be disposed at different positions in the stacking direction. In order to minimize the size of the capacitor of the resonator 2 bearing the layer 19, an additional ground plane 22 is introduced that is disposed between the first capacitor electrode layer 5 and the respective second capacitor electrode layer 7 and that is connected via a plurality of via holes 21 to the first capacitor electrode layer 5 and, optionally, to the side layers 6. It is noted that in this case, the first capacitor electrode is constituted by the layer 22 and the second capacitor electrode is constituted by the portion 7' of layer 7 overlapping with layer 22.

Figure 27A:
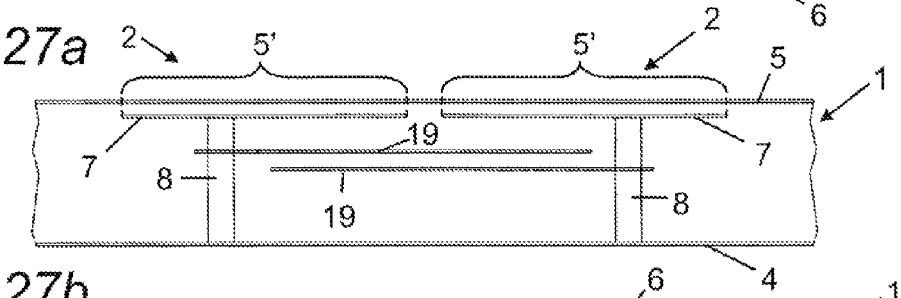
FIG. 27*a* is a schematic cross sectional side view of a further modified version of the resonator device of FIGS. 25*a* and 25*b*.
Figure 27B:
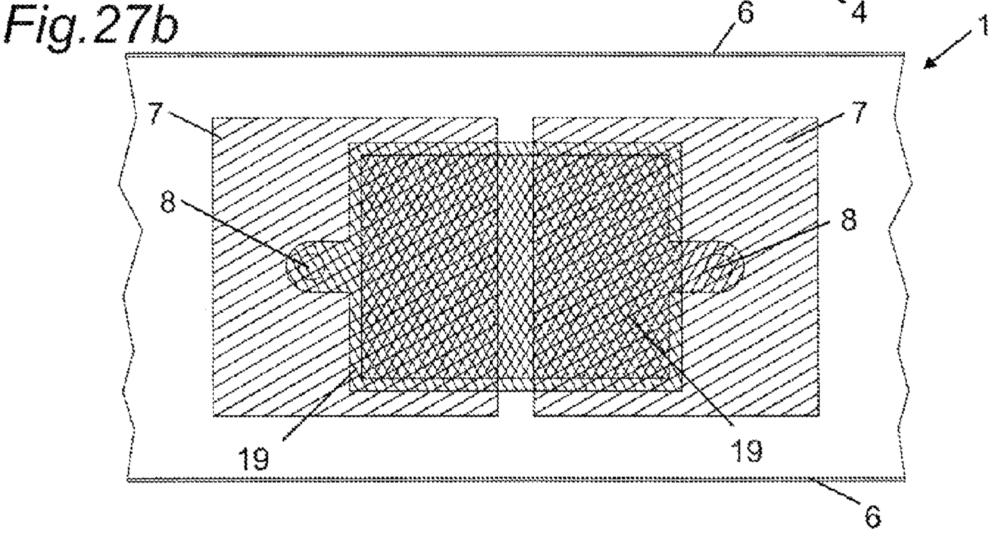
FIG. 27*b* is a schematic top view of the resonator device of FIG. 27*a*.

Capacitive coupling by a single coupling capacitor may also be achieved by providing two separate coupling capacitor layers 19 in spaced relationship in the stacking direction and in partially overlapping relationship and by electrically connecting each of these two layers 19 to a different one of the via holes 8 of the two resonators. In an advantageous version shown in FIGS. 27*a* and 27*b*, the two layers 19 have different size to minimize the change of the coupling capacitor value due to misalignments of the corresponding layers 19.

Figure 28A:
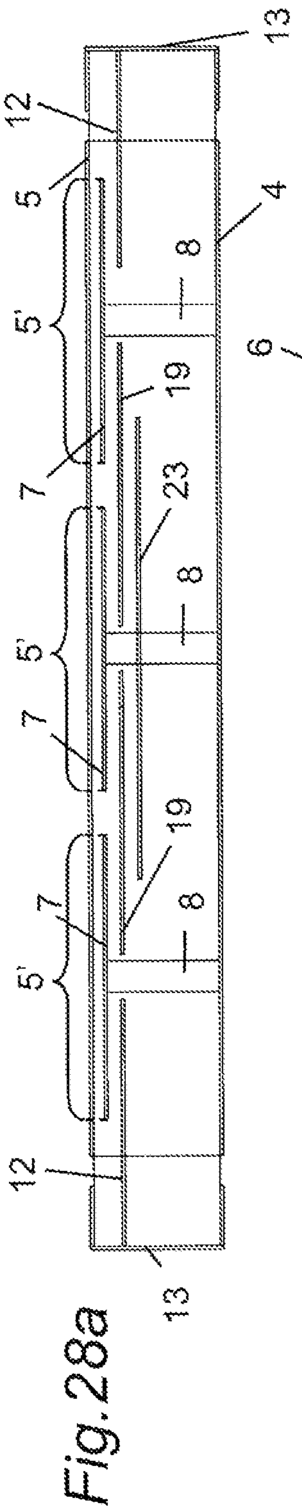
FIG. 28*a* is a schematic cross sectional side view of a further embodiment of a resonator device similar to the embodiment shown in FIGS. 24*a* and 24*b*, but comprising three adjacent resonators that are coupled capacitively and are arranged in a linear configuration.
Figure 28B:
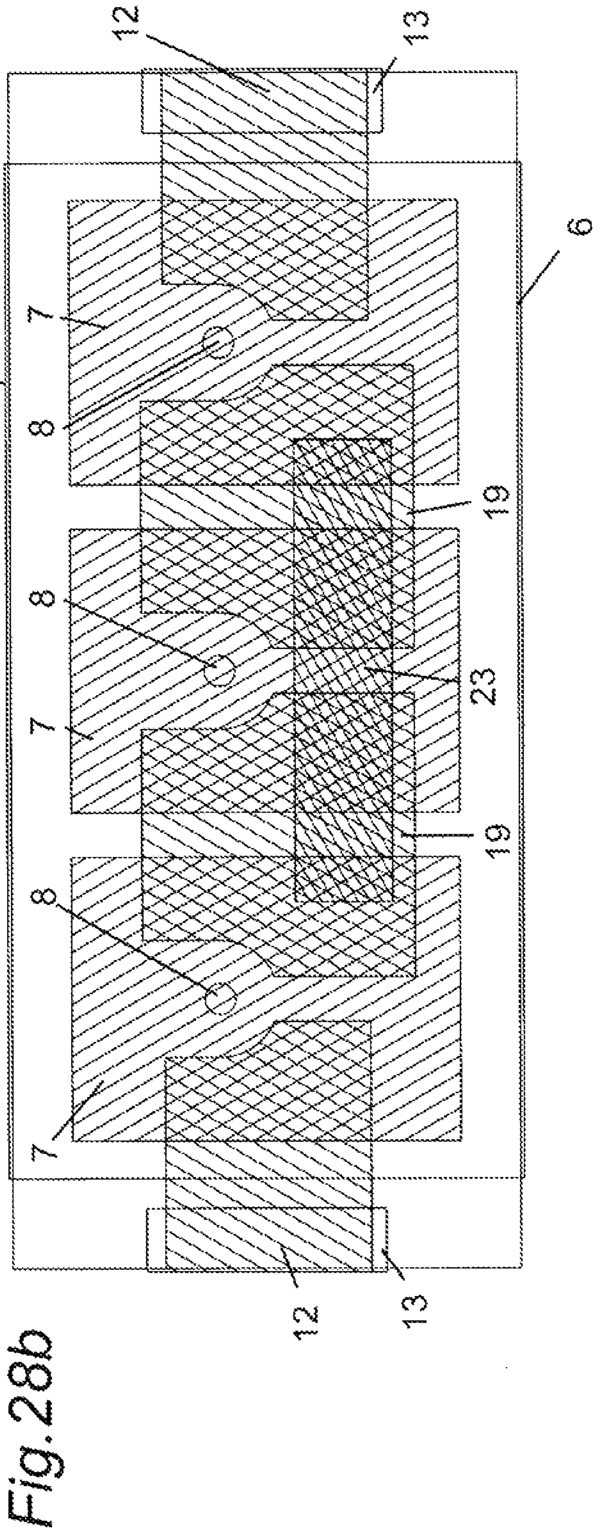
FIG. 28*b* is a schematic top view of the resonator device of FIG. 28*a*.
Figure 29:
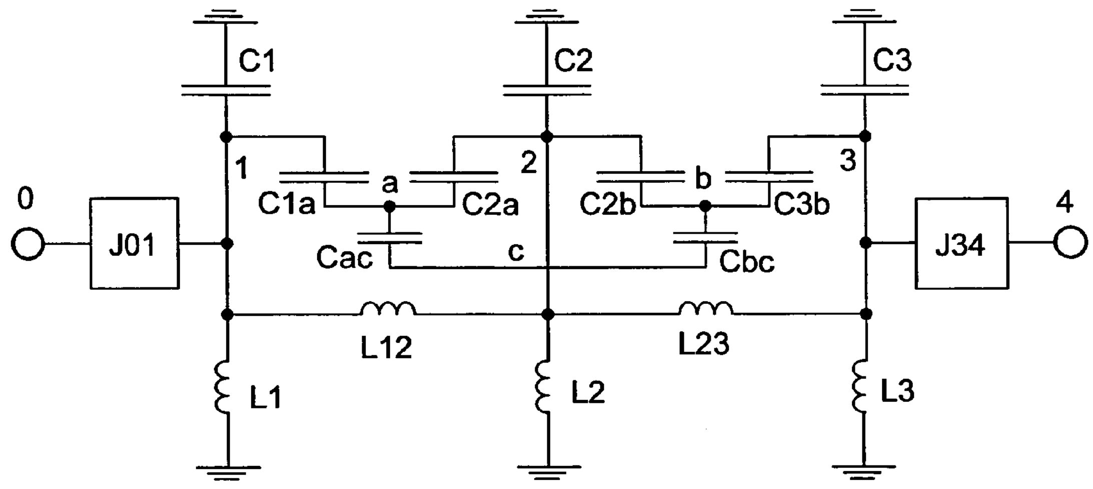
FIG. 29 is a schematic equivalent circuit diagram of the resonator device shown in FIGS. 28*a* and 28*b*.

FIGS. 28*a* and 28*b* show a version in which three of the resonators 2 of FIGS. 1*a* to 1*c* are arranged along a straight line and coupled capacitively using the approach described above with reference to FIGS. 24*a* and 24*b* in order to form a three pole band pass filter. Similar to FIGS. 12*a* and 12*b*, FIGS. 28*a* and 28*b* show direct capacitive coupling of the two outer resonators 2 to a respective input/output coupling side electrode 13 by an input/output coupling capacitor layer 12 of the respective second capacitor electrode layer 7. While the contact pads for the ports may be realized in any conventional manner, in FIGS. 28*a* and 28*b* the contact pads are realized at the side walls. Adjacent resonators 2 are capacitively coupled by a corresponding coupling capacitor layer 19. Further, capacitive cross coupling between the two outer resonators 2 is achieved by an additional cross coupling capacitor layer 23 provided below, spaced from and partially overlapping the two layers 19. An equivalent circuit diagram of this filter is depicted in FIG. 29. It can be calculated that the parallel plate coupling capacitors have to be roughly eight times larger than the required cross coupling capacitor. Since the cross coupling value usually is small, this might be regarded as an advantage to achieve more accurate values.

Figure 30A:
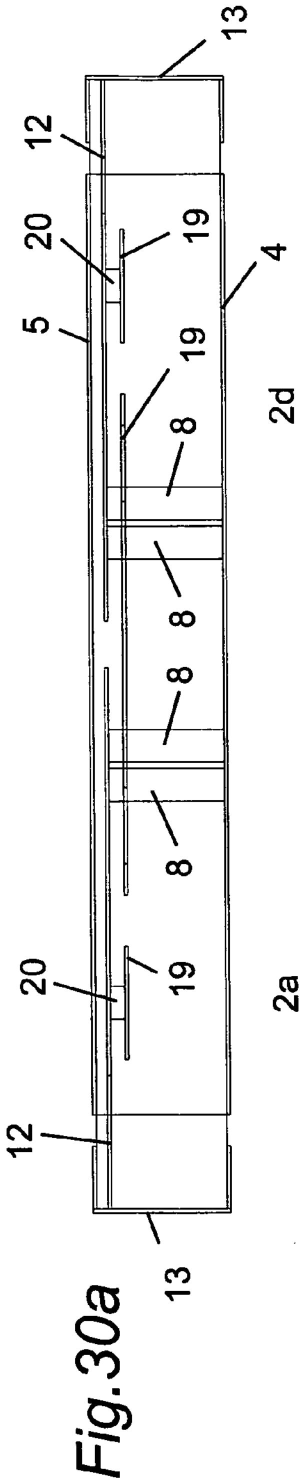
FIG. 30*a* is a schematic cross sectional side view of an embodiment of a resonator device comprising four adjacent resonators that are coupled inductively as well as capacitively and that are arranged non-linearly in a rectangular configuration.
Figure 30B:
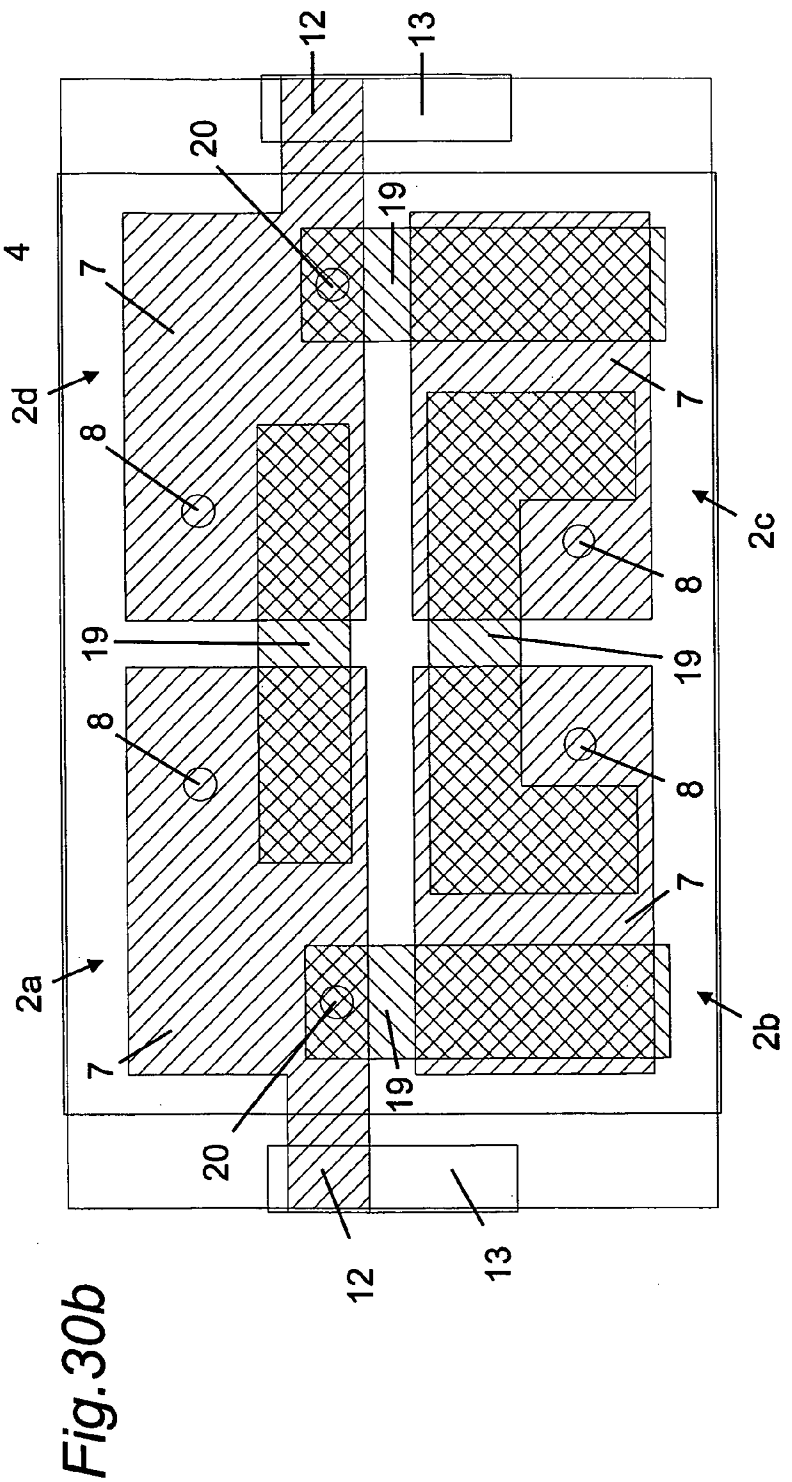
FIG. 30*b* is a schematic top view of the resonator device of FIG. 30*a*.

FIGS. 30*a* and 30*b* show a version in which four of the resonators 2 of FIGS. 1*a* to 1*c* are arranged in a rectangular or substantially square configuration. These resonators 2*a* to 2*d* are coupled capacitively using a combination of the approaches described above with reference to FIGS. 24*a*, 24*b* and 25*a*, 25*b* in order to form a four pole band pass filter. Similar to FIGS. 28*a* and 28*b*, FIGS. 30*a* and 30*b* show direct capacitive coupling of the two outer resonators 2*a* and 2*d* to a respective input/output coupling side electrode 13 by an input/output coupling capacitor layer 12 of the respective second capacitor electrode layer 7. The pairs of, in the regular path, adjacent resonators 2*a*, 2*b* and 2*b*, 2*c* and 2*c*, 2*d* are capacitively coupled by a corresponding coupling capacitor layer 19 alone (compare FIGS. 24*a* and 24*b*) or by a corresponding combination of a via hole 20 and a coupling capacitor layer 19 (compare FIGS. 25*a* and 25*b*). The via holes 8 of the two resonators 2*b* and 2*c* and the via holes 8 of the two resonators 2*a* and 2*d* have a much smaller distance from each other than the via holes 8 of the two resonators 2*a* and 2*b* and the via holes 8 of the two resonators 2*c* and 2*d*. In this manner, there is relatively strong mutual inductive coupling between the two resonators 2*b* and 2*c*, which together with the capacitive coupling creates an additional transmission zero, and between the two resonators 2*a* and 2*d*, for cross coupling. Further, cross coupling is realized by a coupling capacitor layer 19 capacitively coupling the two resonators 2*a* and 2*d*.

The cross coupling could be controlled by capacitive and inductive contributions. For the given example of a cascaded quadruplet arrangement with capacitive main couplings, the inductive cross coupling would create two transmission zeros, one below and one above the pass band. Due to the additional capacitive contribution to the cross coupling, it is possible to suppress the transmission zero above the pass band.

Figure 31:
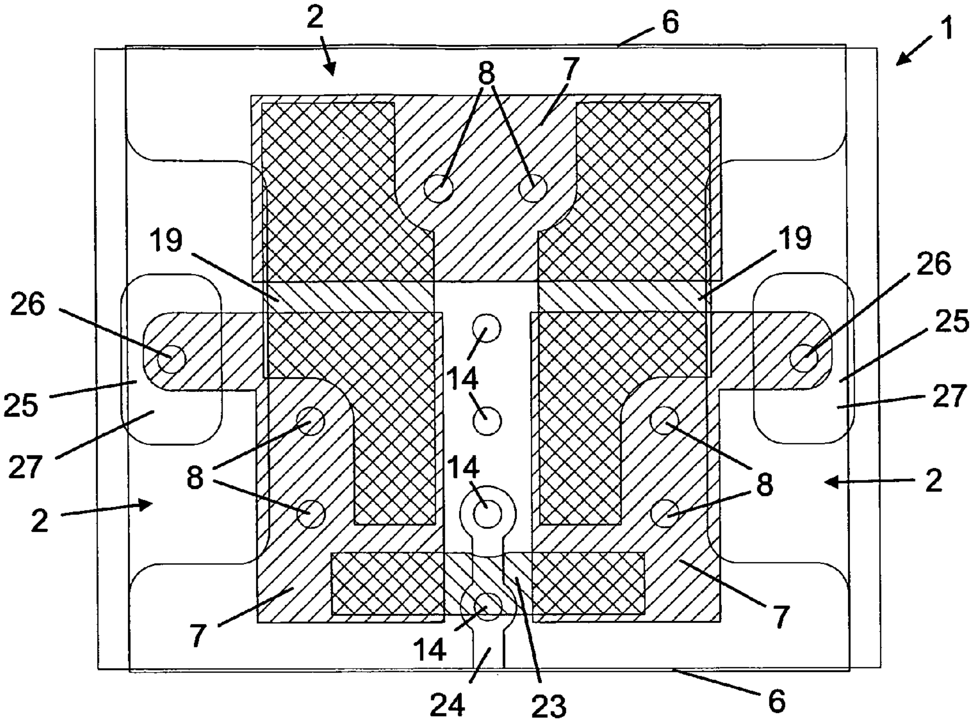
FIG. 31 is a schematic top view of an embodiment of a resonator device comprising a cascaded triplet of three capacitively coupled resonators arranged in a triangular configuration.
Figure 32:
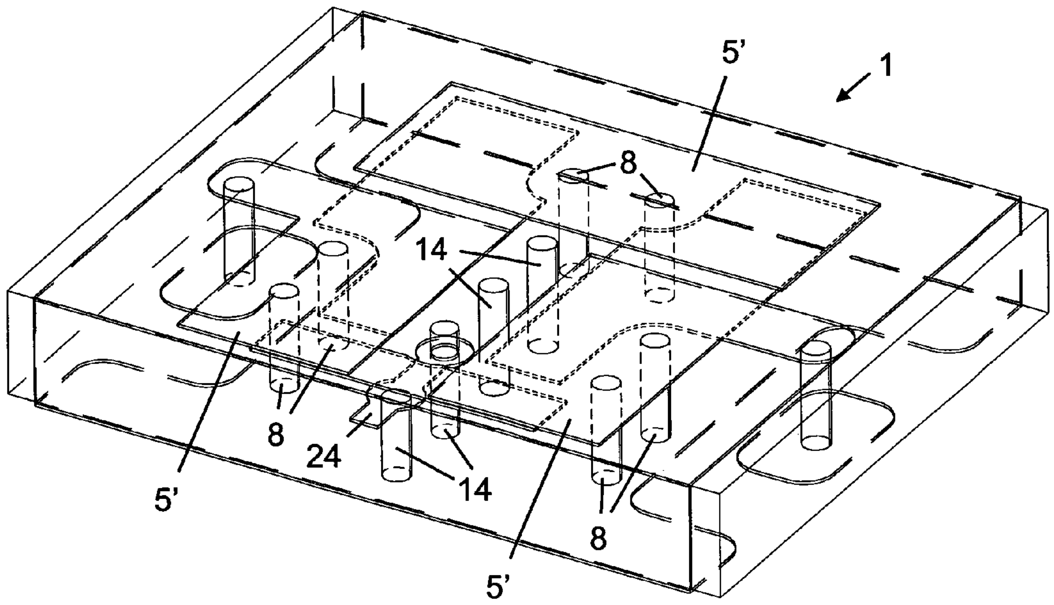
FIG. 32 is a schematic elevational view of the resonator device of FIG. 31.
Figure 33:
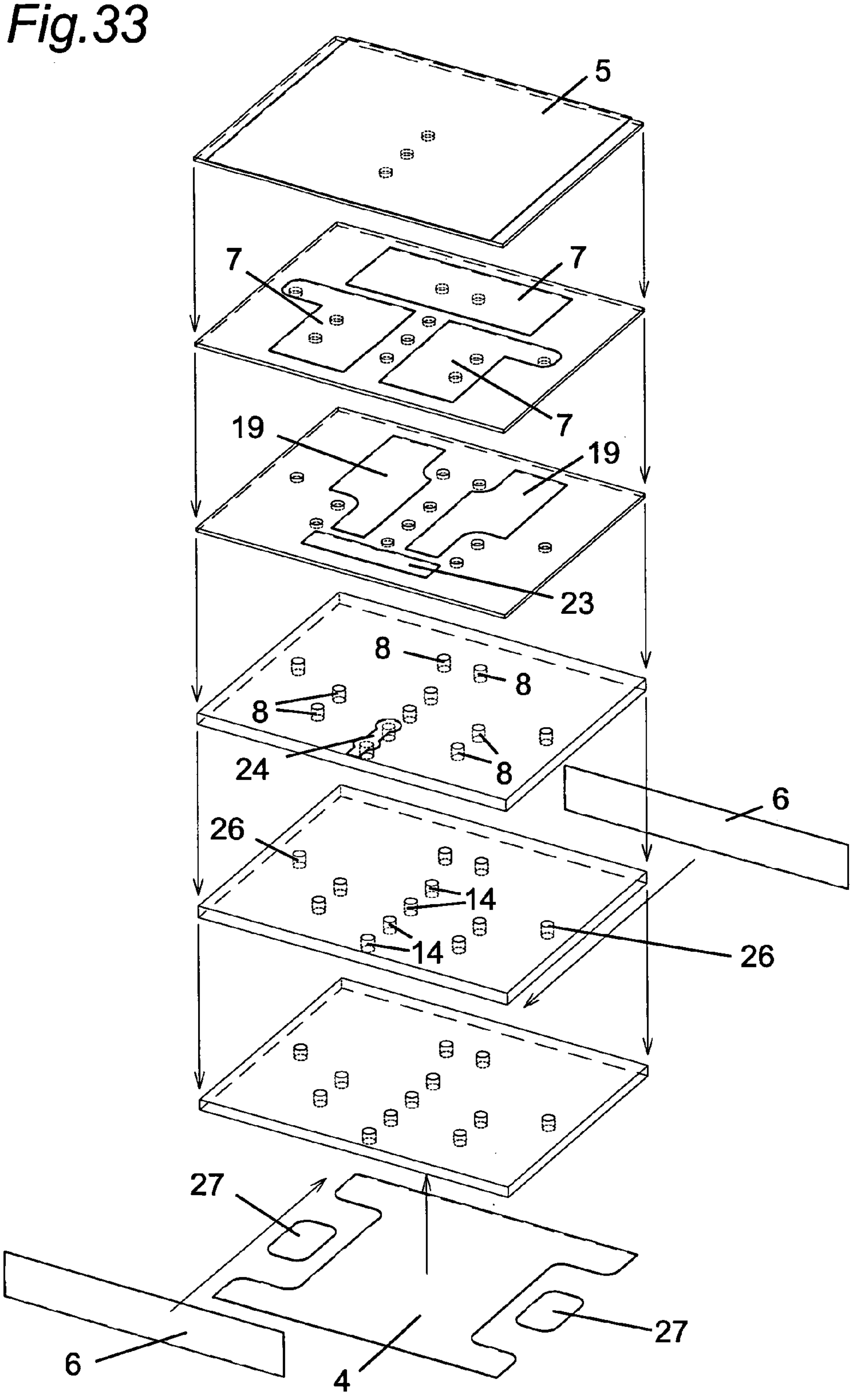
FIG. 33 is a schematic exploded view of the resonator device of FIGS. 31 and 32.

FIGS. 31 to 33 show a further embodiment of a band pass filter having a cascaded triplet of three capacitively coupled resonators 2. FIG. 31 shows the filter in top view, FIG. 32 shows a schematic three dimensional view, and FIG. 33 shows the filter in exploded view. As can be taken from FIG. 31, the three resonators 2 each have two via holes 8 and are arranged in a triangular configuration. The two resonators which are shown leftmost and rightmost in FIG. 31 are coupled with an inductive input/output coupling arrangement 25 that comprises a via hole 26 extending from the second capacitor electrode layer 7 of the respective resonator to a contact pad 27 provided on the bottom surface of the resonator device 1. These two resonators 2 are each coupled capacitively separately by an electrically conductive coupling capacitor layer 19 to the resonator 2 shown at the top end of FIG. 31 and inductively to this resonator 2 by the narrow distances between the via holes 8 of the adjacent resonators 2. Further, capacitive cross coupling between the two resonators 2 coupled to the input/output coupling arrangement 25 is provided for by an electrically conductive cross coupling capacitor layer 23. In order to suppress or at least reduce inductive cross coupling between these two resonators 2, four via holes 14 extending from the short-circuit electrode layer 4 to the first capacitor electrode layer 5 are arranged between the two resonators 2. An additional electrically conductive layer 24 is provided inside the laminate in order to ground the via hole 14 that has to terminate below the cross coupling capacitor layer 23.

As can be seen in FIG. 33, this filter comprises six dielectric layers that are laminated together after through holes have been laser drilled or punched and plated with conductive material in order to provide for the various via holes in the laminated state. The various electrically conductive layers are printed on the appropriate surface portions of the dielectric layers prior to or subsequent to lamination, depending on whether the electrically conductive layer is to be disposed inside the laminate or on its outside. The electrically conductive layers of all embodiments of this invention may advantageously be produced in this manner.

It should be noted that, in principle, the three lowermost dielectric layers in FIG. 33 could be combined into one layer since there is no conductor printed on top of two lowermost dielectric layers. This could serve to avoid alignment errors between the through holes in the individual layers resulting in a possible degradation of the performance of the respective resonator. However, the thickness of the dielectric layers is limited in case it is desired to utilize the advantageous laser drilling method for producing the various through holes.

Advantageously, the three (cross) coupling capacitor layers 19, 23 are arranged on the same surface of the same dielectric layer. In case of a similar arrangement using the prior art horizontally extending strip-line laminated type resonators, the coupling layers and the strip-lines would have to be placed on different layers leading to stronger detuning due to misalignments of the layers.

Figure 34A:
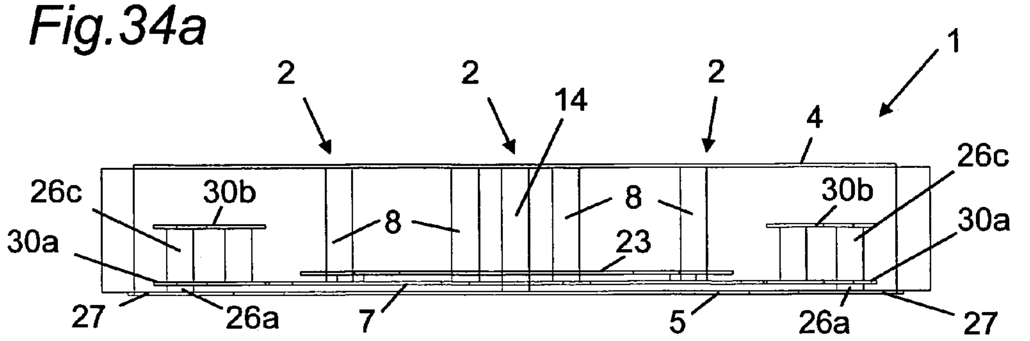
FIG. 34*a* is a schematic cross sectional side view of a further embodiment of a resonator device comprising three adjacent resonators that are coupled inductively as well as capacitively and are arranged in a triangular configuration similar to the embodiment shown in FIGS. 31 to 33.
Figure 34B:
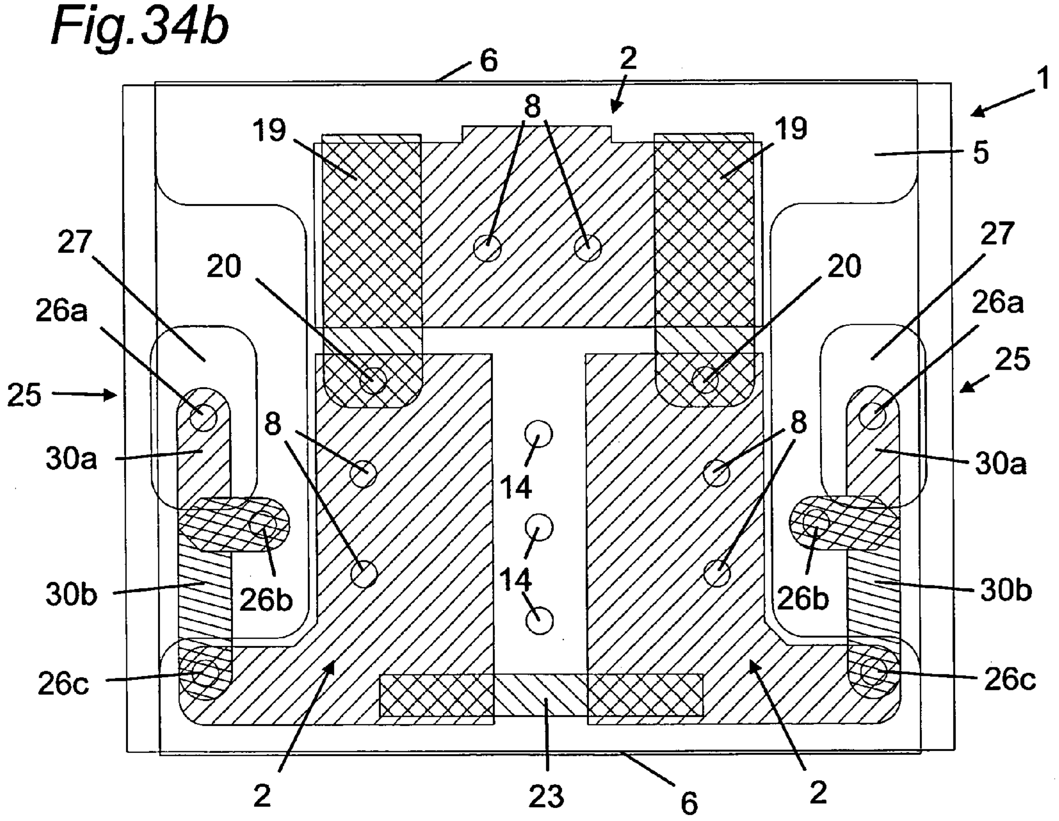
FIG. 34*b* is a schematic top view of the resonator device of FIG. 34*a*.
Figure 35:
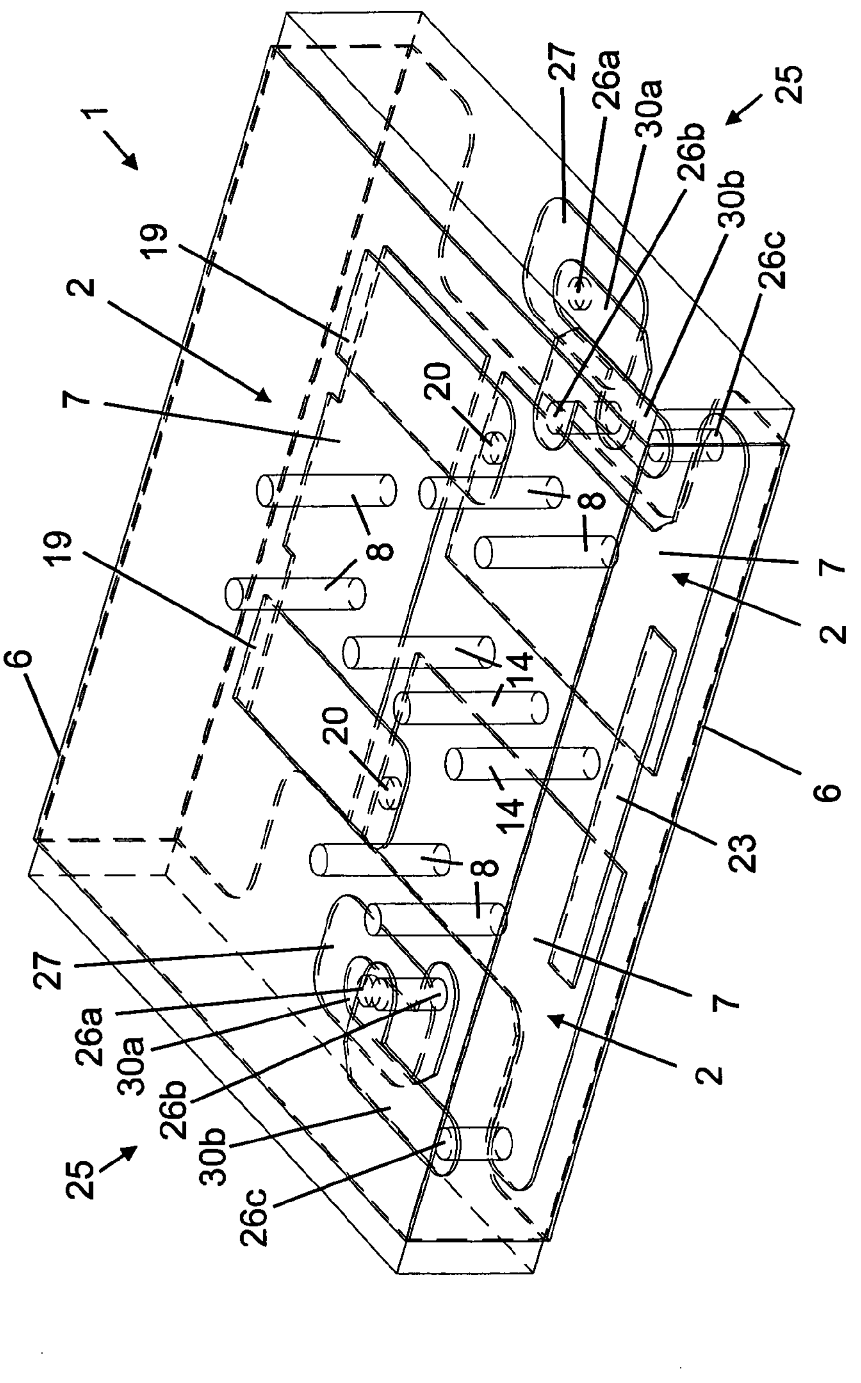
FIG. 35 is a schematic elevational view of the resonator device of FIGS. 34*a* and 34*b*.
Figure 36:
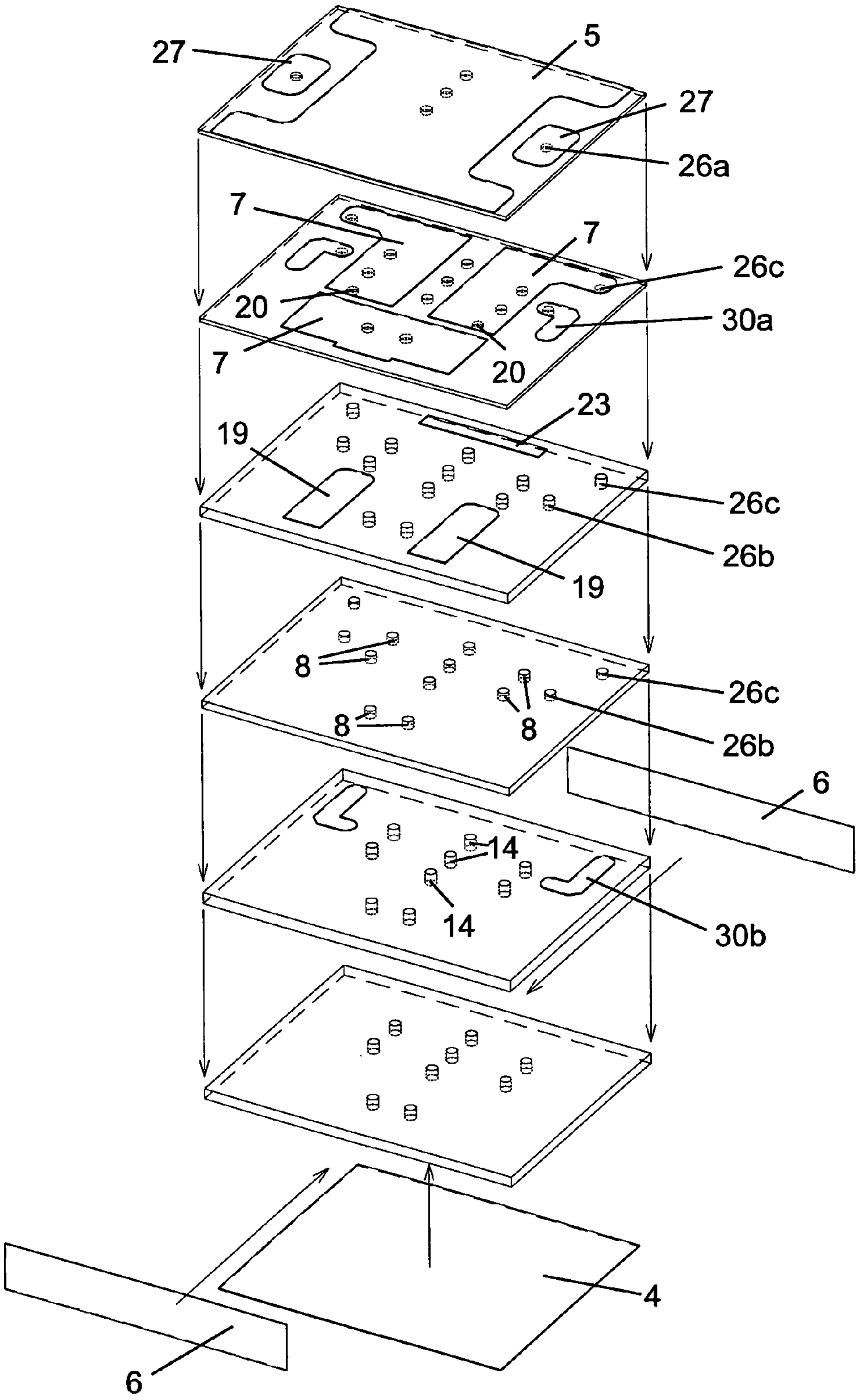
FIG. 36 is a schematic exploded view of the resonator device of FIGS. 34*a*, 34*b* and 35.

FIGS. 34*a*, 34*b*, 35 and 36 show a modified embodiment of the band pass filter having a cascaded triplet of three capacitively coupled resonators 2 shown in FIGS. 31 to 33. FIGS. 34*a* and 34*b* show the filter in top view, FIG. 35 shows a schematic three dimensional view, and FIG. 36 shows the filter in exploded view. As can be taken from FIGS. 34*a* and 34*b*, the three resonators 2 again each have two via holes 8 and are arranged in a triangular configuration. The two resonators which are shown leftmost and rightmost in FIGS. 34*a* and 34*b* are coupled with an inductive input/output coupling arrangement 25 that comprises a via hole 26*a* extending upward in FIG. 34*a* from a respective contact pad 27 provided on the bottom surface of the resonator device 1 to an intermediate electrically conductive layer 30*a*, the layer 30*a*, a via hole 26*b* extending upward in FIG. 34*a* and offset from the via hole 26*a* from the layer 30*b* to a further intermediate electrically conductive layer 30*b*, the layer 30*b* and a via hole 26*c* extending downward in FIG. 34*a* from the layer 30*b* to the second capacitor electrode layer 7 of the respective resonator 2. This input/output coupling arrangement 25 constitutes a coupling loop that provides more degrees of freedom for adjusting the input/output coupling strength as compared to the input/output coupling arrangement 25 of the embodiment shown in FIGS. 31 to 33. For example, the coupling strength may be adjusted by changing the distance between the via hole 26*b* and the via hole 8 of the respective resonator 2 and/or by changing the length of via holes 26*b* and 26*c*.

The two resonators 2 which are shown leftmost and rightmost in FIGS. 34*a* and 34*b* are again each coupled capacitively separately by an electrically conductive coupling capacitor layer 19 to the resonator 2 shown at the top end of FIG. 34*b* and inductively to this resonator 2 by the narrow distances between the via holes 8 of the adjacent resonators 2. Different from the embodiment shown in FIGS. 31 to 33, this capacitive coupling is realized by an arrangement as shown in FIGS. 25*a* and 25*b* and comprising an additional via hole 20 connected between the second capacitor electrode layer 7 of one of the two resonators and the coupling capacitor layer 19. As a modification to FIGS. 25*a* and 25*b*, the dimensions of the coupling capacitor layer 19 are chosen such that it extends beyond the upper edge of the second capacitor electrode layer 7 of the resonator 2 shown uppermost in FIG. 34*b*. This provides for compensation of alignment tolerances. Further, capacitive cross coupling between the two resonators 2 coupled to the input/output coupling arrangement 25 is provided for by an electrically conductive cross coupling capacitor layer 23. In order to suppress or at least reduce inductive cross coupling between these two resonators 2, three via holes 14 extending from the short-circuit electrode layer 4 to the first capacitor electrode layer 5 are arranged between these two resonators 2.

As can be seen in FIG. 36, this filter also comprises six dielectric layers that are laminated together after through holes have been laser drilled or punched and plated with conductive material in order to provide for the various via holes in the laminated state. The various electrically conductive layers are printed on the appropriate surface portions of the dielectric layers prior to or subsequent to lamination, depending on whether the electrically conductive layer is to be disposed inside the laminate or on its outside.

In general, multiple devices could be produced in a single laminate and separated by e.g. cutting prior to producing the side electrodes 6. For LTCC side electrode printing is performed after sintering the individual devices.

It should be noted that by applying suitable coupling mechanisms, all of the resonators of the present invention may be coupled to other types of resonators, such as horizontally extending laminated type strip-line resonators.

In the previously described embodiments, capacitive loading of one of the two ends of the transmission line of the individual resonators was effected only by the capacitor formed by the first capacitor electrode, the second capacitor electrode and the dielectric material disposed between them. Generally, it is also possible and may be advantageous to further increase the capacitance by providing one or more additional capacitor electrodes that are electrically connected to the first electrical connection and/or one or more additional capacitor electrodes that are electrically connected to the second electrical connection, which additional capacitor electrodes are disposed spaced, in the stacking direction, from the first capacitor electrode and the second capacitor electrode such that they form together with the first capacitor electrode and the second capacitor electrode a multi-layer capacitor, i.e. a capacitor not only comprising two spaced apart "plates" but at least three such spaced apart "plates".

Figure 37A:
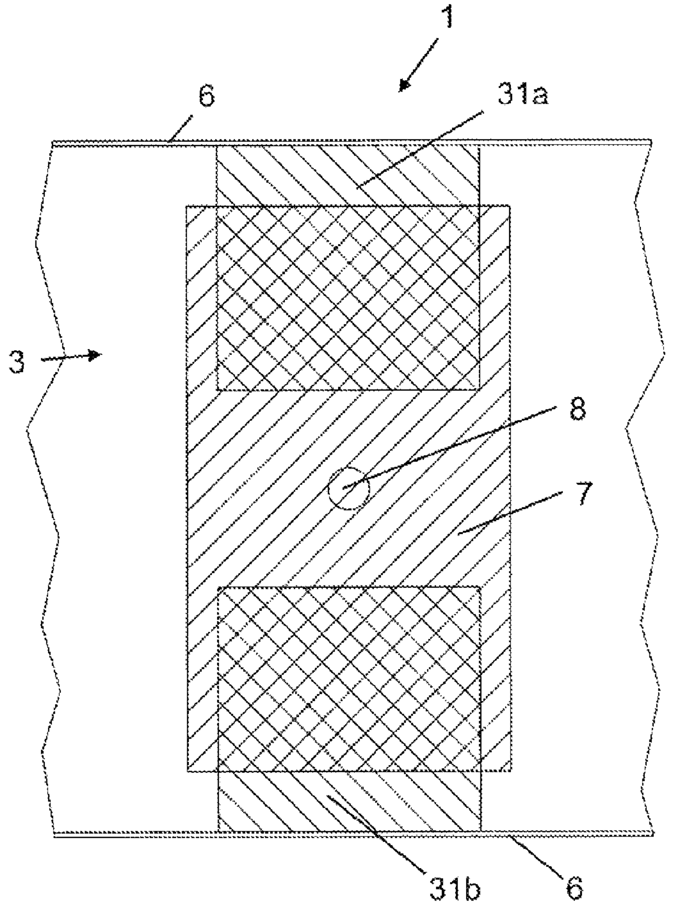
FIG. 37*a* is a schematic top view of a further embodiment of a resonator device comprising only one resonator and having a multi-layer capacitor for loading the transmission line.
Figure 37B:
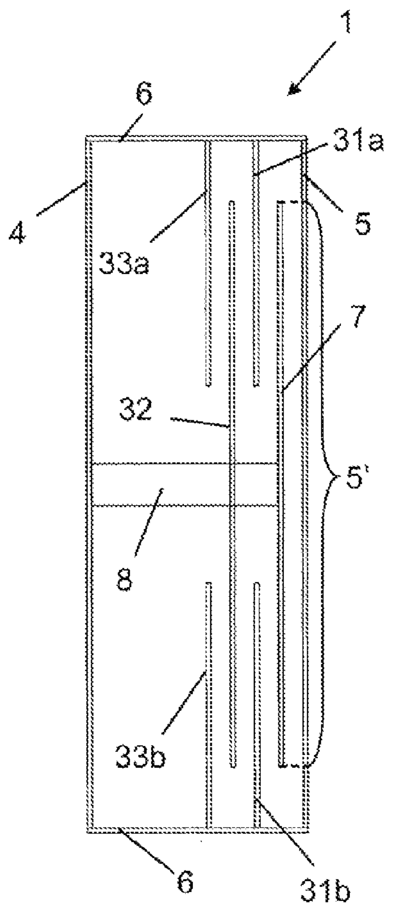
FIG. 37*b* is a schematic cross sectional side view of the resonator device of FIG. 37*a*.

An exemplary embodiment including such a multi-layer capacitor for capacitive loading of the transmission line is shown in FIGS. 37*a* and 37*b*. This embodiment is largely similar to the embodiment shown in FIGS. 1*a* to 1*c*, but includes additional capacitor electrodes 31*a*, 31*b*, 32, 33*a*, 33*b* that are disposed on the side of the second capacitor electrode 7 opposite the first capacitor electrode 5'. The additional capacitor electrode 31*a*, 31*b* is separated from the second capacitor electrode 7 by at least one of the dielectric layers, and comprises two spaced apart (in the direction of extension of the dielectric layers) portions 31*a*, 31*b* of electrically conductive material provided as a layer on the surface of one of the dielectric layers. Each portion 31*a*, 31*b* is connected to and extends from the laterally disposed layers 6, which are part of the second electrical connection, such that they partially overlap with the second capacitor electrode 7. The additional capacitor electrode 32 is separated from additional capacitor electrode 31*a*, 31*b* by at least one of the dielectric layers, and is provided as a layer of electrically conductive material on a surface of one of the dielectric layers. The electrode 32 is electrically connected to and extends from via hole 8 of the first electrical connection. The additional capacitor electrode 33*a*, 33*b* is separated from additional capacitor electrode 32 by at least one of the dielectric layers, and comprises, like electrode 31*a*, 31*b*, two spaced apart (in the direction of extension of the dielectric layers) portions 33*a*, 33*b* of electrically conductive material provided as a layer on the surface of one of the dielectric layers. Each portion 33*a*, 33*b* is connected to and extends from the laterally disposed layers 6, which are part of the second electrical connection, such that they partially overlap with additional capacitor electrode 32.

It should be noted that in this case, also portions of first capacitor electrode layer 5 outside the actual first capacitor electrode 5' (the portion overlapping with the second capacitor electrode 7) may contribute to the capacitance value. The same applies to portions of layers 31*a*, 31*b*, 32, 33*a*, 33*b* not overlapping with a directly adjacent layer. Further, it should be noted that it is generally possible to provide only one additional capacitor electrode (such as electrode 31*a*, 31*b*), only two additional capacitor electrodes (such as electrodes 31*a*, 31*b*, 32) or more than the three additional capacitor electrodes of the exemplary embodiment of FIGS. 37*a* and 37*b*. Moreover, it is, of course, also possible to provide, instead of or in addition to the additional capacitor electrodes just described, one or more additional capacitor electrodes on the side of the first capacitor electrode 5' opposite the second capacitor electrode 7. Preferably, the additional capacitor electrodes are arranged such that they form together with the first and second capacitor electrodes 5', 7 a multi-layer capacitor in which the capacitor electrodes are alternately electrically connected to the first electrical connection and the second electrical connection, respectively.

Figure 38A:
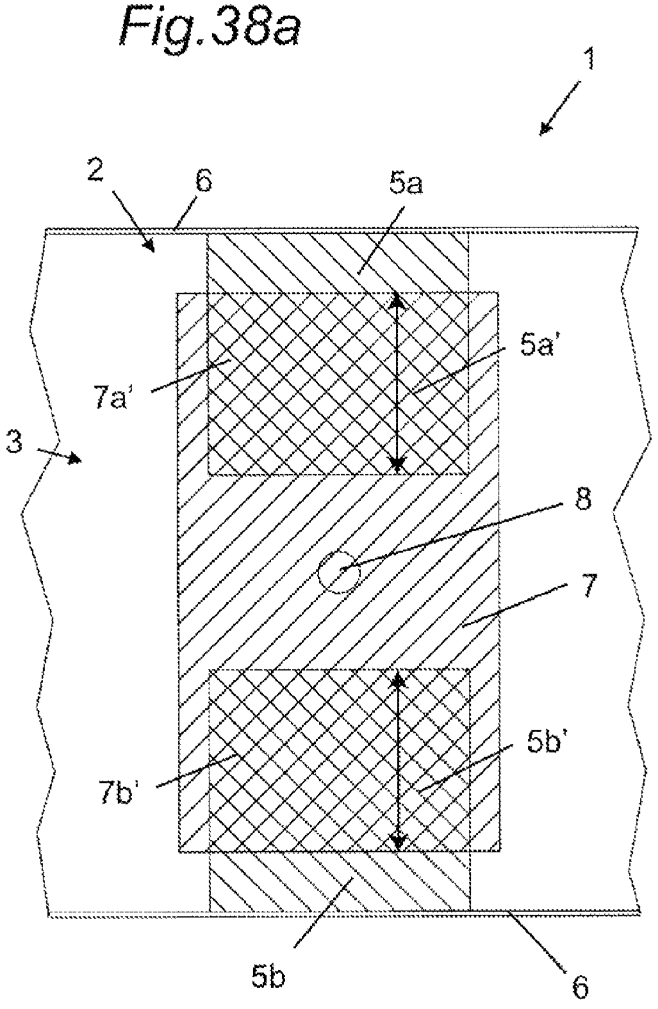
FIG. 38*a* is a schematic top view of a further embodiment of a resonator device comprising only one resonator.
Figure 38B:
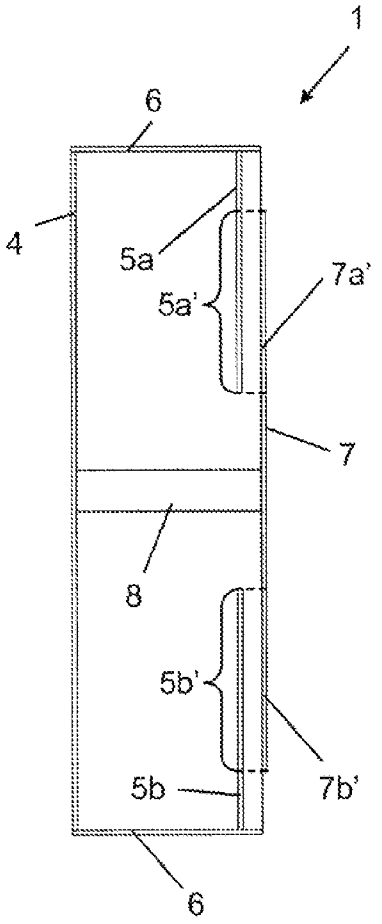
FIG. 38*b* is a schematic cross sectional side view of the resonator device of FIG. 38*a*.

In the previous embodiments, the second capacitor electrode was always located, when following the path of the transmission line starting from the short-circuit electrode, before the first capacitor electrode. However, it is generally also possible that the second capacitor electrode is located behind the first capacitor electrode. In these cases, the first electrical connection extends around or through the first capacitor electrode. An exemplary embodiment of such an arrangement is shown in FIGS. 38*a* and 38*b*. In this embodiment, the first capacitor electrode layer 5 is provided in two separate portions 5*a*, 5*b*, each electrically connected to and extending from one of the lateral layers 6 on opposite sides of the stacked arrangement so as to leave a gap between portions 5*a*, 5*b*. The via hole 8 of the first electrical connection extends through this gap, and the second capacitor electrode layer 7 is arranged such that the first capacitor electrode layer 5 is disposed, in the stacking direction, between the short-circuit electrode layer 4 and the second capacitor electrode layer 7. It should be noted that in this case the capacitance is determined by two separate areas of overlap of layer portion 5*a* with second capacitor electrode layer 7 and of layer portion 5*b* with second capacitor electrode layer 7. With other words, the resonator 2 could be regarded as having a first capacitor comprising first capacitor electrode 5*a'* and second capacitor electrode 7*a'* and a second capacitor comprising first capacitor electrode 5*b'* and second capacitor electrode 7*b'*. The portions 5*a'*, 5*b'* could also be regarded as being a single, multi-portion first capacitor electrode 5', and the portions 7*a'*, 7*b'* could also be regarded as being a single, multi-portion second capacitor electrode 7'.

Figure 39A:
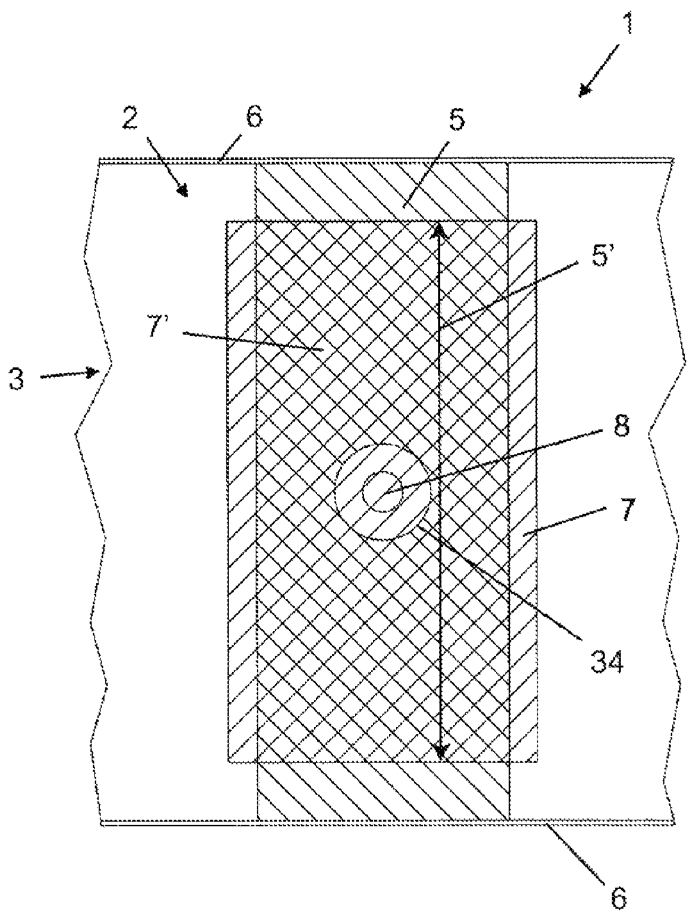
FIG. 39*a* is a schematic top view of a further embodiment of a resonator device comprising only one resonator.
Figure 39B:
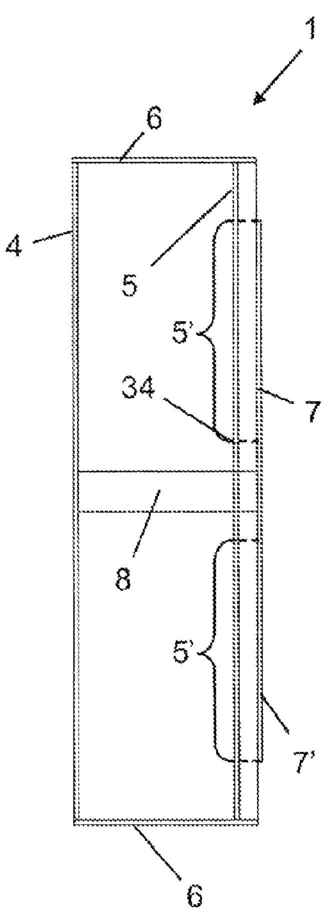
FIG. 39*b* is a schematic cross sectional side view of the resonator device of FIG. 39*a*.

A modified version of the embodiment shown in FIGS. 38*a* and 38*b* is shown in FIGS. 39*a* and 39*b*. In this embodiment, the first capacitor electrode layer 5 is not provided in two separate portions, but as a continuous layer electrically connected to and extending from two opposing lateral layers 6 on opposite sides of the stacked arrangement. The via hole 8 of the first electrical connection extends through a hole 34 provided in the first capacitor electrode layer 5. Again, the second capacitor electrode layer 7 is arranged such that the first capacitor electrode layer 5 is disposed, in the stacking direction, between the short-circuit electrode layer 4 and the second capacitor electrode layer 7. As always, the first capacitor electrode 5' and the second capacitor electrode 7' are determined by the region of overlap between the layers 5 and 7.

In the embodiments shown in FIGS. 38*a*, 38*b*, 39*a* and 39*b* the second capacitor electrode layer 7 is shown being disposed on one of the end surfaces of the stacked arrangement, and as not covering the entire end surface. One disadvantage of such an arrangement is that there is no shielding on this side of the stacked arrangement.

With regard to arranging possible coupling electrodes for capacitive coupling of two adjacent resonators of the kind shown in FIGS. 37*a*, 37*b*, 38*a*, 38*b*, 39*a* and 39*b* the following is to be noted. In FIGS. 38*a*, 38*b*, 39*a* and 39*b* such coupling electrode layer(s) could be disposed on the side of the second capacitor electrode opposite the first capacitor electrode, and in FIGS. 37*a*, 37*b*, 38*a* and 38*b* such coupling electrode(s) could be disposed in the gaps between the two portions 5*a*, 5*b* of first capacitor electrode layer 5 on the same dielectric layer surface and/or in the gaps between the two portions 31*a*, 31*b* and 33*a*, 33*b*, respectively, of one or more of the additional capacitor electrodes layers 31*a*, 31*b*, 33*a*, 33*b* on the same respective dielectric layer surfaces. Coupling electrodes of the latter arrangement could be regarded as being a portion of first capacitor electrode layer 5 and additional capacitor electrode layers 31*a*, 31*b*, 33*a*, 33*b*, respectively, wherein in this case the first capacitor electrode layer 5 and the additional capacitor electrode layers 31*a*, 31*b*, 33*a*, 33*b* include at least three separate portions.

In general, it is also possible and may be advantageous in some cases to construct the first and second electrical connections such that the first electrical connection does not comprise a via hole, but is provided as an outer layer of conductive material similar to the layers 6 described above, and that instead the second electrical connection comprises or consists of a via hole of the type described above.

The invention claimed is:

1. A resonator device having a stacked arrangement of laminated layers including a plurality of dielectric layers formed of dielectric material, and at least one resonator comprising a short-circuit electrode, a first capacitor electrode and a second capacitor electrode, each electrode comprising at least a portion of a layer of electrically conductive material provided on a surface of one of the dielectric layers, wherein for said at least one resonator, the second capacitor electrode is disposed spaced from the short-circuit electrode and the first capacitor electrode, such that, in the stacking direction, the second capacitor electrode is separated from the short-circuit electrode by at least one of the dielectric layers and the second capacitor electrode is separated from the first capacitor electrode by at least one of the dielectric layers, the short-circuit electrode and the second capacitor electrode are electrically interconnected by a first electrical connection comprising at least one via hole in the form of a continuous through hole penetrating one or more of the dielectric layers and at least partially filled with conductive material so as to provide an electrical connection between both ends of the through hole, wherein said at least one via hole extends from and is electrically directly connected to at least one of the short-circuit electrode and the second capacitor electrode, and the short-circuit electrode layer and the first capacitor electrode layer are electrically inter connected by a second electrical connection distinct from the first electrical connection, such that the first and second electrical connections and the dielectric material between the first and second electrical connections form a transmission line that has an overall transmission line path length of from λ/200 to λ/5, that extends between the short-circuit electrode and the second capacitor electrode, and that is short-circuited at one end by the short-circuit electrode, wherein, for said at least one resonator, the first electrical connection comprises a first via hole section including one or more first via holes, and a second via hole section including one or more second via holes, said first and second via hole sections not overlapping along the electrical path of the first electrical connection, wherein the first via hole section is disposed, along the electrical path of the first electrical connection, near the short-circuit electrode and the second via hole section is disposed, along the electrical path of the first electrical connection, near the second capacitor electrode, the via holes of the first and second via hole sections each terminate at and are electrically interconnected by a common interconnection layer provided as at least a portion of a layer of electrically conductive material on a surface of one of the dielectric layers, the first via hole section has less or more via holes than the second via hole section, and wherein the one or more via holes of the first via hole section all penetrate a same set of one or more of the dielectric layers, and the one or more via holes of the second via hole section all penetrate a same set of one or more of the dielectric layers.

2. The resonator device according to claim 1, wherein, for said at least resonator, the second capacitor electrode is disposed between the short-circuit electrode and the first capacitor electrode and the first electrical connection is disposed between the short-circuit electrode and the second capacitor electrode with at least one via hole of the first electrical connection penetrating one or more of the dielectric layers between the short-circuit electrode and the second capacitor electrode.

3. The resonator device according to claim 1, wherein, for said at least one resonator, the first capacitor electrode is disposed between the short-circuit electrode and the second capacitor electrode and the first electrical connection is disposed between the short-circuit electrode and the second capacitor electrode with at least one via hole of the first electrical connection penetrating one or more of the dielectric layers between the short-circuit electrode and the second capacitor electrode.

4. The resonator device according to claim 1, wherein, for said at least one resonators, the second electrical connection comprises at least one of a layer of conductive material, electrically connected to both the respective short-circuit electrode and the respective first capacitor electrode, on at least one lateral surface of the stacked arrangement, and at least one additional via hole in the form of a continuous through hole penetrating one or more of the dielectric layers and at least partially filled with conductive material so as to provide an electrical connection between both ends of the at least one additional via hole, said at least one additional via hole being electrically connected to both the short-circuit electrode and the first capacitor electrode.

5. The resonator device according to claim 1, wherein, for said at least one resonator, the at least one via hole of the first electrical connection comprises at least two via holes that penetrate a same set of one or more of the dielectric layers and extend at along least part of an electrical path of the first electrical connection between the short-circuit electrode and the second capacitor electrode.

6. The resonator device according to claim 1, wherein the first via hole section is a part of a first transmission line section having a first characteristic impedance, the second via hole section is part of a second transmission line section having a second characteristic impedance, and the first characteristic impedance is lower than the second characteristic impedance.

7. The resonator device according to claim 1, wherein at least some of the dielectric layers penetrated by the first via hole section have a different dielectric constant than the dielectric layers penetrated by the second via hole section.

8. The resonator device according to claim 1, wherein the one or more via holes of the first via hole section are not aligned with the one or more via holes of the second via hole section.

9. The resonator device according to claim 8, wherein the first and the second via hole sections each consist of one via hole.

10. The resonator device according to claim 1, wherein the first via hole section consists of one via hole, and wherein the second via hole section consists of two via holes.

11. The resonator device according to claim 1, wherein the first via hole section consists of two via holes, and wherein the second via hole section consists of one via hole.

12. The resonator device according to claim 1, wherein, for said at least one, the first capacitor electrode and the short-circuit electrode are spaced apart portions of the same electrically conductive layer.

13. The resonator device according to claim 1, wherein said at least one resonator comprises two resonators.

14. The resonator device according to claim 13, wherein said at least one resonator comprises three resonators, and wherein, in a direction of extension of the dielectric layers, said three resonators are not arranged along a straight line.

15. The resonator device according to claim 13, wherein the respective short-circuit electrodes of the two resonators are formed by at least respective portions of a first common electrically conductive layer.

16. The resonator device according to claim 15, wherein the common electrically conductive layer is provided on the outside of the stacked arrangement.

17. The resonator device according to claim 13, wherein the respective first capacitor electrodes of the two resonators are formed by at least respective portions of a common electrically conductive layer.

18. The resonator device according to claim 17, wherein the common electrically conductive layer is provided on the outside of the stacked arrangement.

19. The resonator device according to claim 15, wherein the respective short-circuit electrodes of the two resonators are formed by at least respective portions of the first common electrically conductive layer and the respective first capacitor electrodes of the two resonators are formed by at least respective portions of a second common electrically conductive layer, and wherein, in the direction of extension of the dielectric layers, a third, intermediate resonator is disposed between the two resonators and has a short-circuit electrode and a first capacitor electrode, the short-circuit electrode of the intermediate resonator being formed by the second common electrically conductive layer forming the first capacitor electrodes of said two resonators, and the first capacitor electrode of the intermediate resonator being formed by the first common electrically conductive layer forming the short-circuit electrodes of said two resonators, thereby forming an inter-digital resonator arrangement.

20. The resonator device according to claim 13, wherein the two resonators are arranged, in the stacking direction, one upon the other and are electromagnetically coupled.

21. The resonator device according to 13, wherein the two resonators are arranged such that they are inductively coupled to each other.

22. The resonator device according to claim 21, wherein at least one coupling adjusting via hole is provided between the two resonators, and wherein the at least one coupling adjusting via hole is provided in the form of a continuous through hole penetrating at least some of the dielectric layers and at least partially filled with conductive material so as to provide an electrical connection between both ends of the through hole, one end being electrically connected to the respective short-circuit electrodes of the two resonators and the other end being electrically connected to the respective first capacitor electrodes of the two resonators.

23. The resonator device according to claim 15, wherein, for each of the two resonators, at least one of the first and second via hole sections is offset from the center of the second capacitor electrode, and Wherein the at least one of the first and second via hole sections of the two resonators, respectively, are closer to each other than are centers of the second capacitor electrodes of the two resonators, respectively.

24. The resonator device according to 21, wherein a coupling loop is provided between the two resonators, the coupling loop comprising two coupling loop via holes and an electrically conductive interconnection layer provided on the surface of a dielectric layer, and wherein each of the two coupling loop via holes is constituted as one of said at least one via hole of the first electrical connection of one of the two resonators and a separate, additional via hole.

25. The resonator device according to claim 21, wherein the respective first via hole sections of the first electrical connections of the two resonators comprise a common via hole section.

26. The resonator device according to claim 21, wherein a coupling adjustment element is provided, in the direction of extension of the dielectric layers, between the two resonators, which coupling adjustment element consists of a coupling adjustment via hole in the form of a continuous through hole penetrating at least some of the dielectric layers and at least partially filled with conductive material so as to provide an electrical connection between both ends of the through hole, which via hole extends entirely between and is electrically connected to a common electrically conductive layer forming the first capacitor electrodes of the two resonators and a layer of electrically conductive material that is disposed, in the stacking direction, between the second capacitor electrodes of the two resonators and the short-circuit electrodes of the two resonators.

27. The resonator device according to claim 13, wherein the two resonators are arranged such that they are capacitively coupled to each other.

28. The resonator device according to claim 27, wherein capacitive coupling is effected by at least one coupling layer of conductive material provided on the surface of one of the dielectric layers, and wherein the at least one coupling layer is, when viewed in the stacking direction, partially overlapping with and, in the stacking direction, spaced from the second capacitor electrode of at least one of the two resonators.

29. The resonator device according to claim 28, wherein at least one of the coupling layers is formed by a portion of the second capacitor electrode layer of one of the two resonators.

30. The resonator device according to claim 28, wherein at least one of the coupling layers is formed by an additional layer different from the second capacitor electrode layers of the two resonators.

31. The resonator device according to claim 30, wherein two coupling layers each formed by an additional layer different from the second capacitor electrode layers of the two resonators are provided, and wherein the two coupling layers are spaced from each other in the stacking direction.

32. An RF device comprising a resonator device according to claim 1 that is provided with a capacitive or inductive input coupling and a capacitive or inductive output coupling.

* * * * *